(12) United States Patent
Osanai et al.

(10) Patent No.: US 6,777,752 B2
(45) Date of Patent: Aug. 17, 2004

(54) COMPLEMENTARY MOS SEMICONDUCTOR DEVICE

(75) Inventors: Jun Osanai, Chiba (JP); Hisashi Hasegawa, Chiba (JP); Sumio Koiwa, Chiba (JP); Kazutoshi Ishii, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 09/944,365

(22) Filed: Aug. 31, 2001

(65) Prior Publication Data

US 2002/0084492 A1 Jul. 4, 2002

(30) Foreign Application Priority Data

| Sep. 1, 2000 | (JP) | 2000-265495 |
| Sep. 29, 2000 | (JP) | 2000-299549 |
| Oct. 30, 2000 | (JP) | 2000-331080 |
| Feb. 20, 2001 | (JP) | 2001-044068 |
| Apr. 11, 2001 | (JP) | 2001-113049 |
| Apr. 17, 2001 | (JP) | 2001-118539 |
| Jun. 21, 2001 | (JP) | 2001-188051 |
| Jul. 5, 2001 | (JP) | 2001-204758 |
| Jul. 13, 2001 | (JP) | 2001-035800 |
| Aug. 8, 2001 | (JP) | 2001-241293 |
| Aug. 8, 2001 | (JP) | 2001-241294 |
| Aug. 8, 2001 | (JP) | 2001-241297 |
| Aug. 8, 2001 | (JP) | 2001-241298 |
| Aug. 8, 2001 | (JP) | 2001-241299 |
| Aug. 9, 2001 | (JP) | 2001-241829 |
| Aug. 10, 2001 | (JP) | 2001-243944 |

(51) Int. Cl.[7] ............ H01L 27/01; H01L 27/12; H01L 31/0392

(52) U.S. Cl. .......... 257/350; 257/359; 257/363; 257/369; 257/379; 257/380

(58) Field of Search ............ 257/350, 359, 257/363, 369, 379, 380, 538

(56) References Cited

U.S. PATENT DOCUMENTS 4,559,694 A * 12/1985 Yoh et al. ............ 438/275
5,554,873 A * 9/1996 Erdeljac et al. ............ 257/380

* cited by examiner

Primary Examiner—Thien F Tran
(74) Attorney, Agent, or Firm—Adams & Wilks

(57) ABSTRACT

In a power management semiconductor device or analog semiconductor device having a CMOS and a resistor, a conductivity type of a gate electrode of the CMOS is P-type as to both an NMOS and a PMOS, a short channel and a low threshold voltage are possible since an E-type PMOS is surface channel type, the short channel and the low threshold voltage are possible since a buried channel type NMOS is extremely shallow for the reason that arsenic having a small diffusion coefficient can be used as an impurity for threshold control, and the resistor used in a voltage dividing circuit or CR circuit is formed of polycrystalline silicon thinner than the polycrystalline silicon of the same layer as the gate electrode or a thin film metal. Thus, the power management semiconductor device or analog semiconductor device, which is advantageous in terms of cost, manufacturing period and element performance in comparison with the conventional CMOS with an N+polycrystalline silicon gate single polarity or the same polarity gate CMOS in which a channel and a gate electrode have the same polarity, can be realized.

37 Claims, 55 Drawing Sheets

COMPLEMENTARY MOS SEMICONDUCTOR DEVICE

BACKGROUND OF THE INVENTION

1. Field of the Invention

The present invention relates to a method of manufacturing a semiconductor device in which a low voltage operation, low power consumption and a high driving capacity are required, particularly to a power management semiconductor device such as a voltage detector (hereinafter referred to as VD), a voltage regulator (hereinafter referred to as VR) or a switching regulator (hereinafter referred to as SWR) or an analog semiconductor device such as an operational amplifier or a comparator.

2. Description of the Related Art

FIG. 89 is a schematic cross sectional view of a conventional semiconductor device. The semiconductor device is composed of a complementary MOS structure (hereinafter referred to as NMOS) in which a gate electrode formed on a P-type semiconductor substrate is comprised of N+ type polycrystalline silicon and a P-channel MOS transistor 212 (hereinafter referred to as PMOS) in which a gate electrode formed in an N-well region is also comprised of N+type polycrystalline silicon, and a resistor 215 used in a voltage dividing circuit for dividing a voltage which is formed on a field insulating film or a CR circuit for setting a time constant. The resistor is formed of a polycrystalline silicon that is the same layer as a gate electrode of CMOS with N-type conductivity and has the same conductivity type in terms of simplicity and ease of a method of manufacturing thereof.

In the semiconductor device with the above conventional structure, since an enhancement type NMOS (hereinafter referred to as E-type NMOS) with a voltage of approximately 0.7 V that is a standard threshold voltage has a gate electrode comprised of N+polycrystalline silicon, a channel is a surface channel formed on a surface of a semiconductor substrate in accordance with the relationship of working functions of the gate electrode and the semiconductor substrate. On the other hand, in an enhancement type PMOS (hereinafter referred to as E-type PMOS) with a voltage of approximately -0.7 V that is a standard threshold voltage, a channel is a buried channel somewhat formed in an inner side from the surface of the semiconductor substrate in accordance with the relationship of working functions of the gate electrode comprised of N+polycrystalline silicon and the N-well.

In the buried channel E-type PMOS, in the case where the threshold voltage is set to, for example, -0.5 V or more for low voltage operation, a subthreshold characteristic, which is one index of low voltage operation of a MOS transistor, extremely deteriorates, and thus, a leak current at the off time the PMOS increases. As a result, consumption current at the time of waiting of the semiconductor device remarkably increases. Thus, there is a problem in that it is difficult to apply the semiconductor device to portable apparatuses typified by a portable telephone and a portable terminal which are greatly demanded in recent years and the market for which is predicted to further develop in the future.

As technical means for attaining the above-described problems, both the low voltage operation and the low consumption current, the homopolar gate technique is generally known, in which the conductivity type of an NMOS gate electrode is set as N-type and the conductivity type of a PMOS gate electrode is set as P-type. In this case, both the E-type NMOS and the E-type PMOS are surface channel MOS transistors, and therefore, the lowering of the threshold voltage does not lead to the extreme deterioration of a sub-threshold coefficient. Thus, the low voltage operation and the low power consumption are possible.

However, the homopolar gate CMOS has a problem in that increases of the number of steps, the manufacturing cost, and the manufacturing period are caused in comparison with the CMOS in which the gate electrode is only N+polycrystalline silicon monopole since the gate polarities are separately formed for the NMOS and PMOS in the manufacturing process.

Further, a reference voltage circuit is given as an important element circuit constituting a power management semiconductor device such as VD, VR and SWR. The reference voltage circuit always outputs a constant voltage from an output terminal with respect to the electric potential of a low voltage supply terminal irrespective of the electric potential of a high voltage supply terminal. The reference voltage circuit is constituted of an E-type NMOS and a depletion type NMOS (hereinafter referred to as D-type NMOS) with series connection in many cases. In the case where the polarity of the gate electrode is N-type, the E-type NMOS is a surface channel while the D-NMOS is a buried channel in accordance with the relationship of working functions of the gate and the well or substrate. As an important characteristic of the reference voltage circuit, there is given a small change of an output voltage to a change of temperature. However, the threshold voltage of MOS and the degree of change to the temperature change of mutual conductance are largely different between the surface channel and the buried channel. As a result, the reference voltage circuit has a problem in that it is difficult to reduce the change of an output voltage to the temperature change.

SUMMARY OF THE INVENTION

The present invention has been made in view of the above, and an object of the present invention is therefore to provide a structure that enables the materialization of a power management semiconductor device or an analog semiconductor device in which the low cost, short manufacturing period, low voltage operation and low power consumption are attained.

In order to solve the above-mentioned problems, the present invention employs the following measures.

According to the present invention, there is provided a complementary MOS semiconductor device having an N-channel MOS transistor, a P-channel MOS transistor and a resistor, characterized in that a conductivity type of a gate electrode of the N-channel MOS transistor is P-type, and a conductivity type of a gate electrode of the P-channel MOS transistor is P-type.

Further, according to the present invention, here is provided a complementary MOS semiconductor device, characterized in that the P-type gate electrode of the N-channel MOS transistor and the P-type gate electrode of the P-channel MOS transistor each comprise a single layer of first polycrystalline silicon having a film thickness in a range of 2000 Å to 6000 Å and including boron or $BF_2$ with an impurity concentration of $1 \times 10^{19}$ atoms/cm$^3$ or more.

Further, according to the present invention, there is provided a complementary MOS semiconductor device, characterized in that the P-type gate electrode of the N-channel MOS transistor and the P-type gate electrode of the P-channel MOS transistor each have a polycide structure comprising a lamination of first polycrystalline silicon having a film thickness in a range of 1000 Å to 4000 Å and including boron or $BF_2$ with an impurity concentration of $1 \times 10^{19}$ atoms/cm$^3$ or more and first high melting point metal silicide selected from the group consisting of molybdenum silicide, tungsten silicide, titanium silicide, and platinum silicide, with a film thickness in a range of 500 Å to 2500 Å.

Further, according to the present invention, there is provided a complementary MOS semiconductor device, characterized in that the resistor is polycrystalline silicon formed in the same layer and has the same film thickness range as the first polycrystalline silicon constituting the gate electrode.

Further, according to the present invention, there is provided a complementary MOS semiconductor device, characterized in that the resistor is second polycrystalline silicon having a film thickness in a range of 500 Å to 2000 Å.

Further, according to the present invention, there is provided a complementary MOS semiconductor device, characterized in that the resistor is a thin film metal transistor formed from one selected from the group consisting of Ni—Cr alloy, Cr—SiO alloy, molybdenum silicide, and β-ferrite silicide and has a film thickness in a range of 100 Å to 300 Å.

Further, according to the present invention, there is provided a complementary MOS semiconductor device, characterized in that the resistor comprising the first or the second polycrystalline silicon contains phosphorous or arsenic with an impurity concentration of $1 \times 10^{14}$ to $9 \times 10^{18}$ atoms/cm$^3$ and includes a first N-type transistor of a relatively low concentration having a sheet resistance in an order of several kΩ/square to several tens of kΩ/square.

Further, according to the present invention, there is provided a complementary MOS semiconductor device, characterized in that the resistor comprising the first or the second polycrystalline silicon contains phosphorous or arsenic with an impurity concentration of $1 \times 10^{19}$ atoms/cm$^3$ or more and includes a second N-type transistor of a relatively high concentration having a sheet resistance in an order of about 100 Ω/square to several hundreds of Ω/square and a temperature coefficient in an order of several hundreds of ppm/° C. to about 1000 ppm/° C.

Further, according to the present invention, there is provided a complementary MOS semiconductor device, characterized in that the resistor comprising the first or the second polycrystalline silicon contains boron or $BF_2$ with an impurity concentration of $1 \times 10^{14}$ to $9 \times 10^{19}$ atoms/cm$^3$ and includes a first P-type transistor of a relatively low concentration having a sheet resistance in an order of several kΩ/square to several tens of kΩ/square.

Further, according to the present invention, there is provided a complementary MOS semiconductor device, characterized in that the resistor comprising the first or the second polycrystalline silicon contains boron or $BF_2$ with an impurity concentration of $1 \times 10^{19}$ atoms/cm$^3$ or more and includes a second P-type transistor of a relatively high concentration having a sheet resistance in an order of several hundreds of Ω/square to about 1 kΩ/square and a temperature coefficient in an order of several hundreds of ppm/° C. to about 1000 ppm/° C.

Further, according to the present invention, there is provided a complementary MOS semiconductor device, characterized in that the N-channel MOS transistor and the P-channel MOS transistor include a MOS transistor having a first structure of a single drain structure comprising a diffusion layer with a high impurity concentration in which a source and a drain overlap the P-type gate electrode in a planar manner.

Further, according to the present invention, there is provided a complementary MOS semiconductor device, characterized in that the N-channel MOS transistor and the P-channel MOS transistor include a MOS transistor having a second structure comprising a diffusion layer with a low impurity concentration in which only the drain side thereof overlaps the P-type gate electrode in a planar manner or both the source and drain sides thereof overlap the P-type gate electrode in the planar manner and a diffusion layer with a high impurity concentration in which only the drain side thereof does not overlap the P-type gate electrode in the planar manner or both the source and drain sides thereof do not overlap the P-type gate electrode in the planar manner.

Further, according to the present invention, there is provided a complementary MOS semiconductor device, characterized in that the N-channel MOS transistor and the P-channel MOS transistor include a MOS transistor having a third structure comprising a diffusion layer with a low impurity concentration in which only the drain side thereof overlaps the P-type gate electrode in a planar manner or both the source and drain side thereof overlap the P-type gate electrode in the planar manner and a diffusion layer with a high impurity concentration in which only the drain side thereof does not overlap the P-type gate electrode in the planar manner or both the source and drain sides thereof do not overlap the P-type gate electrode in the planar manner, and an insulating film between the diffusion layer wit a high impurity concentration and the P-type gate electrode has a film thickness thicker than that of a gate insulating film.

Further, according to the present invention, there is provided a complementary MOS semiconductor device, characterized in that the N-channel MOS transistor and the P-channel MOS transistor include a MOS transistor having a fourth structure comprising a diffusion layer with a high impurity concentration in which both the source and the drain overlap the P-type gate electrode in a planar manner and a diffusion layer with a low impurity concentration which only the drain side thereof or both the source and drain sides thereof diffuse further on the channel side to overlap the P-type gate electrode in the planar manner.

Further, according to the present invention, there is provided a complementary MOS semiconductor device, characterized in that, in the N-channel MOS transistor, a channel in which a threshold voltage is in enhancement is a buried channel.

Further, according to the present invention, there is provided a complementary MOS semiconductor device, characterized in that, in the P-channel MOS transistor, a channel in which a threshold voltage is in enhancement is a surface channel.

Further, according to the present invention, there is provided a complementary MOS semiconductor device, characterized in that the low impurity concentration diffusion layers in the second structure MOS transistor, the third structure MOS transistor and the fourth structure MOS transistor use arsenic or phosphorous as an impurity with an impurity concentration of $1 \times 10^{16}$ to $1 \times 10^{18}$ atoms/cm$^3$ in the N-channel MOS transistor and use boron or $BF_2$ as the impurity with an impurity concentration of $1 \times 10^{16}$ to $1 \times 10^{18}$ atoms/cm$^3$ the P-channel MOS transistor, and the high impurity concentration diffusion layers in the first structure MOS transistor, the second structure MOS transistor, the third structure MOS transistor and the fourth structure MOS transistor use arsenic or phosphorous as the impurity with an impurity concentration of $1 \times 10^{16}$ to $1 \times 10^{18}$ atoms/cm$^3$ or more in the N-channel MOS transistor and uses boron or $BF_2$ as the impurity with an impurity concentration of $1\times10^{16}$ to $1\times10^{18}$ atoms/cm$^3$ or more in the P-channel MOS transistor.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a low concentration N-type impurity into the first polycrystalline silicon film to form a first N-type region in the first polycrystalline silicon film;

selectively doping a high concentration P-type impurity into the first polycrystalline silicon film to form a first P-type region in the first polycrystalline silicon film;

doping a low concentration P-type impurity into an entire region of the first polycrystalline silicon film to form a second P-type region in the first polycrystalline silicon film;

forming a first insulating film on the first polycrystalline silicon film;

patterning the first insulating film and the first polycrystalline silicon film to form a gate electrode and a wiring formed of the first P-type polycrystalline silicon region and a resistor formed of the first N-type polycrystalline silicon region and the second P-type polycrystalline silicon region;

selectively removing the first insulating film on the resistor;

doping a high concentration N-type impurity into regions that become a source and a drain of the N-channel MOS transistor and a part or an entire region of the resistor formed of the first N-type polycrystalline silicon region; and doping a high concentration P-type impurity into regions that become a source and a drain of the P-channel MOS transistor and a part or an entire region of the resistor formed of the second P-type polycrystalline silicon region.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into an entire region of the first polycrystalline silicon film to form a first P-type region of a first polycrystalline silicon film;

forming a high melting point metal silicide film on the first polycrystalline silicon film;

forming a first insulating film on the high melting point metal silicide film;

patterning the first insulating film, the high melting point metal silicide film and the first polycrystalline silicon film of the first P-type region to form a gate electrode and a wiring;

forming a fourth insulating film on the semiconductor substrate;

forming a second polycrystalline silicon film on the fourth insulating film;

selectively doping a low concentration N-type impurity into the second polycrystalline silicon film to form a first N-type region in the second polycrystalline silicon film;

doping a low concentration P-type impurity into an entire region of the second polycrystalline silicon film to form a second P-type region in the second polycrystalline silicon film;

patterning the second polycrystalline silicon film to form a resistor;

doping a high concentration N-type impurity into regions that become a source and a drain of the N-channel MOS transistor and a part or an entire region of the resistor formed of the first N-type polycrystalline silicon region; and doping a high concentration P-type impurity into regions that become a source and a drain of the P-channel MOS transistor and a part or an entire region of the resistor formed of the second P-type polycrystalline silicon region.

Further, according to the present invention, there is provided a method of manufacturing a complementary MOS semiconductor device, comprising the steps of:

forming walls for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into an entire region of the first polycrystalline silicon film to form a first P-type region of a first polycrystalline silicon film;

forming a high melting point metal film on the first polycrystalline silicon film;

performing heat treatment for the high melting point metal film, which contacts to the first polycrystalline silicon film, to obtain a high melting point metal silicide film;

forming a first insulating film on the high melting point metal silicide film;

patterning the first insulating film, the high melting point metal silicide film and the first polycrystalline silicon film of the first P-type region to form a gate electrode and a wiring;

forming a fourth insulating film on the semiconductor substrate;

forming a second polycrystalline silicon film on the fourth insulating film;

selectively doping a low concentration N-type impurity into the second polycrystalline silicon film to form a first N-type region in the second polycrystalline silicon film;

doping a low concentration P-type impurity into an entire region of the second polycrystalline silicon film to form a second P-type region in the second polycrystalline silicon film;

patterning the second polycrystalline silicon film to form a resistor;

doping a high concentration N-type impurity into regions that become a source and a drain of the N-channel MOS transistor and a part or an entire region of the resistor formed of the first N-type polycrystalline silicon-region; and doping a high concentration P-type impurity into regions that become a source and a drain of the P-channel MOS transistor and a part or an entire region of the resistor formed of the second P-type polycrystalline silicon region.

Further, according to the present invention, there is provided a method of manufacturing a complementary MOS semiconductor device, comprising the steps or:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a low concentration N-type impurity into the first polycrystalline silicon film to form a first N-type region in the first polycrystalline silicon film;

selectively doping a high concentration P-type impurity into the first polycrystalline silicon film to form a first P-type region in the first polycrystalline silicon film;

doping a low concentration P-type impurity into an entire region of he first polycrystalline silicon film to form a second P-type region in the first polycrystalline silicon film;

forming a first insulating film on the first polycrystalline silicon film;

patterning the first insulating film and the first polycrystalline silicon film to form a gate electrode and a wiring formed of the first P-type polycrystalline silicon region and a resistor formed of the first N-type polycrystalline silicon region and the second P-type polycrystalline silicon region;

selectively doping a low concentration N-type impurity into regions that become a source and a drain of the N-channel MOS transistor in the semiconductor substrate; and doping a low concentration P-type impurity into regions that become a source and a drain of the P-channel MOS transistor in the semiconductor substrate;

depositing a third insulating film on the semiconductor substrate;

etching the third insulating film by anisotropic dry etching to form a side spacer on a side wall of the first polycrystalline silicon film;

selectively removing the first insulating film on the resistor;

doping a high concentration N-type impurity into regions that become a source and a drain of the N-channel MOS transistor and a part or an entire region of the resistor formed of the first N-type region of the first polycrystalline silicon; and doping a high concentration P-type impurity into regions that become a source and a drain of the P-channel MOS transistor and a part or an entire region of the resistor formed of the second P-type region of the first polycrystalline silicon.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a high concentration P-type impurity into the first polycrystalline silicon film to form a first P-type region in the first polycrystalline silicon film;

forming a first insulating film on the first polycrystalline silicon film;

patterning the first insulating film and the first polycrystalline silicon film to form a gate electrode and a wiring formed of the first P-type polycrystalline silicon region and a resistor region formed of the region other than the first P-type polycrystalline silicon film region;

selectively removing the first insulating film on the resistor region;

selectively doping a low concentration N-type impurity into regions that become a source and a drain of the N-channel MOS transistor and into the polycrystalline silicon film other than the first P-type polycrystalline silicon film region to form a low concentration N-type source and drain and a first N-type region in the first polycrystalline silicon film;

selectively doping a low concentration P-type impurity into regions that become the source and the drain of the P-channel MOS transistor and into the first polycrystalline silicon film other than the first P-type polycrystalline silicon film region and the first N-type polycrystalline silicon film region to form a low concentration P-type source and drain and a second P-type region in the first polycrystalline silicon film;

depositing a third insulating film on the semiconductor substrate;

etching the third insulating film by anisotropic dry etching to form a side spacer on a side wall of the first polycrystalline silicon film;

doping a high concentration N-type impurity into regions that become the source and the drain of the N-channel MOS transistor and a part or an entire region of the resistor formed of the first N-type region of the first polycrystalline silicon; and doping a high concentration P-type impurity into regions that become the source and the drain of the P-channel MOS transistor and a part or an entire region of the resistor formed of the second P-type region of the first polycrystalline silicon.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into the first polycrystalline silicon film to form a first P-type polycrystalline silicon region;

forming a first insulating film on the first polycrystalline silicon film;

patterning the first insulating film and the first polycrystalline silicon film to form a gate electrode and a wiring formed of the first polycrystalline silicon region;

selectively doping a low concentration N-type impurity into regions that become a source and a drain of the N-channel MOS transistor in the semiconductor substrate;

selectively doping a low concentration P-type impurity into regions that become the source and the drain of the P-channel MOS transistor in the semiconductor device;

depositing a third insulating film on the semiconductor substrate;

etching the third insulating film by anisotropic dry etching to form a side spacer on a side wall of the first polycrystalline silicon film;

forming a second polycrystalline silicon film on the semiconductor substrate;

selectively doping a low concentration N-type impurity into the second polycrystalline silicon film to form a first N-type impurity region;

doping a low concentration P-type impurity into an entire region of the second polycrystalline silicon film to form a second P-type polycrystalline silicon region;

patterning the second polycrystalline silicon film to form a resistor;

selectively doping a high concentration N-type impurity into regions that become the source and the drain of the N-channel MOS transistor and a part or an entire region of the resistor formed of the first N-type region of the second polycrystalline silicon; and selectively doping a high concentration P-type impurity into regions that become the source and the drain of the P-channel MOS transistor and a part or an entire region of the resistor formed of the second P-type region of the second polycrystalline silicon.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a low concentration N-type impurity into the first polycrystalline silicon film to form a first N-type polycrystalline silicon region;

selectively doping a high concentration P-type impurity into the first polycrystalline silicon film to form a first P-type polycrystalline silicon region;

doping a low concentration P-type impurity into an entire region of the first polycrystalline silicon film to form a second P-type polycrystalline silicon region;

forming a second insulating film on the first polycrystalline silicon film;

selectively removing the second insulating film on the first P-type region of the first polycrystalline silicon film;

forming a high melting point metal silicide film on the semiconductor substrate;

selectively removing the high melting point metal silicide film on the patterned second insulating film and in the vicinity thereof;

removing the patterned second insulating film;

forming a first insulating film on the high melting point metal silicide film and the first polycrystalline silicon film;

patterning the first insulating film, the first polycrystalline silicon film and the high melting point metal silicide film to form a gate electrode and a wiring formed of a lamination layer of the first P-type region of the first polycrystalline silicon film and the high melting point metal silicide film and a resistor formed of the first N-type region and the second P-type region of the first polycrystalline silicon film;

selectively doping a low concentration N-type impurity into regions that become the source and the drain of the N-channel MOS transistor in the semiconductor substrate;

selectively doping a low concentration P-type impurity into regions that become the source and the drain of the P-channel MOS transistor in the semiconductor substrate;

depositing a third insulating film on the semiconductor substrate;

etching the third insulating film by anisotropic dry etching to form side spacers to side walls of the first polycrystalline silicon film and the high melting point metal silicide film;

selectively removing the first insulating film on the resistor;

doping a high concentration N-type impurity into regions that become the source and the drain of the N-channel MOS transistor and a part or an entire region of the resistor formed of the first N-type polycrystalline silicon region; and doping a high concentration P-type impurity into regions that become the source and the drain of the P-channel MOS transistor and a part or an entire region of the resistor formed of the second P-type polycrystalline silicon region.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a high concentration P-type impurity into the first polycrystalline silicon film to form a first P-type polycrystalline silicon region;

forming a second insulating film on the first polycrystalline silicon film;

selectively removing the second insulating film on the first P-type region of the first polycrystalline silicon film;

forming a high melting point metal silicide film on the semiconductor substrate;

selectively removing the high melting point metal silicide film on the patterned second insulating film and in the vicinity thereof;

removing the patterned second insulating film;

forming a first insulating film on the high melting point metal silicide film and the first polycrystalline silicon film;

patterning the first insulating film, the first polycrystalline silicon film and the high melting point metal silicide film to form a gate electrode and a wiring formed of a lamination layer of the first P-type region of the first polycrystalline silicon film and the high melting point metal silicide film and a resistor region formed of the region other than the first P-type region of the first polycrystalline silicon film;

selectively removing the first insulating film on the resistor region;

selectively doping a low concentration N-type impurity into regions that become the source and the drain of the N-channel MOS transistor and the first polycrystalline silicon film other than the first P-type region to form a low concentration N-type source and drain and a first N-type region in the first polycrystalline silicon film;

selectively doping a low concentration P-type impurity into regions that become the source and the drain of the P-channel MOS transistor and the first polycrystalline silicon film other than the first P-type region and the first N-type region to form a low concentration P-type source and drain and a second P-type region in the first polycrystalline silicon film;

depositing a third insulating film on the semiconductor substrate;

etching the third insulating film by anisotropic dry etching to form side spacers on side walls of the first polycrystalline silicon film and the high melting point metal silicide film;

doping a high concentration N-type impurity into regions that become the source and the drain of the N-channel MOS transistor and a part or an entire region of the resistor formed of the first N-type polycrystalline silicon region; and doping a high concentration P-type impurity into regions that become the source and the drain or the P-channel MOS transistor and a part or an entire region of the resistor formed of the second P-type polycrystalline silicon region.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a low concentration N-type impurity into the first polycrystalline silicon film to form a first N-type polycrystalline silicon region;

selectively doping a high concentration P-type impurity into the first polycrystalline silicon film to form a first P-type polycrystalline silicon region;

doping a low concentration P-type impurity into an entire region of the first polycrystalline silicon film to form a second P-type polycrystalline silicon region;

forming a second insulating film on the first polycrystalline silicon film;

selectively removing the second insulating film on the first P-type region of the first polycrystalline silicon film;

forming a high melting point metal silicide film on the semiconductor substrate;

performing heat treatment for the high melting point metal film, which contacts to the first polycrystalline silicon film, to obtain a high melting point metal silicide film;

selectively removing non-reacted high melting point metal silicide film on the second insulating film;

removing the patterned second insulating film;

forming a first insulating film on the high melting point metal silicide film and the first polycrystalline silicon film;

patterning the first insulating film, the first polycrystalline silicon film and the high melting point metal silicide film to form a gate electrode and a wiring formed of a lamination layer of the first P-type region of the first polycrystalline silicon film and the high melting point metal silicide film and a resistor formed of the first N-type region and the second P-type region of the first polycrystalline silicon film;

selectively doping a low concentration N-type impurity into regions that become the source and the drain of the N-channel MOS transistor in the semiconductor substrate;

selectively doping a low concentration P-type impurity into regions that become the source and the drain of the P-channel MOS transistor in the semiconductor substrate;

depositing a third insulating film on the semiconductor substrate;

etching the third insulating film by anisotropic dry etching to form side spacers on side walls of the first polycrystalline silicon film and the high melting point metal silicide film;

selectively removing the first insulating film on the resistor;

doping a high concentration N-type impurity into regions that become the source and the drain of the N-channel MOS transistor and a part or an entire region of the resistor formed of the first N-type polycrystalline silicon region; and doping a high concentration P-type impurity into regions that become the source and the drain of the P-channel MOS transistor and a part or an entire region of the resistor formed of the second P-type polycrystalline silicon region.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a high concentration P-type impurity into the first polycrystalline silicon film to form a first P-type polycrystalline silicon region;

forming a second insulating film on the first polycrystalline silicon film;

selectively removing the second insulating film on the first P-type region of the first polycrystalline silicon film;

forming a high melting point metal silicide film on the semiconductor substrate;

performing heat treatment for the high melting point metal film, which contacts to the first polycrystalline silicon film, to obtain a high melting point metal silicide film;

selectively removing non-reacted high melting point metal silicide film on the second insulating film;

removing the patterned second insulating film;

forming a first insulating film on the high melting point metal silicide film and the first polycrystalline silicon film;

patterning the first insulating film, the first polycrystalline silicon film and the high melting point metal silicide film to form a gate electrode and a wiring formed of a lamination layer of the first P-type region of the first polycrystalline silicon film and the high melting point metal silicide film and a resistor region formed of the region other than the first P-type region of the first polycrystalline silicon film;

selectively removing the first insulating film on the resistor region;

selectively doping a low concentration N-type impurity into regions that become the source and the drain of the N-channel MOS transistor and the first polycrystalline silicon film other than the first P-type region to form a low concentration N-type source and drain and a first N-type region in the first polycrystalline silicon film;

selectively doping a low concentration P-type impurity into regions that become the source and the drain of the P-channel MOS transistor and the first polycrystalline silicon film other than the first P-type region and the first N-type region to form a low concentration P-type source and drain and a second P-type region in the first polycrystalline silicon film;

depositing a third insulating film on the semiconductor substrate;

etching the third insulating film by anisotropic dry etching to form side spacers on side walls of the first polycrystalline silicon film and the high melting point metal silicide film;

doping a high concentration N-type impurity into regions that become the source and the drain of the N-channel MOS transistor and a part or an entire region of the resistor formed of the first N-type polycrystalline silicon region; and doping a high concentration P-type impurity into regions that become the source and the drain of the P-channel MOS transistor and a part or an entire region of the resistor formed of the second P-type polycrystalline silicon region.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into an entire region of the first polycrystalline silicon film to form a first P-type region in the first polycrystalline silicon film;

forming a high melting point metal silicide film on the first polycrystalline silicon film;

forming a first insulating film on the high melting point metal silicide film;

patterning the first insulating film, the high melting point metal silicide film and the first polycrystalline silicon film of the first P-type region to form a gate electrode and a wiring;

selectively doping a low concentration N-type impurity into regions that become the source and the drain of the N-channel MOS transistor in the semiconductor substrate;

selectively doping a low concentration P-type impurity into regions that become the source and the drain of the P-channel MOS transistor in the semiconductor substrate;

depositing a third insulating film on the semiconductor substrate;

etching the third insulating film by anisotropic dry etching to form side spacers on side walls of the first polycrystalline silicon film and the high melting point metal silicide film;

forming a second polycrystalline silicon film on the semiconductor substrate;

selectively doping a low concentration N-type impurity into the second polycrystalline silicon film to form a first N-type polycrystalline silicon region;

doping a low concentration P-type impurity into an entire region of the second polycrystalline silicon film to form a second P-type polycrystalline silicon region;

patterning the second polycrystalline silicon film to form a resistor;

selectively doping a high concentration N-type impurity into region that become the source and the drain of the N-channel MOS transistor and a part or an entire region of the resistor formed of the first N-type region of the second polycrystalline silicon region; and selectively doping a high concentration P-type impurity into regions that become the source and the drain of the P-channel MOS transistor and a part or an entire region of the resistor formed of the second P-type region of the second polycrystalline silicon.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into an entire region of the first polycrystalline silicon film to form a first P-type region in the first polycrystalline silicon film;

forming a high melting point metal film on the first polycrystalline silicon film;

performing heat treatment for the high melting point metal film, which contacts to the first polycrystalline silicon film, to obtain a high melting point metal silicide film;

forming a first insulating film, the high melting point metal silicide film;

patterning the first insulating film, the high melting point metal silicide film and the first polycrystalline silicon to form a gate electrode and a wiring;

selectively doping a low concentration N-type impurity into regions that become the source and the drain of the N-channel MOS transistor in the semiconductor substrate;

selectively doping a low concentration P-type impurity into regions that become the source and the drain of the P-channel MOS transistor in the semiconductor substrate;

depositing a third insulating film on the semiconductor substrate;

etching the third insulating film by anisotropic dry etching to form side spacers on side walls of the first polycrystalline silicon film and the high melting point metal silicide film;

forming a second polycrystalline silicon film on the semiconductor substrate;

selectively doping a low concentration N-type impurity into the second polycrystalline silicon film to form a first N-type polycrystalline silicon region;

doping a low concentration P-type impurity into an entire region of the second polycrystalline silicon film to form a second P-type polycrystalline silicon region;

patterning the second polycrystalline silicon film to form a resistor;

selectively doping a high concentration N-type impurity into regions that become the source and the drain of the N-channel MOS transistor and a part or an entire region of the resistor formed of the first N-type region of the second polycrystalline silicon region; and selectively doping a high concentration P-type impurity into regions that become the source and the drain of the P-channel MOS transistor and a part or an entire region of the resistor formed of the second P-type region of the second polycrystalline silicon.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a low concentration N-type impurity into the first polycrystalline silicon film to form a first N-type polycrystalline silicon region;

selectively doping a high concentration P-type impurity into the first polycrystalline silicon film to form a first P-type polycrystalline silicon region in the first polycrystalline silicon film;

doping a low concentration P-type impurity into an entire region of the first polycrystalline silicon film to form a second P-type polycrystalline silicon region in the first polycrystalline silicon film;

patterning the first polycrystalline silicon film to form a gate electrode and a wiring formed of the first P-type region of the first polycrystalline silicon film and a resistor formed of the first N-type region and the second P-type region of the first polycrystalline silicon film;

doping a low concentration N-type impurity into the semiconductor substrate so that a source and a drain overlap a gate electrode of the N-channel MOS transistor in a planar manner selectively doping a low concentration P-type impurity into the semiconductor substrate so that both a source and a drain or only the drain side thereof overlap a gate electrode of the P-channel MOS transistor in the planar manner;

selectively doping a high concentration N-type impurity into a part or an entire region of the resistor formed of the first N-type region of the first polycrystalline silicon film and the source and drain regions not overlapping the gate electrode of the N-channel MOS transistor in a planer manner; and selectively doping a high concentration P-type impurity into a part or an entire region of the resistor formed of the second P-type region of the first polycrystalline silicon film and the region where both the source and the drain do not overlap the gate electrode of the P-channel MOS transistor in a planer manner or the region where the source side thereof overlaps the gate electrode in the planar manner an only the drain side thereof does not overlap the gate electrode in the planar manner.

Further, according to the present invention, there is provided a method of manufacturing a complementary MOS semiconductor device Further, according to the present invention, there is provided a, comprising the steps of:

forming wells or defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a high concentration P-type impurity into the first polycrystalline silicon film to form a first P-type polycrystalline silicon region in the first polycrystalline silicon film;

patterning the first polycrystalline silicon film to form a gate electrode and a wiring formed of the first P-type region of the first polycrystalline silicon film and a resistor formed of the region other than the first P-type region of the first polycrystalline silicon film;

selectively doping a low concentration N-type impurity into the first polycrystalline silicon film other than the semiconductor substrate and the first P-type region where the source and the drain overlap the gate electrode of the N-channel MOS transistor in a planer manner to form first N-type regions in the low concentration N-type source and drain and the first polycrystalline silicon film;

selectively doping a low concentration P-type impurity into the first polycrystalline silicon film other than the semiconductor substrate, the first P-type region and the second N-type region where both the source and the drain or only the drain side thereof overlaps the gate electrode of the P-channel MOS transistor in a planer manner to form second P-type regions in the low concentration source and drain or only drain of the P-channel MOS transistor and the first polycrystalline silicon film;

selectively doping a high concentration N-type impurity into a part or an entire region of the resistor formed of the first N-type region or the first polycrystalline silicon film and the source and drain regions not overlapping the gate electrode of the N-channel MOS transistor in a planer manner; and selectively doping a high concentration P-type impurity into a part or an entire region of the resistor formed of the second P-type region of the first polycrystalline silicon film and the region where both the source and the drain do not overlap the gate electrode of the P-channel MOS transistor in a planar manner or the region where the source side thereof overlaps the gate electrode in the planar manner and only the drain side thereof does not overlap the gate electrode in the planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into the first polycrystalline silicon film to form a first P-type polycrystalline silicon region in the first polycrystalline silicon film;

patterning the first polycrystalline silicon film to form a gate electrode and a wiring formed of the first P-type region;

forming a fourth insulating film on the semiconductor substrate;

forming a second polycrystalline silicon film on the semiconductor substrate;

selectively doping a low concentration N-type impurity into the second polycrystalline silicon film to form a first N-type region in the second polycrystalline silicon film;

doping a low concentration P-type impurity into an entire region of the second polycrystalline silicon film to form a second P-type region in the second polycrystalline silicon film;

patterning the second polycrystalline silicon film to form a resistor;

doping a low concentration N-type impurity into the semiconductor substrate so that the source and the drain overlap the gate electrode of the N-channel MOS transistor in a planar manner;

doping a low concentration P-type impurity into the semiconductor substrate so that both the source and the drain or only the drain side thereof overlap the gate electrode of the P-channel MOS transistor in the planar manner;

selectively doping a high concentration N-type impurity into a part or an entire region of the resistor formed of he first N-type region of the second polycrystalline silicon film and the source and drain regions not overlapping the gate electrode of the N-channel MOS transistor in a planer manner; and selectively doping a high concentration P-type impurity into a part or an entire region of the resistor formed of the second P-type region of the second polycrystalline silicon films and the region where both the source and the drain do not overlap the gate electrode of the P-channel MOS transistor in a planer manner or the region where the source side thereof overlaps the gate electrode in the planar manner and only the drain side thereof does not overlap the gate electrode in the planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into the first polycrystalline silicon film to form a first P-type polycrystalline silicon region in the first polycrystalline silicon film;

patterning the first polycrystalline silicon film to form a gate electrode and a wiring formed of the first P-type region;

forming a fourth insulating film on the semiconductor substrate;

forming a second polycrystalline silicon film on the semiconductor substrate;

patterning the second polycrystalline silicon film to form a resistor;

selectively doping a low concentration N-type impurity into the region where source and the drain overlap the gate electrode of the N-channel MOS transistor in a planer manner and the second polycrystalline silicon film to simultaneously form first N-type regions in the low concentration source and drain of the N-channel MOS transistor and the second polycrystalline silicon film;

selectively doping a low concentration P-type impurity into the region where both the source and the drain or only the drain side thereof overlaps the gate electrode of the P-channel MOS transistor in a planer manner and the second polycrystalline silicon film to simultaneously form second P-type regions in the low concentration source and drain or drain of the P-channel MOS transistor and the second polycrystalline silicon film;

selectively doping a high concentration N-type impurity into a part or an entire region of the resistor formed of the first N-type region of the second polycrystalline silicon film and the source and drain regions not overlapping the gate electrode of the N-channel MOS transistor in a planer manner; and selectively doping a high concentration P-type impurity into a part or an entire region of the resistor formed of the second P-type region of the second polycrystalline silicon film and the region where both the source and the drain do not overlap the gate electrode of the P-channel MOS transistor in a planer manner or the region where the source side thereof overlaps the gate electrode in a planar manner and only the drain side thereof does not overlap the gate electrode in the planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region or the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a low concentration N-type impurity into the first polycrystalline silicon film to form a first N-type polycrystalline silicon region in the first polycrystalline silicon film;

selectively doping a high concentration P-type impurity into the first polycrystalline silicon film to form a first P-type polycrystalline silicon region in the first polycrystalline silicon film;

doping a low concentration P-type impurity into an entire region of the first polycrystalline silicon film to form a second P-type polycrystalline silicon region in the first polycrystalline silicon film;

forming a second insulating film on the first polycrystalline silicon film;

selectively removing the second insulating film on the first P-type region of the first polycrystalline silicon film;

forming a high melting point metal silicide film on the semiconductor substrate;

selectively removing the high melting point silicide film on the patterned second insulating film and in the vicinity thereof;

removing the patterned second insulating film;

patterning the first polycrystalline silicon film and the high melting point metal silicide film to form a gate electrode and a wiring formed of a lamination layer of the first P-type region of the first polycrystalline silicon film and the high melting point metal silicide film and a resistor region formed of the first N-type region of the first polycrystalline silicon film and the second P-type region;

doping a low concentration N-type impurity into the semiconductor substrate so that the source and the drain overlap the gate electrode of the N-channel type MOS transistor in the planar manner;

doping a low concentration P-type impurity into the semiconductor substrate so that both the source and the drain or only the drain side thereof overlaps the gate electrode of the P-type MOS transistor in the planar manner;

selectively doping a high concentration N-type impurity into a part or an entire region of the resistor formed of the first N-type region of the first polycrystalline silicon film and the source and drain regions not overlapping the gate electrode of the N-channel MOS transistor in the planer manner; and selectively doping a high concentration P-type impurity into a part or an entire region of the resistor formed of the second P-type region of the first polycrystalline silicon film and the region where both the source and the drain do not overlap the gate electrode of the P-channel MOS transistor in a planer manner or the region where the source side thereof overlaps the gate electrode in a planar manner and only the drain side thereof does not overlap the gate electrode in the planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a high concentration P-type impurity into the first polycrystalline silicon film to form a first P-type region in the first polycrystalline silicon film;

forming a second insulating film on the first polycrystalline silicon film;

selectively removing the second insulating film on the first P-type region of the first polycrystalline silicon film;

forming a high melting point metal silicide film on the semiconductor substrate;

selectively removing the high melting point silicide film on the patterned second insulating film and in the vicinity thereof;

removing the patterned second insulating film;

patterning the first polycrystalline silicon film and the high melting point metal silicide film to form a gate electrode and a wiring formed of a lamination layer of the first P-type region of the first polycrystalline silicon film and the high melting point metal silicide film and a resistor region formed of the region other than the first P-type region of the first polycrystalline silicon film;

selectively doping a low concentration N-type impurity into the region where the source and the drain overlap the gate electrode of the N-channel MOS transistor in a planer manner and the first polycrystalline silicon film, other than the first P-type region to simultaneously form first N-type regions in the low concentration source and drain of the N-channel MOS transistor and the first polycrystalline silicon film;

selectively doping a low concentration P-type impurity into the region where both the source and the drain or only the drain side thereof overlaps the gate electrode of the P-channel MOS transistor in a planer manner and the first polycrystalline silicon film other than the first P-type region and the first N-type region to simultaneously form second P-type regions in the low concentration source and drain or only drain of the P-channel MOS transistor and the first polycrystalline silicon film;

selectively doping a high concentration N-type impurity into a part or an entire region of the resistor formed of the first N-type region of the first polycrystalline silicon film and the source and drain regions not overlapping the gate electrode of the N-channel MOS transistor in the planer manner; and selectively doping a high concentration P-type impurity into a part or an entire region of the resistor formed of the second P-type region of the first polycrystalline silicon film and the region where both the source and the drain do not overlap the gate electrode of the P-channel MOS transistor in a planer manner or the region where the source side thereof overlaps the gate electrode in a planar manner and only the drain side thereof does not overlap the gate electrode in the planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a low concentration N-type impurity into the first polycrystalline silicon film to form a first N-type region in the first polycrystalline silicon film;

selectively doping a high concentration P-type impurity into the first polycrystalline silicon film to form a first P-type polycrystalline silicon region in the first polycrystalline silicon film;

doping a low concentration P-type impurity into an entire region of the first polycrystalline silicon film to form a second P-type polycrystalline silicon region in the first polycrystalline silicon film;

forming a second insulating film on the first polycrystalline silicon film;

selectively removing the second insulating film on the first P-type region of the first polycrystalline silicon film;

forming a high melting point metal film on the semiconductor substrate;

performing heat treatment for the high melting point metal film, which contacts to the first polycrystalline silicon film, to obtain a high melting point metal silicide film;

selectively removing non-reacted high melting point film on the second insulating film;

removing the patterned second insulating film;

patterning the first polycrystalline silicon film and the high melting point metal film to form a gate electrode and a wiring formed of a lamination layer of the first P-type region of the first polycrystalline silicon film and the high melting point metal silicide film and a resistor region formed of the first N-type region of the first polycrystalline silicon film and the second P-type region;

doping a low concentration N-type impurity into the semiconductor substrate so that the source and the drain overlap the gate electrode of the N-channel type MOS transistor in the planar manner;

doping a low concentration P-type impurity into the semiconductor substrate so that both the source and the drain or only the drain side thereof overlaps the gate electrode of the P-type MOS transistor in the planar manner;

selectively doping, a high concentration N-type impurity into a part or an entire region of the resistor formed of the first N-type region of the first polycrystalline silicon film and the source and drain regions not overlapping the gate electrode of the N-channel MOS transistor in the planer manner; and selectively doping a high concentration P-type impurity into a part or an entire region of the resistor formed of the second P-type region of the first polycrystalline silicon film and the region where both the source and the drain do not overlap the gate electrode of the P-channel MOS transistor in a planer manner or the region where the source side thereof overlaps the gate electrode in a planar manner and only the drain side thereof does not overlap the gate electrode in the planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

selectively doping a high concentration, P-type impurity into the first polycrystalline silicon film to form a first P-type region in the first polycrystalline silicon film;

forming a second insulating film on the first polycrystalline silicon film;

selectively removing the second insulating film on the first P-type region of the first polycrystalline silicon film;

forming a high melting point metal film or the semiconductor substrate;

performing heat treatment for the high melting point metal film, which contacts to the first polycrystalline silicon film, to obtain a high melting point metal silicide film;

selectively removing non-reacted high melting point film on the second insulating film;

removing the patterned second insulating film;

patterning the first polycrystalline silicon film and the high melting point metal silicide film to form a gate electrode and a wiring formed of a lamination layer of the first P-type region of the first polycrystalline silicon film and the high melting point metal silicide film and a resistor region formed of the region other than the first P-type region of the first polycrystalline silicon film;

selectively doping a low concentration N-type impurity into the region where the source and the drain overlap the gate electrode of the N-channel MOS transistor in a planer manner and the first polycrystalline silicon film other than the first P-type region to simultaneously form first N-type regions in the low concentration source and drain of the N-channel MOS transistor and the first polycrystalline silicon film;

selectively doping a low concentration P-type impurity into the region where both the source and the drain or only the drain side thereof overlaps the gate electrode of the P-channel MOS transistor in a planer manner and the first polycrystalline silicon film other than the first P-type region and the first N-type region to simultaneously form second P-type regions in the low concentration source and drain or only drain of the P-channel MOS transistor and the first polycrystalline silicon film;

selectively doping a high concentration N-type impurity into a part or an entire region of the resistor forced of the first N-type region of the first polycrystalline silicon film and the source and drain regions not overlapping the gate electrode of the N-channel MOS transistor in the planer manner; and selectively doping a high concentration P-type impurity into a part or an entire region of the resistor formed of the second P-type region of the first polycrystalline silicon film and the region where both the source and the drain do not overlap the gate electrode of the P-channel MOS transistor in a planer manner or the region where the source side thereof overlaps the gate electrode in a planar manner and only the drain side thereof does not overlap the gate electrode in the planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into the first polycrystalline silicon film to form a first P-type region in the first polycrystalline silicon film;

forming a high melting point metal silicide film on the first polycrystalline silicon film;

patterning the high melting point metal silicide film and the first polycrystalline silicon film to form a gate electrode and a wiring formed of a lamination layer of the first P-type region of the first polycrystalline silicon film and the high melting point metal silicide film;

forming a fourth insulating film on the semiconductor substrate;

forming a second polycrystalline silicon film on the semiconductor substrate;

selectively doping a low concentration N-type impurity into the second polycrystalline silicon film to form a first N-type region in the second polycrystalline silicon film;

doping a low concentration P-type impurity into an entire region of the second polycrystalline silicon film form a second P-type region in the second polycrystalline silicon film;

patterning the second polycrystalline silicon film to form a resistor;

doping a low concentration N-type impurity into the semiconductor substrate so that a source and a drain overlap a gate electrode of the N-channel MOS transistor in the planar manner;

selectively doping a low concentration P-type impurity into the semiconductor substrate so that both a source and a drain or only the drain side thereof overlaps a gate electrode of the P-channel MOS transistor in the planar manner;

selectively doping a high concentration N-type impurity into a part or an entire region of the resistor formed of the first N-type region of the second polycrystalline silicon film and the source and drain regions not overlapping the gate electrode of the N-channel MOS transistor in the planer manner; and selectively doping a high concentration P-type impurity into a part or an entire region of the resistor formed of the second P-type region of the second polycrystalline silicon film and the region where both the source and the drain do not overlap the gate electrode of the P-channel MOS transistor in a planer manner or the region where the source side thereof overlaps the gate electrode in the planar manner and only the drain side thereof does not overlap the gate electrode in he planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into the first polycrystalline silicon film to form a first P-type region in the first polycrystalline silicon film;

forming a high melting point metal silicide film on the first polycrystalline silicon film;

patterning the high melting point metal silicide film and the first polycrystalline silicon film to form a gate electrode and a wiring formed of a lamination layer of the first P-type region of the first polycrystalline silicon film and the high melting point metal silicide film;

forming a fourth insulating film on the semiconductor substrate;

forming a second polycrystalline silicon film on the semiconductor substrate;

patterning the second polycrystalline silicon film to form a resistor;

selectively doping a low concentration N-type impurity into the region where the source and the drain overlap the gate electrode of the N-channel MOS transistor in a planer manner and the second polycrystalline silicon film to simultaneously form first N-type regions in the low concentration source and drain of the N-channel MOS transistor and the second polycrystalline silicon film;

selectively doping a low concentration P-type impurity into the region where both the source and the drain or only the drain side thereof overlaps the gate electrode of the P-channel MOS transistor in a planer manner and the second polycrystalline silicon film to simultaneously form second P-type regions in the low concentration source and drain or the drain of the P-channel MOS transistor and the second polycrystalline silicon film;

selectively doping a high concentration N-type impurity into a part or an entire region of the resistor formed of the first N-type region of the second polycrystalline silicon film and the source and drain regions not overlapping the gate electrode of the N-channel MOS transistor in the planer manner; and selectively doping a high concentration P-type impurity into a part or an entire region of the resistor formed of the second P-type region of the second polycrystalline silicon film and the region where both the source and the drain do not overlap the gate electrode of the P-channel MOS transistor in a planer manner or the region where the source side thereof overlaps the gate electrode in the planar manner and only the drain side thereof does not overlap the gate electrode in the planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into the first polycrystalline silicon film to form a first P-type region in the first polycrystalline silicon film;

forming a high melting point metal film on the first polycrystalline silicon film;

performing heat treatment for the high melting point metal film, which contacts the first polycrystalline silicon film, to obtain a high melting point metal silicide film;

patterning the high melting point metal silicide film and the first polycrystalline silicon film to form a gate electrode and a wiring formed of a lamination layer of the first P-type region of the first polycrystalline silicon film and the high melting point metal silicide film;

forming a fourth insulating film on the semiconductor substrate;

forming a second polycrystalline silicon film on the semiconductor substrate;

selectively doping a low concentration N-type impurity into the second polycrystalline silicon film to form the first N-type region in the second polycrystalline silicon film;

doping a low concentration P-type impurity into an entire region of the second polycrystalline silicon film to form a second P-type region in the second polycrystalline silicon film;

patterning the second polycrystalline silicon film to form a resistor;

doping a low concentration N-type impurity into the semiconductor substrate so that the source and the drain overlap the gate electrode of the N-channel MOS transistor in a planar manner;

doping a low concentration P-type Impurity into the semiconductor substrate so that both the source and the drain or the drain overlaps the gate electrode of the P-channel MOS transistor in the planar manner;

selectively doping a high concentration N-type impurity into a part or an entire region of the resistor formed of the first N-type region of the second polycrystalline silicon film and the source and drain regions not overlapping the gate electrode of the N-channel MOS transistor in the plane manner; and selectively doping a high concentration P-type impurity into a part or an entire region of the resistor formed of the second P-type region of the second polycrystalline silicon film and the region where both the source and the drain do not overlap the gate electrode of the P-channel MOS transistor in a planer manner or the region where the source side thereof overlaps the gate electrode In the planar manner and only the drain side thereof does not overlap the gate electrode in the planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into the first polycrystalline silicon film to form a first P-type region in the first polycrystalline silicon film;

forming a high melting point metal film on the first polycrystalline silicon film;

performing heat treatment for the high melting point metal film, which contacts the first polycrystalline silicon film, to obtain a high melting point metal silicide film;

patterning the high melting point metal silicide film and the first polycrystalline silicon film to form a gate electrode and a wiring formed of a lamination layer of the first P-type region of the first polycrystalline silicon film and the high melting point metal silicide film;

forming a fourth insulating film on the semiconductor substrate;

forming a second polycrystalline silicon film on the semiconductor substrate;

patterning the second polycrystalline silicon film to form a resistor;

selectively doping a low concentration N-type Impurity into the region where source and the drain overlap the gate electrode of the N-channel MOS transistor in a planer manner and the second polycrystalline silicon film to simultaneously form first N-type regions in the low concentration source and drain of the N-channel MOS transistor and the second polycrystalline silicon film;

selectively doping a low concentration P-type impurity into the region where both the source and the drain or only the drain side thereof overlaps the gate electrode of the P-channel MOS transistor in a planer manner and the second polycrystalline silicon film to simultaneously form second P-type regions in the low concentration source and drain or drain of the P-channel MOS transistor and the second polycrystalline silicon film;

selectively doping a low concentration N-type impurity into a part or an entire region of the resistor formed of the first N-type region of the second polycrystalline silicon film and the source and drain regions not overlapping the gate electrode of the N-channel MOS transistor in the planer manner; and selectively doping a high concentration P-type impurity into a part or an entire region of the resistor formed of the second P-type region of the second polycrystalline silicon film and the region where both the source and the drain do not overlap the gate electrode of the P-channel MOS transistor in a planer manner or the region where the source side thereof overlaps the gate electrode in the planar manner and only the drain side thereof does not overlap the gate electrode in the planar manner.

Further, according to the present invention, there is provided a method of manufacturing a complementary MOS semiconductor device, comprising the steps of:

forming wells for defining respective regions of an N-channel MOS transistor and a P-channel MOS transistor in a semiconductor substrate;

forming an element isolating region on the semiconductor substrate;

forming a gate insulating film on the semiconductor substrate;

doping an impurity for controlling a threshold value into the semiconductor substrate;

forming a first polycrystalline silicon film on the semiconductor substrate;

doping a high concentration P-type impurity into an entire region of the first polycrystalline silicon film to form a first P-type region in the first polycrystalline silicon film;

forming a high melting point metal silicide film on the first polycrystalline silicon film;

forming a first insulating film on the high melting point metal silicide film;

patterning the first insulating film, the high melting point metal silicide film and the first polycrystalline silicon film to form a gate electrode and a wiring;

forming a fourth insulating film on the semiconductor substrate;

forming a second polycrystalline silicon film on the semiconductor substrate;

selectively doping a low concentration N-type impurity into the second polycrystalline silicon film to form a first N-type region in the second polycrystalline silicon film;

doping a low concentration P-type impurity into an entire region of the second polycrystalline silicon film to on a second P-type region in the second polycrystalline silicon film;

patterning the second polycrystalline silicon film to form a resistor;

selectively doping a low concentration N-type impurity into the semiconductor substrate so that both a source and a drain or only the drain side thereof overlaps the gate electrode of the N-channel MOS transistor in a planar manner;

selectively doping a low concentration P-type impurity into the semiconductor substrate so that both the source and the drain or only the drain side thereof overlaps the gate electrode of the P-channel MOS transistor in the planar manner;

selectively doping a low concentration N-type impurity into a part or an entire region of the resistor formed of the first N-type region of the second polycrystalline silicon film and the source and drain regions not overlapping the gate electrode of the N-channel MOS transistor in the planer manner, or the region where the source side thereof overlaps the gate electrode in a planar manner and only the drain side thereof does not overlap the gate electrode in the planar manner; and selectively doping a high concentration P-type impurity into a part or an entire region of the resistor formed of the second P-type region of the second polycrystalline silicon film and the region where both the source and the drain do not overlap the gate electrode of the P-channel MOS transistor in a planer manner or the region where the source side thereof overlaps the gate electrode in the planar manner and only the drain side thereof does not overlap the gate electrode in the planar manner.

Further, according to the present invention, there is provided a complementary MOS semiconductor device, characterized in that the semiconductor substrate is a P-type semiconductor substrate, and regions of the N-channel MOS transistor and the P-channel MOS transistor are defined by forming an N-type well, respectively.

Further, according to the present invention, there is provided a complementary MOS semiconductor device, characterized in that the semiconductor substrate is a P-type semiconductor substrate, and regions of the N-channel MOS transistor and the P-channel MOS transistor are defined by forming an N-type well and a P-type well, respectively.

Further, according to the present invention, there is provided a complementary MOS semiconductor device, characterized in that the semiconductor substrate is an N-type semiconductor substrate, and regions of the N-channel MOS transistor and the P-channel MOS transistor are defined by forming a P-type well, respectively.

Further, according to the present invention, there is provided a complementary MOS semiconductor device, characterized in that the semiconductor substrate is an N-type semiconductor substrate, and regions of the N-channel MOS transistor and the P-channel MOS transistor are defined by forming an N-type well and a P-type well, respectively.

Further, according to the present invention, there is provided a method of manufacturing a complementary MOS semiconductor device, characterized in that the semiconductor substrate is a P-type semiconductor substrate, and regions of the N-channel MOS transistor and the P-channel MOS transistor are defined by forming an N-type well, respectively.

Further, according to the present invention, there is provided a method of manufacturing a complementary MOS semiconductor device, characterized in that the semiconductor substrate is a P-type semiconductor substrate, and regions of the N-channel MOS transistor and the P-channel MOS transistor are defined by forming an N-type well and a P-type well, respectively.

Further, according to the present invention, there is provided a method of manufacturing a complementary MOS semiconductor device, characterized in that the semiconductor substrate is an N-type semiconductor substrate, and regions of the N-channel MOS transistor and the P-channel MOS transistor are defined by forming a P-type well, respectively.

Further, according to the present invention, there is provided method of manufacturing a complementary MOS semiconductor device, characterized in that the semiconductor substrate is an N-type semiconductor substrate, and regions of the N-channel MOS transistor and the P-channel MOS transistor are defined by forming an N-type well and a P-type well, respectively.

Further, according to the present invention, there is provided a method of manufacturing a complementary MOS semiconductor device, characterized in that the step of forming the element isolating region on the semiconductor substrate is performed by a LOCOS method.

Further, according to the present invention, there is provided a method of manufacturing a complementary MOS semiconductor device, characterized in that the step of forming the element isolating region on the semiconductor substrate is performed by a shallow trench isolation method.

Further, according to the present invention, there is provided a method of manufacturing a complementary MOS semiconductor device, characterized in that the step of doping the impurity for the threshold control is performed by an ion injection method, and the impurity for the threshold control of the N-channel MOS transistor is arsenic or phosphorous.

Further, according to the present invention, there is provided a complementary MOS semiconductor device, characterized in that the first polycrystalline silicon is formed by a chemical vapor deposition method.

Further, according to the present invention, there is provided a complementary MOS semiconductor device, characterized in that the second polycrystalline silicon is formed by a chemical vapor deposition method or a sputtering method.

Further, according to the present invention, there is provided a method of manufacturing a complementary MOS semiconductor device, characterized in that the first polycrystalline silicon is formed by a chemical vapor deposition method.

Further, according to the present invention, there is provided a method of manufacturing a complementary MOS semiconductor device, characterized in that the second polycrystalline silicon is formed by a chemical vapor deposition method or a sputtering method, Further, according to the present invention, there is provided a method of manufacturing a complementary MOS semiconductor device, characterized in that the first P-type region of the first polycrystalline silicon is formed by an ion injection method using boron or $BF_2$ as an impurity, a pre-deposition and drive-in method in an electric furnace using boron as an impurity or a molecular layer doping method using boron as the impurity.

Further, according to the present invention, there is provided a method of manufacturing a complementary MOS semiconductor device, characterized in that the step of forming the first P-type region of the first polycrystalline silicon is performed by a chemical vapor deposition method for depositing polycrystalline silicon and simultaneously doping boron as an impurity.

Further, according to the present invention, there is provided a method of manufacturing a complementary MOS semiconductor device, characterized in that the first insulating film is a silicon oxide film formed by a chemical vapor deposition method or a thermal oxidization method and has a film thickness in a range of 1000 Å to 2000 Å.

Further, according to the present invention, there is provided a method of manufacturing a complementary MOS semiconductor device, characterized in that the first insulating film is a silicon oxide film formed by a chemical vapor deposition method and has a film thickness in a range of 1000 Å to 2000 Å.

Further, according to the present invention, there is provided a method of manufacturing a complementary MOS semiconductor device, characterized in that a lower layer of the first insulating film is a silicon oxide film formed by a chemical vapor deposition method or a thermal oxidization method; an upper layer thereof is formed by the chemical vapor deposition method; and a total film thickness of the first insulating is in a range of 1000 Å to 3000 Å.

Further, according to the present invention, there is provided a method of manufacturing a complementary MOS semiconductor device, characterized in that the second insulating film is formed by a chemical vapor deposition method and has a film thickness in a range of 1000 Å to 4000 Å.

Further, according to the present invention, there is provided a method of manufacturing a complementary MOS semiconductor device, characterized in that the method insulating film is a silicon oxide film formed by a chemical vapor deposition method and has a total film thickness in a range of 2000 Å to 6000 Å.

Further, according to the present invention, there is provided a complementary MOS semiconductor device, characterized in that the high melting point metal silicide is formed by a chemical vapor deposition method or a sputtering method.

Further, according to the present invention, there is provided a method of manufacturing a complementary MOS semiconductor device, characterized in that the high melting point metal silicide is formed by a chemical vapor deposition method or a sputtering method.

Further, according to the present invention, there is provided a method of manufacturing a complementary MOS semiconductor device, characterized in that the high melting point metal is cobalt or titanium formed by a sputtering method and has a film thickness in a range of 100 Å to 500 Å.

Further, according to the present invention, there is provided a semiconductor device, characterized in that, in a reference voltage circuit in which a gate and a drain of an enhancement NMOS transistor in which the gate and the drain are short-circuited, are connected to a gate and a source of a depletion NMOS transistor in which the gate and the source are short-circuited, and the connection node is used as an output node, the polarities of gate electrodes of the enhancement NMOS transistor and the depletion NMOS transistor are a P-type.

Further, according to the present invention, there is provided a semiconductor device, characterized in that, in a reference voltage circuit in which a source of an enhancement NMOS transistor in which the gate and the drain are short-circuited, is connected to a drain of a depletion NMOS transistor in which the gate and the source are short-circuited, and the connection node is used as an output node, the polarities of gate electrodes of the enhancement NMOS transistor and the depletion NMOS transistor are a P-type.

Further, according to the present invention, there is provided a semiconductor device, characterized in that, in a reference voltage circuit in which a gate and a drain of an enhancement NMOS transistor in which the gate and the drain are short-circuited, are connected to a source of a depletion NMOS transistor in which a gate is short-circuited with a source of the enhancement NMOS transistor and the connection node is used as an output node, the polarities of gate electrodes of the enhancement NMOS transistor and she depletion NMOS transistor are a P-type.

Further, according to the present invention, there is provided a semiconductor device, characterized in that, in a reference voltage circuit in which: a drain of a depletion NMOS transistor in which a gate and a source are short-circuited is connected to a drain and a gate of a first enhancement PMOS transistor in which a source is connected to a power supply; a drain of a second enhancement PMOS transistor in which a source is connected to a power supply and a gate is connected commonly to the first enhancement PMOS transistor is connected to a gate and a drain of an enhancement NMOS transistor in which the gate and the drain are short-circuited; and the connection node is used as an output node, the polarities of gate electrodes of the enhancement NMOS transistor and the depletion NMOS transistor are a P-type.

Further, according to the present invention, there is provided a semiconductor device, characterized in that, in a reference voltage circuit in which: a drain of a first depletion NMOS transistor in which a gate and a source are short-circuited, is connected to a gate and a source of a second depletion NMOS transistor in which the gate and the source are short-circuited; a drain of the second depletion NMOS transistor is connected to a power supply; the source of the first depletion NMOS transistor is connected to an enhancement NMOS transistor in which a gate and a drain are short-circuited; and the connection node is used as an output node, the polarities of gate electrodes of the enhancement NMOS transistor, the first depletion NMOS transistor, and the second depletion NMOS transistor are a P-type.

Further, according to the present invention, there is provided a semiconductor device, characterized in that, in a reference voltage circuit in which: a gate and a drain of an enhancement NMOS transistor in which the gate and the drain are short-circuited, are connected with a source of a first depletion NMOS transistor in which a gate is connected to a source of the enhancement NMOS transistor; a drain of the first depletion NMOS transistor is connected to a gate and a source of a second depletion NMOS transistor in which the gate and the source are short-circuited; a drain of the second depletion NMOS transistor is connected to a power supply; and the connection node of the drain of the enhancement NMOS transistor and the source of the first depletion NMOS transistor is used as an output node, the polarities of gate electrodes of the enhancement NMOS transistor, the first depletion NMOS transistor, and the second depletion NMOS transistor are a P-type.

BRIEF DESCRIPTION OF THE DRAWINGS

In the accompanying drawings:

FIG. 6 is an example of a reference voltage circuit constituted of the semiconductor device;

DETAILED DESCRIPTION OF THE PREFERRED EMBODIMENT

Hereinafter, embodiments of the present invention are described with reference to the accompanying drawings.

Figure 1:
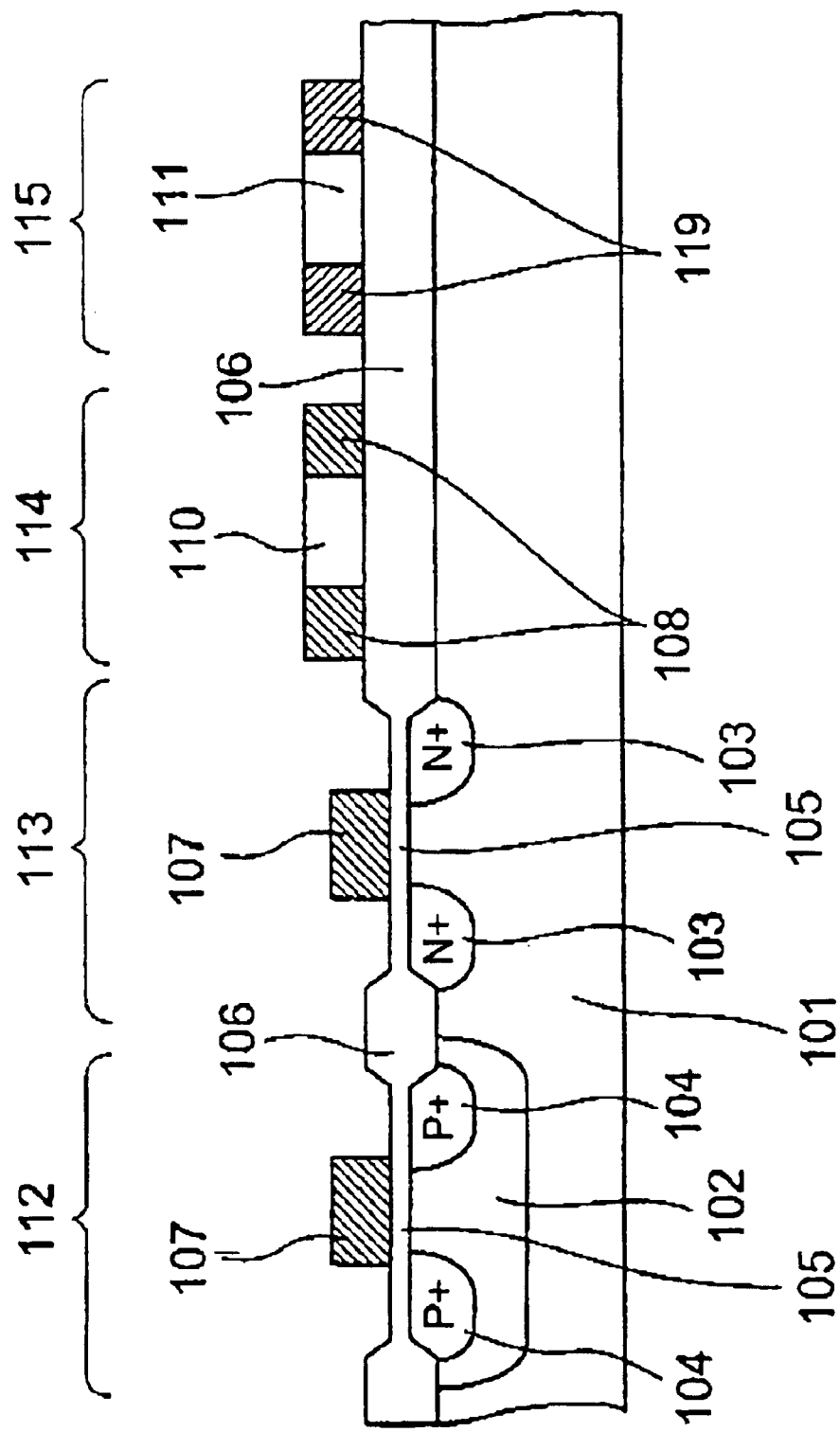
FIG. 1 is a schematic cross sectional view showing a CMOS semiconductor device in accordance with a first embodiment of the present invention.

FIG. 1 is a schematic cross sectional view showing one embodiment of a CMOS semiconductor device of the present invention. The CMOS semiconductor device is constituted of a CMOS composed of an NMOS 113 and a PMOS 112, a P−resistor 114 and an N−resistor 115, which are formed on a P-type semiconductor substrate 101. In the NMOS 113, a gate electrode is formed of a P+polycrystalline silicon 107 and a source and a drain have a so-called single drain structure, and in the PMOS 112, a gate electrode formed on an N-well region 102 is formed from the P+polycrystalline silicon 107 and a source and a drain have a single train structure. The P−resistor 114 and the N−resistor 115 are used for a voltage dividing circuit for dividing a voltage or a CR circuit for setting time constant and are formed on a field insulating film 106. The P+polycrystalline silicon 107 that forms the gate electrode preferably has lower resistance as much as possible, and thus, contains an acceptor impurity such as boron or $BF_2$ with a concentration of $1 \times 10^{19}$ atoms/cm$^3$ or more. The resistors 114, 115 are formed of the same layer of polycrystalline silicon as the gate electrode of the CMOS.

In the PMOS 112, the gate electrode is the P+polycrystalline silicon 107, and thus, a channel of an E-type PMOS is a surface channel in accordance with the relationship of working functions of the N-well 102 and the gate electrode. In the surface channel PMOS, the setting of a threshold voltage to, or example, −0.5 V or more does not lead to the extreme deterioration of sub-threshold coefficient. Thus, the low voltage operation and the low power consumption are possible.

On the other hand, in the NMOS 113, a channel of an E-type NMOS is a buried channel in accordance with the relationship of working functions of the gate electrode of the P−polycrystalline silicon 107 and the P-type semiconductor substrate 101. Arsenic having a small diffusion coefficient can be used as a donor impurity for threshold control in the case where a threshold is set to a predetermined value, and thus, the channel is an extremely shallow buried channel. Therefore, a deterioration of sub-threshold and an increase of a leak current are remarkably suppressed in the E-type NMOS in comparison with the E-type PMOS with the gate electrode formed of the N+polycrystalline silicon and a deep buried channel that arises from the requisite usage of boron as the acceptor impurity for threshold control having a large diffusion coefficient and a large projection range in ion injection even with the setting of the threshold voltage to a small value, for example, 0.5 V or less.

With the above description, it will be understood that the CMOS of the present invention in which the gate electrode is the P+polycrystalline silicon monopole is an effective technique with respect to low voltage operation and low power consumption in comparison with the conventional CMOS in which the gate electrode is the N+polycrystalline silicon electrode.

FIG. 1 shows both the P−resistor 114 and the N−resistor 115. However, there is the case where either the P−resistor 114 or the N−resistor 115 is mounted for he purpose of reducing the number of steps and cost in consideration of the characteristics of these resistors and properties required for products.

Figure 2:
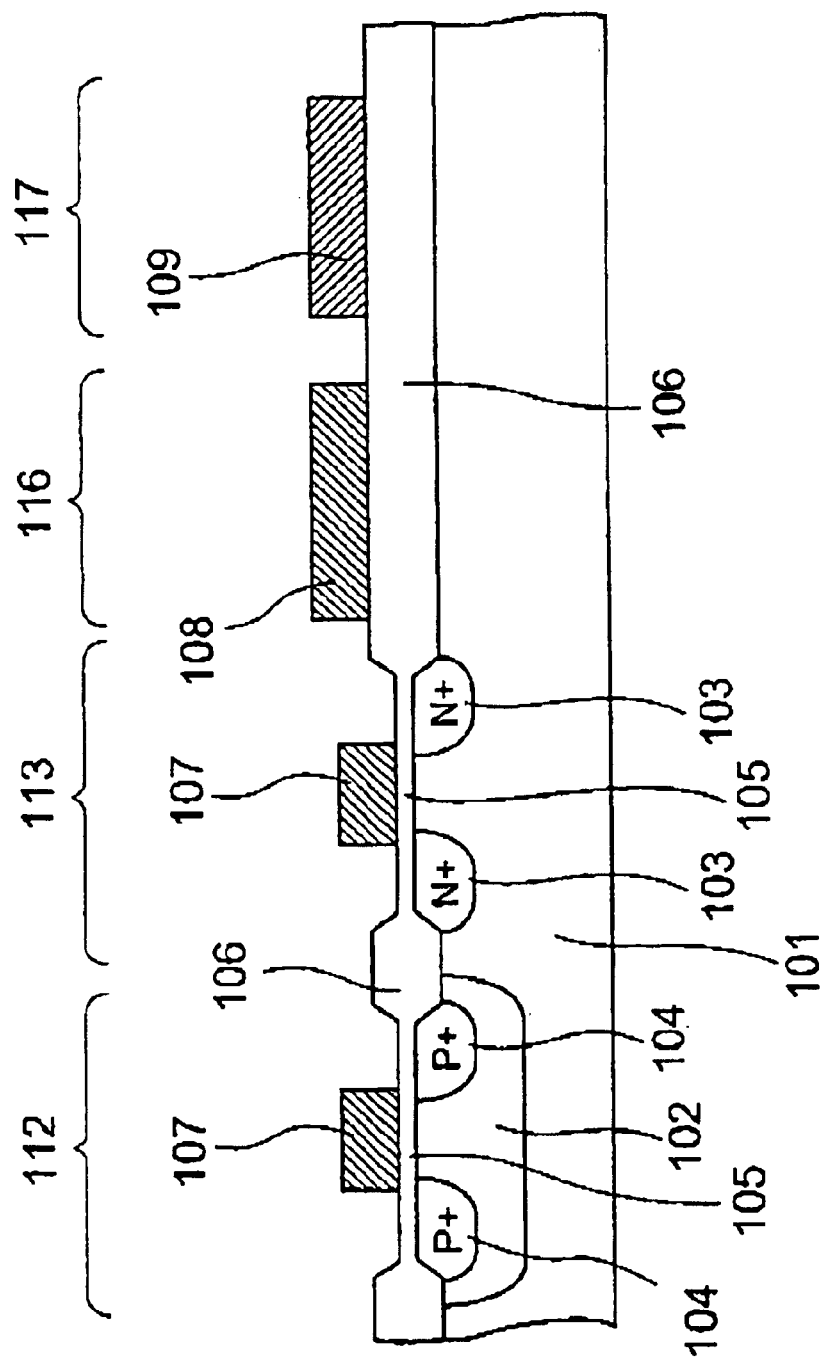
FIG. 2 is a schematic cross sectional view showing a CMOS semiconductor device in accordance with a second embodiment of the present invention.

FIG. 2 is a schematic cross sectional view showing a second embodiment of a CMOS semiconductor device of the present invention.

The P+polycrystalline silicon monopole CMOS structure is the same as that in the embodiment in FIG. 1, and has the same effects as the embodiment in FIG. 1 of the low voltage operation, low power consumption and low cost. However, the difference of the second embodiment from the embodiment in FIG. 1 is that resistors comprised of polycrystalline silicon are P+resistor 116 and an N+resistor 117 with a relatively high impurity concentration and with low resistance. The P−resistor or the N−resistor in the embodiment of FIG. 1 is effective in a resistor circuit such as a voltage dividing circuit, which has a relatively high sheet resistance value and in which specific precision is regarded as important. However, in the resistor in which absolute value precision is regarded as important or the resistor in which a small temperature coefficient is required, such as a CR circuit for setting time constant, the high impurity concentration and the relatively low resistance lead to an improvement of the absolute value precision and the temperature coefficient.

The formation of the P+resistor 116 and the N+resistor 117 is attained by simultaneously doping the impurity into the polycrystalline silicon in the formation of a source and a drain of the NMOS and PMOS. In this case, as to the P+resistor 116, boron or $BF_2$ is used as the impurity with a concentration of approximately $1 \times 10^{19}$ atoms/cm$^3$ or more, a sheet resistance value of approximately several hundred Ω/square to 1 kΩ/square, and a temperature coefficient of approximately several hundred ppm/° C. to 1000 ppm/° C. As to the N+resistor 117, phosphorous or arsenic is used as the impurity with a concentration of approximately $1 \times 10^{19}$ atoms/cm$^3$ or more, a sheet resistance value of approximately one hundred Ω/square to several hundred Ω/square, and a temperature coefficient of approximately several hundred ppm/° C. to 1000 ppm/° C. Further, FIG. 2 shows both the N+resistor 117 and the P+resistor 116. However, one of these resistors may constitute the semiconductor device for the purpose of reducing the number of steps and cost in consideration of the characteristics required for the semiconductor device and characteristics of the resistors.

Figure 3:
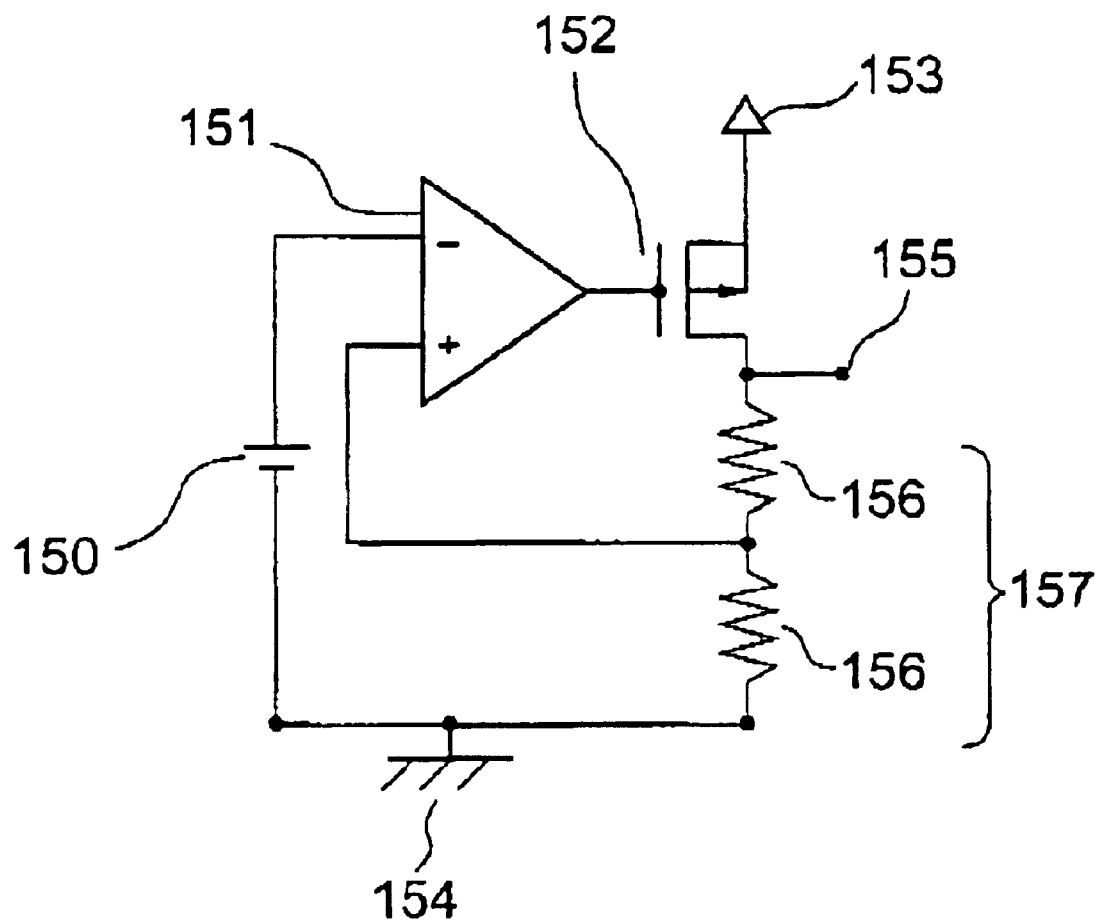
FIG. 3 shows a general structure of a positive VR constituted of a semiconductor device.

Next, the specific effects in the case where the present invention is applied to an actual product are described with reference to FIG. 3. FIG. 3 shows a general structure of a positive VR constituted of a semiconductor device. The VR is composed of a reference voltage circuit 150, an error amplifier 151, a PMOS output element 152 and a voltage dividing circuit 157 composed of resistances 156, and is a semiconductor device having a function of always outputting a constant voltage together with a required current value to an output terminal 155 even if an arbitrary voltage is input to an input terminal 153.

In recent years, a VR for particularly portable apparatuses is required from the market to attain the low voltage of an input voltage, low power consumption, outputting of a high current even with a small potential difference of input/output, high precision of an output voltage, low cost, miniaturization and the like. In particular, the low cost and miniaturization are demands of high priority. With respect to the above demands, according to the present invention, the error amplifier, the PMOS output element and the reference voltage circuit are constituted of the CMOS that enables low threshold voltage with low cost, and the voltage dividing circuit is constituted of the P-resistor with low cost, high resistance and high precision. Thus, the low voltage operation, low power consumption and high precision of an output voltage can be attained.

Further, the extremely large effect of the structure of the present invention on the low cost that is a demand of high priority, that is, a reduction of a chip size or miniaturization is specifically explained.

The VR outputs a current of several tens of mA to several hundred mA. This depends one hundred percent on the driving capacity of the PMOS output element, and there is the case where the substantially half of a chip area is occupied by the PMOS output element depending on a product. Therefore, how the size of the PMOS output element is reduced is the key to the low cost and miniaturization.

On the other hand, it is described above that the demand for the low voltage of an input voltage and the market demand for the outputting of a high current under the small potential difference of input/output are strong. This indicates a high current in a non-saturation operation mode in which a voltage applied to a gate is small and the voltage between a source and a drain is small in the PMOS output element.

The drain current of the MOS transistor in the non-saturation operation is expressed by $$Id = (\mu \cdot Cox \cdot W/L) \times \{(Vgs - Vth) - \frac{1}{2} \cdot Vds\} \times Vds \quad \text{formula (1)}$$

Id: drain current
$\mu$: mobility
Cox: capacitance of a gate insulating film
W: channel width
L: channel length
Vgs: voltage between a gate and a source
Vth: threshold voltage
Vds: voltage between a drain and a source In order to realize a sufficiently large drain even with small Vgs and Vds without increasing the surface area, it is necessary to reduce the channel length and Vth in accordance with the formula (1).

In the CMOS structure in which the P-type monopole is a gate, the lowering of the threshold voltage and the reduction of the channel length can be attained while the leak current at the time of off is suppressed. Thus, it will be understood that the CMOS structure is an extremely effective means for the low cost and miniaturization of the above VR.

The improvement of a temperature characteristic of the reference voltage circuit can be given as an advantage of the P-type monopole gate CMOS structure of the present invention in the VR. Hereinafter, the explanation is made with reference to the drawings.

Figure 4:
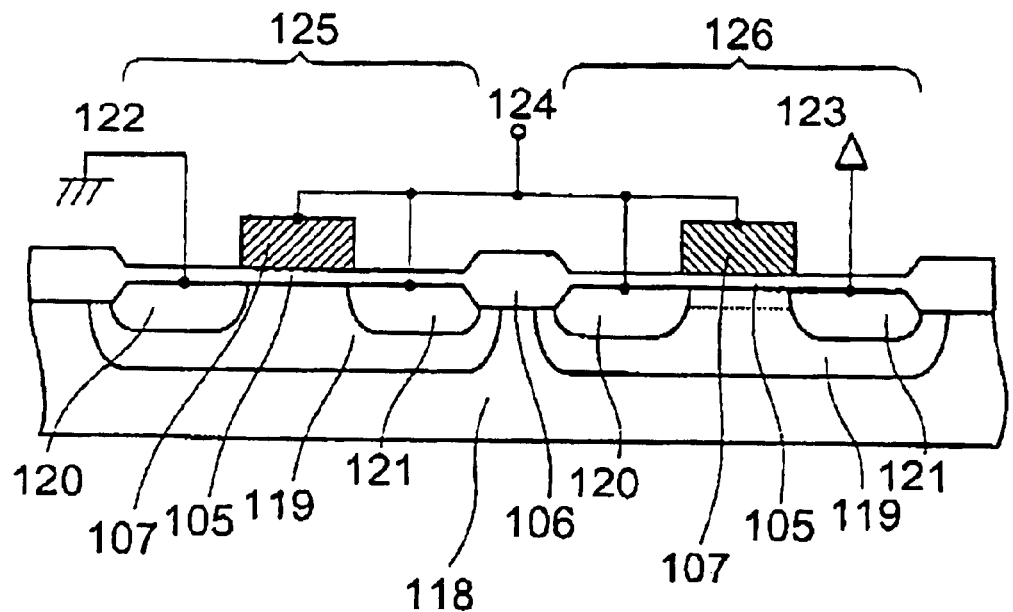
FIG. 4 is a schematic cross sectional view showing a first embodiment of a reference voltage circuit constituted of a semiconductor device of the present invention.
Figure 6:
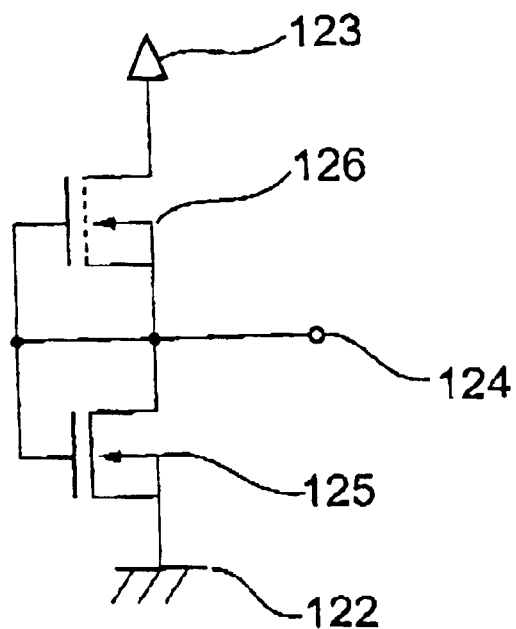
FIG. 6 shows an example of a reference voltage circuit constituted of the semiconductor device.

FIG. 4 is a schematic cross sectional view showing a first embodiment of a reference voltage circuit constituted of the semiconductor device of the present invention. In this embodiment, the reference voltage circuit of FIG. 6 is shown, in which an E-type NMOS and a D-type NMOS are connected in series.

The N-type semiconductor substrate 118 is used, and an E-type NMOS 125 and a D-type NMOS 126 are provided in P-type wells 119, respectively in order to avoid a back bias effect.

P+polycrystalline silicon that is a drain and a gate of the E-type NMOS 125 is short-circuited by a wiring metal though not shown in the figure. Further, a source of the E-type NMOS is connected with a low voltage supply terminal 122 showing a GND line in this embodiment.

P+polycrystalline silicon that is a source and a gate of the D-type NMOS 126 is short-circuited by a wiring metal though not shown in the figure, and further, the drain is connected with a high voltage supply terminal 123 showing the D-type NMOS 126.

In the present invention, P+polycrystalline is used for the E-type NMOS 125 and the D-type NMOS 126. However, when a P-type that is an opposite conductivity type is used as a gate of an NMOS, in the case where a so-called channel doping is not completely conducted by an ion inject on method for setting a threshold voltage of the NMOS to a predetermined value, the threshold voltage is generally 1.0 V or more although depending on the thickness of a gate oxide film and the P-well concentration. The threshold voltage of the E-type NMOS is approximately 0.7 V in many cases, and in order to set this threshold voltage, phosphorous or arsenic as a counter dopant is introduced into a semiconductor by the channel doping method in the NMOS using a P-type gate. As a result, a channel of the MOS transistor is formed in a portion with the lowest concentration, and the E-type NMOS 125 is a buried channel. Further, the threshold voltage of the D-type NMOS is generally and approximately −0.3 V, and in order to set this threshold voltage, phosphorous or arsenic as a counter dopant is introduced by channel doping. Thus, the D-type NMOS 126 is also a buried channel. Accordingly, both the E-type NMOS and the D-type NMOS are the buried channels by adopting the P-type gate.

Thus, since both the E-type NMOS and the D-type NMOS are the buried channels, the degree of changes of the MOSs to the threshold voltage or the temperature of the mutual conductance can be made uniform in comparison with the conventional case where the D-type NMOS is a buried channel while the E-type NMOS is a surface channel with an N-type gate electrode. As a result, the temperature characteristic of the reference voltage circuit can be made flat.

Figure 5:
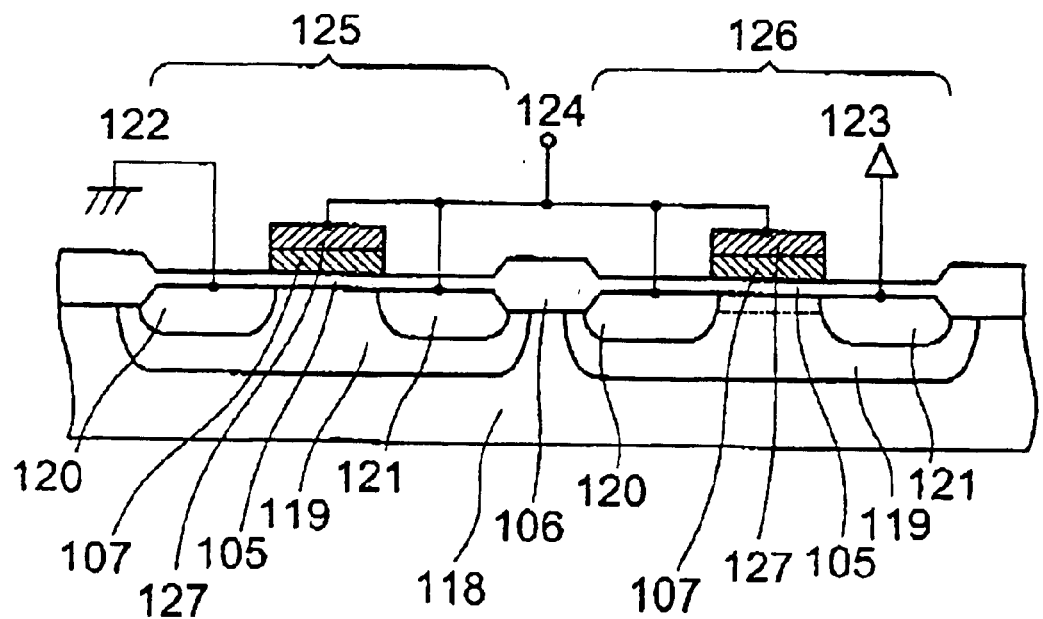
FIG. 5 is a schematic cross sectional view showing a second embodiment of a reference voltage circuit constituted of the semiconductor device of the present invention.

FIG. 5 is a schematic cross sectional view showing a second embodiment of a reference voltage circuit constituted of the semiconductor device of the present invention. A so-called polycide structure that is a lamination structure of a high melting point metal silicide such as tungsten silicide or molybdenum silicide and polycrystalline silicon is adopted for a gate in order to realize low resistance of the gate electrode. The reference voltage circuit with the flat temperature characteristic as in the description with reference to FIG. 4 by using P+polycrystalline silicon for the lower layer of the gate electrode. Further, since the gate electrode has low resistance, an integrated circuit with higher performance in terms of high speed can be realized in the embodiment shown in FIG. 5 in comparison with the embodiment shown in FIG. 4.

Figure 7:
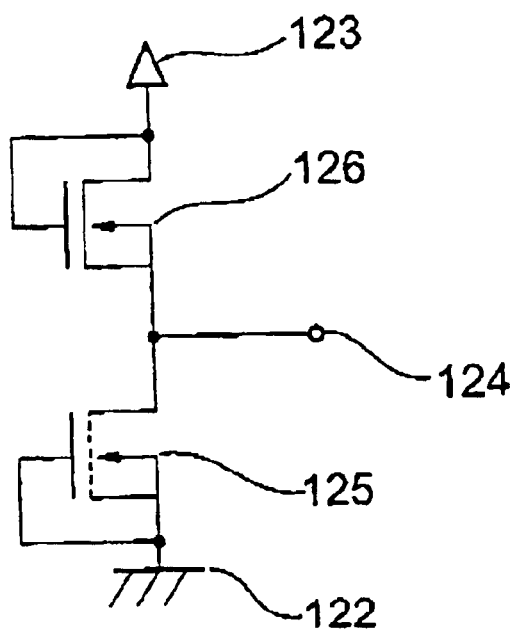
FIG. 7 is an example of a reference voltage circuit constituted of the semiconductor device.
Figure 8:
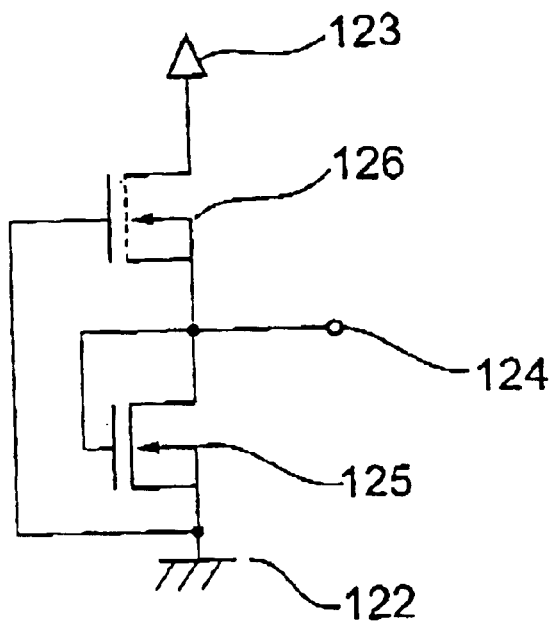
Figure 9:
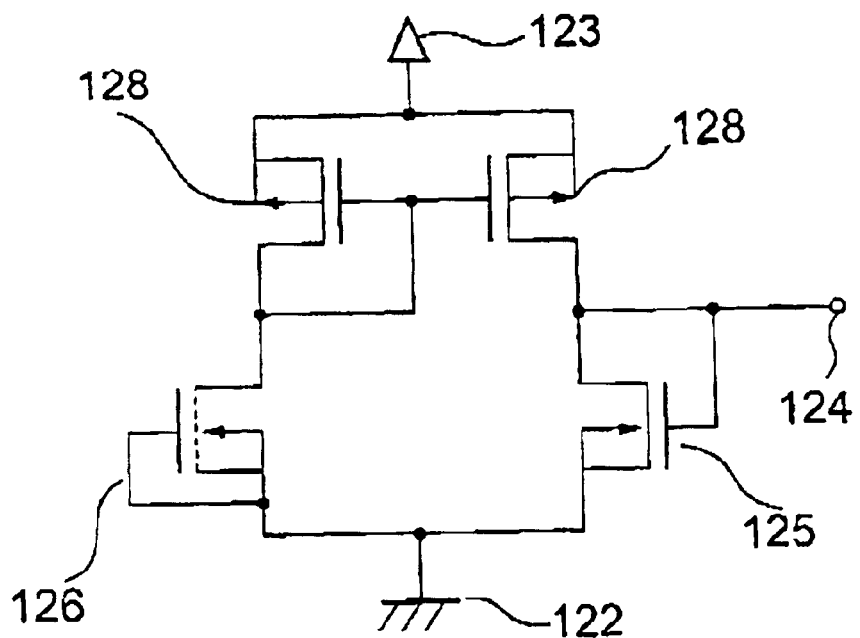
FIG. 9 is an example of a reference voltage circuit constituted of the semiconductor device.

The same effect can be obtained by applying the present invention to the reference voltage circuit in FIG. 6, the reference voltage circuit for outputting a constant voltage to the potential of a high voltage supply terminal in FIG. 7, the reference voltage circuit suitable for the output with a low voltage in FIG. 8, and further, the reference voltage circuit used for the purpose of avoiding the back bias effect in case of using a P-type semiconductor substrate in FIG. 9.

In the circuit example of FIG. 9, an E-type PMOS is used as a load element. A gate electrode of this PMOS is set to P-type as in the gate electrode of the NMOS, whereby the PMOS is a surface channel. Thus, a leak current of the PMOS can be suppressed even if the threshold is set lower in comparison with the case of the buried channel. Therefore, it is possible to provide the reference voltage circuit with low voltage operation and low power consumption. In addition, there is a merit that the manufacture becomes simple and easy, thereby enabling the reduction of cost by using the P+type gate for both the NMOS and the PMOS.

Figure 10:
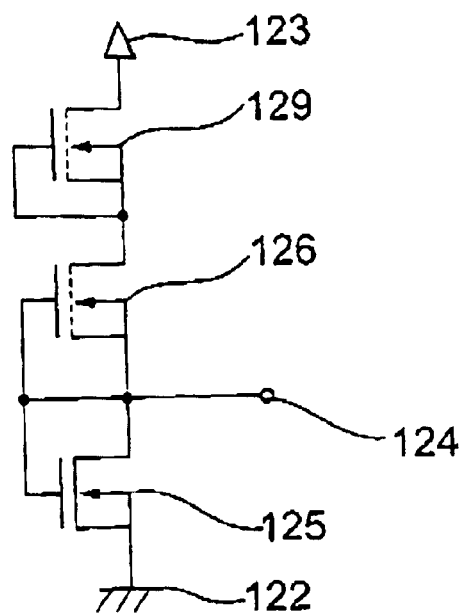
FIG. 10 is an example of a reference voltage circuit constituted of the semiconductor device.
Figure 11:
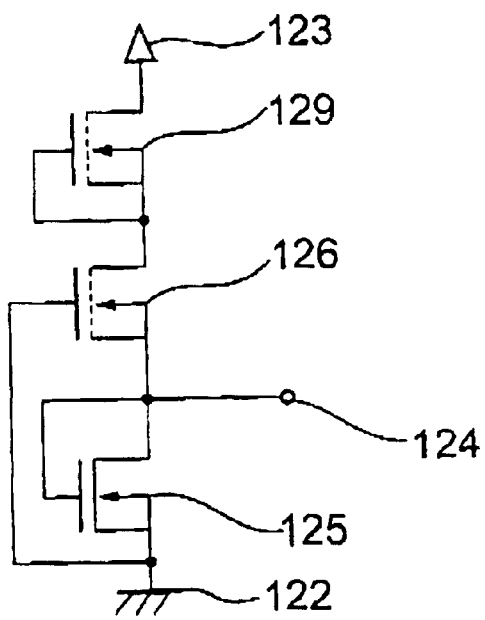
FIG. 11 is an example of a reference voltage circuit constituted of the semiconductor device.

Further, the same effect can be obtained by applying the present invention to the circuit, where the P-type gate electrodes are used for the E-type NMOS and two D-type NMOSs, for stably outputting a reference voltage without influence on the circuit by noise superimposed on a high voltage supply terminal in FIG. 10 or FIG. 11.

As described above, the effect by the F-type monopole gate is described using the S-type NMOS and D-type NMOS. However, with respect to the reference voltage circuit of the present invention, the reference voltage circuit with a satisfactory temperature characteristic as in the NMOS even with the structure of the reference voltage circuit using an E-type PMOS and a D-type PMOS with an N-type gate that is the opposite polarity.

Further, the explanation is made using the structure an a circuit for avoiding the back bias effect with reference to FIG. 4 to FIG. 11. However, needless to say, the reference voltage circuit with a flat temperature characteristic can be realized by using the P-type monopole gate CMOS of the present invention for the reference voltage circuit to which a back bias is applied commonly to the S-type MOS transistor and the D-type MOS transistor.

Moreover, in accordance with the P+monopole gate CMOS structure of the present invention, an E/D type reference voltage circuit of the PMOS which has not been to practical use particularly due to large variation of the D-type threshold voltage with the conventional N+polycrystalline silicon gate structure. Therefore, both the NMOS and the PMOS may be selected in the E/D type reference voltage circuit, and the present invention also has an advantage that the degree of freedom in the circuit design increases.

The effect of the present invention in the VR and the reference voltage circuit that is an element circuit of the VR is described above. Further, the following is mentioned that the great effect is obtained as in the VR by the application of the present invention in an SWR that mounts a high output element and in a VD in which the low voltage operation, low power consumption, low cost, and miniaturization are strongly demanded.

Next, a method of manufacturing the CMOS semiconductor device in accordance with the first embodiment of the present invention is described with reference to the drawings.

Figure 12:
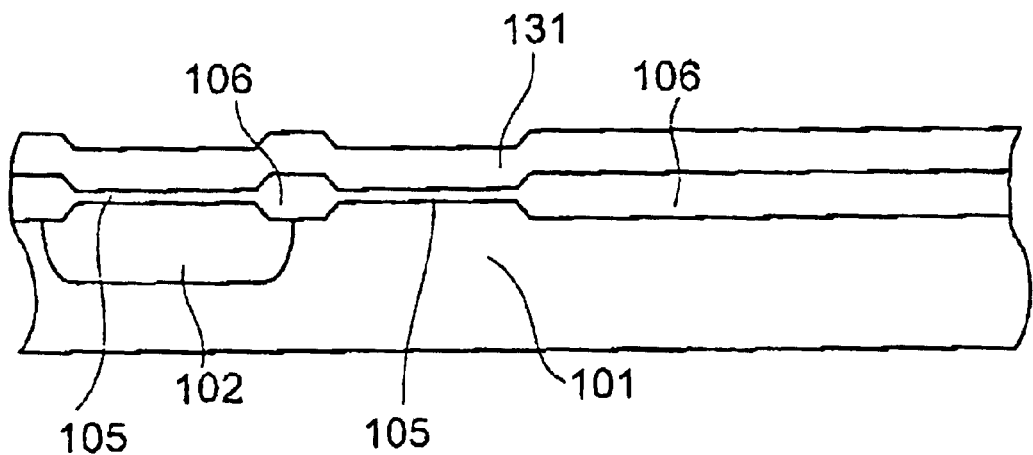
FIG. 12 is a schematic cross sectional view showing a method of manufacturing the CMOS semiconductor device of the first embodiment of the present invention.

In FIG. 12, after the N-well 102 is formed on the P-type semiconductor substrate 101, the field insulating film 106 that is an element isolating region is formed by a so-called LOCOS method, and the impurity is selectively doped into a channel region for threshold control by an ion injection method for each of the NMOS and the PMOS. Thereafter, a gate insulating film 105 is formed by thermal oxidization, for example, in an electric furnace, and then, polycrystalline silicon 131 is deposited thereon.

In this embodiment, a single N-well structure using a P-type semiconductor substrate is shown. In the case where, for example, a Vdd terminal is made to have the same potential as the mounted tab in accordance with the measure for noise or the request from a user, a P-well is formed using an N-type semiconductor substrate. In this case as well, the effect of the CMOS, in which the low voltage operation, low power consumption, and low cost are realized, according to the present invention, can be obtained similarly in the case of a P-type semiconductor substrate N-well method.

Further, in the case where the NMOS and the PMOS are to be formed into the semiconductors having approximately the same concentration while the balance of the parasitic capacitance or the minimum L length of both the MOSs is considered, which may be the case where a twin-well method is used, the effect of the CMOS, in which the low voltage operation, low power consumption, and low cost are realized, according to the present invention, can also be obtained irrespective of the conductivity type of the semiconductor substrate that is a starting material, that is, whether the semiconductor substrate is P-type or N-type.

Further, the LOCOS method is shown for element isolation in FIG. 12. However, the effect of the CMOS, in which the low voltage operation, low cower consumption, and low cost are realized, according to the present invention, can also be obtained by using shallow trench isolation (STI), which is not shown in the figure, for the purpose of the reduction of an isolation region. Whether he LOCOS method or the STI is used generally depends on the maximum operation voltage. In the case where the maximum operation voltage is several V, the STI is favorable from the viewpoint of area. On the other hand, in the case where the maximum operation voltage is more than several V, the LOCOS method is favorable from the viewpoint of simplicity of the process.

The doping of the impurity into the channel region for threshold control is conducted by the ion injection method as described above. Since the conductivity type of the gate electrode is P+polycrystalline silicon, phosphorous or arsenic, which is a donor, is used as dopant for both the E-type NMOS and the D-type NMOS. The surface channel type is very preferable for the low threshold value as described above, and thus, arsenic with a large diffusion coefficient is favorable. The donor is also used for the case of the E-type PMOS, but boron or $BF_2$, which is an acceptor, is used for the D-type PMOS. The surface channel type is very preferable from the viewpoint of threshold characteristic in case of the D-type PMOS, and thus, $BF_2$ that can keep impurity profile after ion injection shallow is generally used. The dose amount is generally in a range of $10^{11}$ atoms/cm$^2$ to $10^{12}$ atoms/cm$^2$ although depending on a desired threshold value.

The polycrystalline silicon is formed on an oxide film by decomposing silane gas with a chemical vapor deposition method (hereinafter referred to as CVD). A thick film is favorable in terms of low resistance of a gate electrode or wiring. However, a thin film is favorable for high resistance since the resistor is also formed of the same layer as described above. In consideration of the throughput in patterning, etching selective ratio with the base gate oxide film, and the like of the polycrystalline silicon, the thickness is generally in a range of 2000 Å to 6000 Å.

Figure 13:
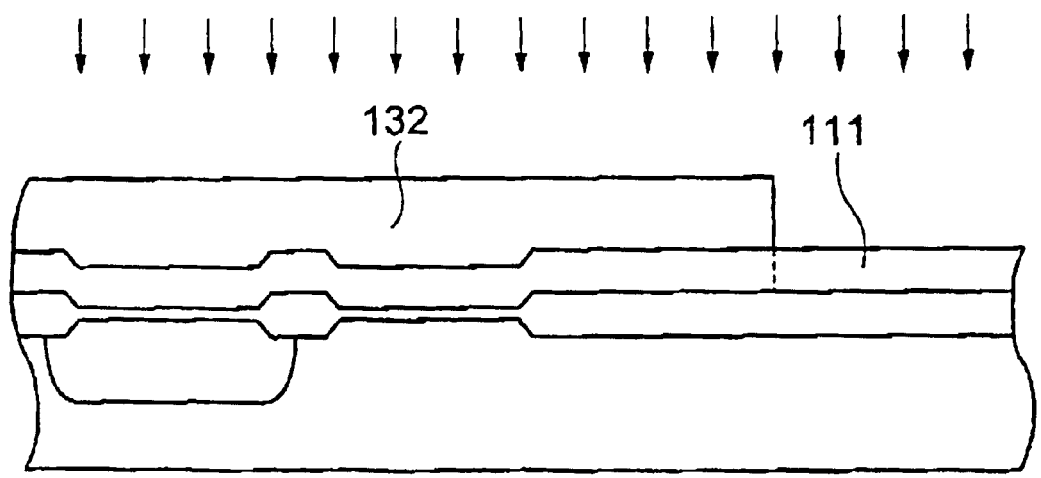
FIG. 13 is a schematic cross sectional view showing the method of manufacturing the CMOS semiconductor device of the first embodiment of the present invention.

Next, as shown in FIG. 13, a photo resist 132 is patterned so as to open the portion to be an N-type resistor by a photolithography method, and phosphorous or arsenic, which is the donor impurity, is selectively introduced into the polycrystalline silicon by the ion injection method.

As described later, there may be the case where ion injection of acceptor dopant with low concentration is conducted to the entire surface of the polycrystalline silicon in the subsequent step. However, in this step, the dose amount is set such that the conductivity type is N-type even after the ion injection. The dose amount is generally in a range of $10^{14}$ atoms/cm$^2$ to $10^{15}$ atoms/cm$^2$, and the net concentration is approximately $1\times10^{14}$ atoms/cm$^3$ to $9\times10^{18}$ atoms/cm$^3$. The sheet resistance value is several kΩ/square to several tens of kΩ/square. It is necessary to set the sheet resistance value to the above value in order to set a consumption current in the voltage dividing circuit due to resistance to at least µA or less.

Further, there may be the case where high resistance of the N-type polycrystalline silicon is unnecessary depending on the circuit or product. In this case, the step shown in FIG. 13 is omitted.

Figure 14:
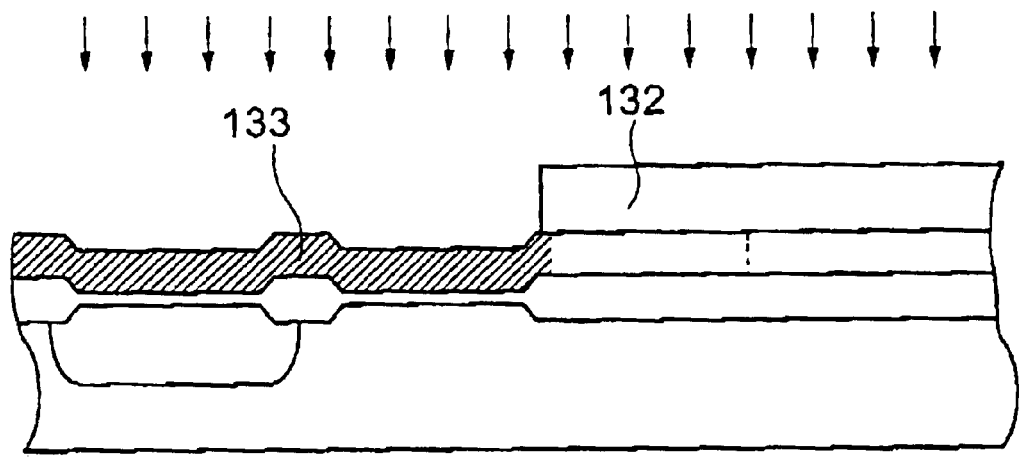
FIG. 14 is a schematic cross sectional view showing the method of manufacturing the CMOS semiconductor device of the first embodiment of the present invention.

Next, the photo resist is peeled. Then, as shown in FIG. 14, the photo resist 132 is patterned so as to open the portions to be a P+gate electrode and wiring by a photolithography method, and BF$_2$ as the acceptor impurity is selectively introduced into the polycrystalline silicon by the ion injection method. Since the gate electrode and wiring preferably have low resistance as much as possible, the ion injection is conducted with the conditions of the concentration of $1\times10^{19}$ atoms/cm$^3$ or more and the dose amount of $1\times10^{15}$ atoms/cm$^3$ or more.

Further, although not shown in the figure, a P+polycrystalline silicon region in FIG. 14 is formed as follows. That is, after the step of FIG. 13 is conducted, the photo resist is peeled and an oxide film is formed on the polycrystalline silicon by a CVD method, and the oxide film is patterned so as to open the portions to be the P+gate electrode and wiring by a photolithography method and wet etching with an HF solution after heat treatment. Then, after the photo resist is peeled, pre-deposition and drive-in are conducted in an electric furnace. Alternatively, after doping of a molecular layer, heat treatment is conducted to remove the oxide film. This case requires the formation of the oxide film and etching process, and thus, is disadvantageous in terms of the number of steps in comparison with the case where the P+polycrystalline silicon region is formed by ion injection with the photo resist as a mask shown in FIG. 14. However, the above case is advantageous in terms of low resistance because it is possible to remarkably make acceptor concentration large in comparison with the ion injection method. In general, the formation of the P+polycrystalline silicon region by the photolithography method and ion injection is adopted in terms of the concentration controllability and simplicity.

Figure 15:
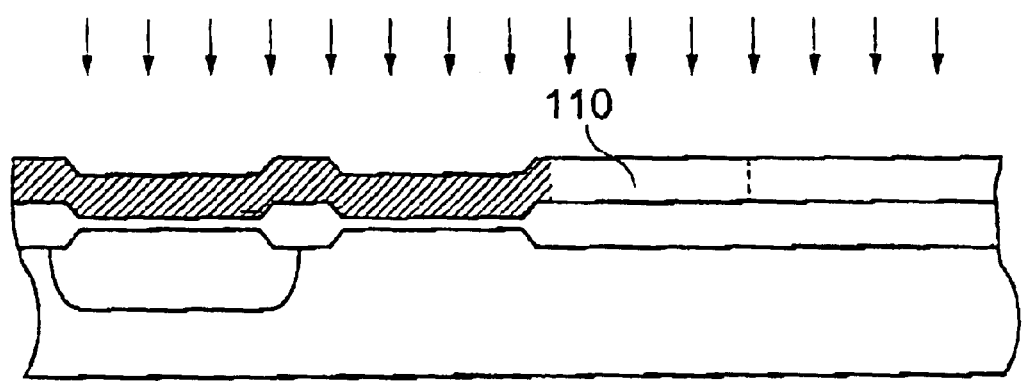
FIG. 15 is a schematic cross sectional view showing the method of manufacturing the CMOS semiconductor device of the first embodiment of the present invention.

Subsequently, after the photo resist 132 is peeled, boron or BF$_2$ as the acceptor impurity is introduced into the polycrystalline silicon by the ion injection method in order to form a P-type resistor region as shown in FIG. 15. The dose amount is generally in a range of $10^{14}$ atoms/cm$^2$ to $10^{15}$ atoms/cm$^2$, and the net concentration is approximately $1\times10^{14}$ atoms/cm$^3$ to $9\times10^{18}$ atoms/cm$^3$. The sheet resistance value is several kΩ/square to several tens of kΩ/square. The sheet resistance value is set to the above value in order to set a consumption current in the voltage dividing circuit due to resistance to at least µA or less as in case of the N-type resistor.

Further, also as in case of the N-type resistor, there may be the case where high resistance of the P-type polycrystalline silicon is unnecessary depending on the circuit or product. In this case, the step shown in FIG. 15 is omitted.

The N-type resistor region, the P-type resistor region and the P−region are formed in the polycrystalline silicon through the steps shown in FIG. 13 to FIG. 15. However, this step order is not necessary adopted. The above three regions are formed by conducting the steps in FIG. 13 to FIG. 15 with an arbitrary order.

Figure 16:
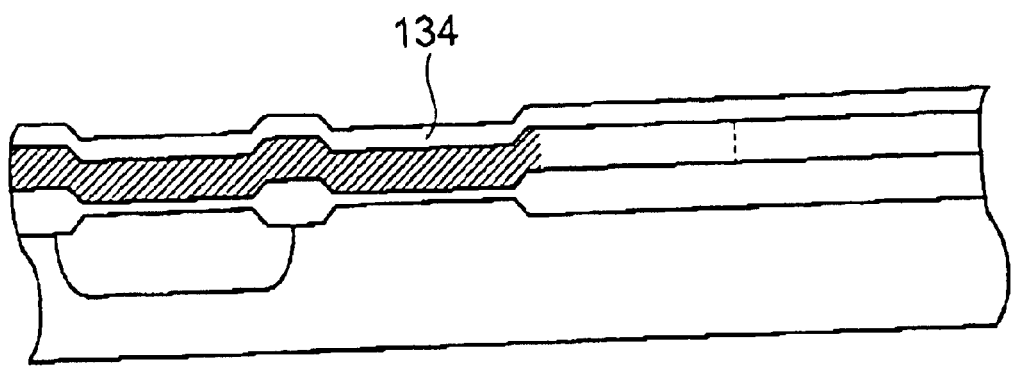
FIG. 16 is a schematic cross sectional view showing the method of manufacturing the CMOS semiconductor device of the first embodiment of the present invention.

Next, as shown in FIG. 16, a first insulating film 134 is formed on the polycrystalline silicon by a CVD method, and heat treatment is conducted in an electric furnace with an atmosphere of inert gas such as nitrogen or argon depending on the situation.

The first insulating film is provided as a mask for preventing donor dopant from entering the P−gate electrode in the later formation of a source and a drain of the NMOS in a self-aligning manner. Acceleration energy of ion injection in the formation of the source and the drain of the NMOS is lower than 100 Kev in order that the first insulating film functions as the mask. Thus, the thickness of 1000 Å to 2000 Å sufficiently enables the prevention even in consideration for the maximum range of ion. An oxide film or a nitride film is used as the material for the first insulating film. As described later, it is necessary to peel the first insulating film on the resistor in the subsequent step, and the oxide film that enables wet etching with the HF solution is used in many cases in terms of simplicity of the process or damage given to the resistor.

Figure 17:
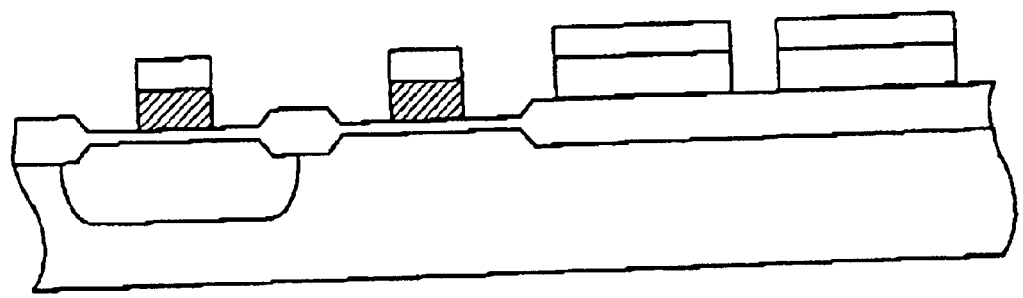
FIG. 17 is a schematic cross sectional view showing the method of manufacturing the CMOS semiconductor device of the first embodiment of the present invention.

Next, as shown in FIG. 17, the first insulating film and the polycrystalline silicon are patterned by a photolithography method and etching to form a gate electrode, wiring, and resistor.

The formation is carried out by two methods. One method is such that after the photo resist is patterned by the photolithography method, the first insulating film is etched using the photo resist as a mask, then, the polycrystalline silicon is etched while the photo resist is left, and thereafter, the photo resist is removed. The other method is such that after the photo resist is patterned by the photolithography method, the first insulating film etched using the photo resist as a mask, then, the photo resist is peeled, and thereafter, the polycrystalline silicon is etched using the first insulating film as a mask.

Anisotropic dry etching is adopted for the processing of the gate electrode or resistor because precision is required. Anisotropic etching is attained by the effect of a side wall defensive film of the product with the photo resist in etching, and thus, in general, the polycrystalline silicon is dry-etched while the photo resist is left.

In the case where the first insulating film is an oxide film, the processing can be conducted by either wet etching or dry etching. However, dry etching is more favorable in terms of precision. Further, in the case where the first insulating film is a nitride film, patterning with the photo resist as the mask does not have an appropriate etchant, and thus, etching is limited to dry etching, However, in case of the nitride film, since the etch rate by dry etching is approximately the same as that of the polycrystalline silicon, there is an advantage that etching can be continuously conducted in the same etcher.

Figure 18:
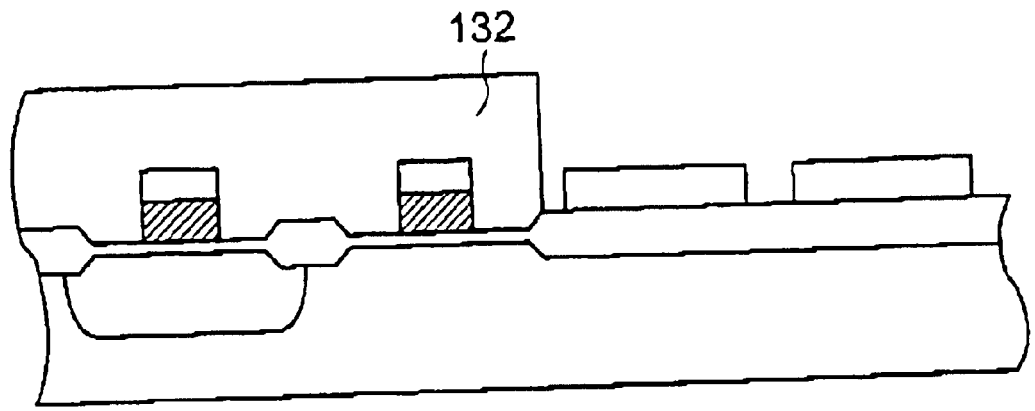
FIG. 18 is a schematic cross sectional view showing the method of manufacturing the CMOS semiconductor device of the first embodiment of the present invention.

Subsequently, as shown in FIG. 18, the photo resist 132 is patterned so as to cover the gate electrode or wiring region other than the resistor by the photolithography method, and the first insulating film on the resistor is removed by etching.

In this case, wet etching in which etching progresses solely with chemical reaction is preferable since it is desirable that the damage due to etching is not given to the resistor. Therefore, the oxide film that enables wet etching with the HF solution is appropriate as the material for the first insulating film 134 as described above. The nitride film is disadvantageous in this point since the nitride film does not have an appropriate etchant in which the resist can be adopted as a mask material. However, since the field insulating film is an oxide film in many cases in the case where the first insulating film is an oxide film, it is necessary to pay attention to the reduction of thickness of the field insulating film in this step.

Figure 19:
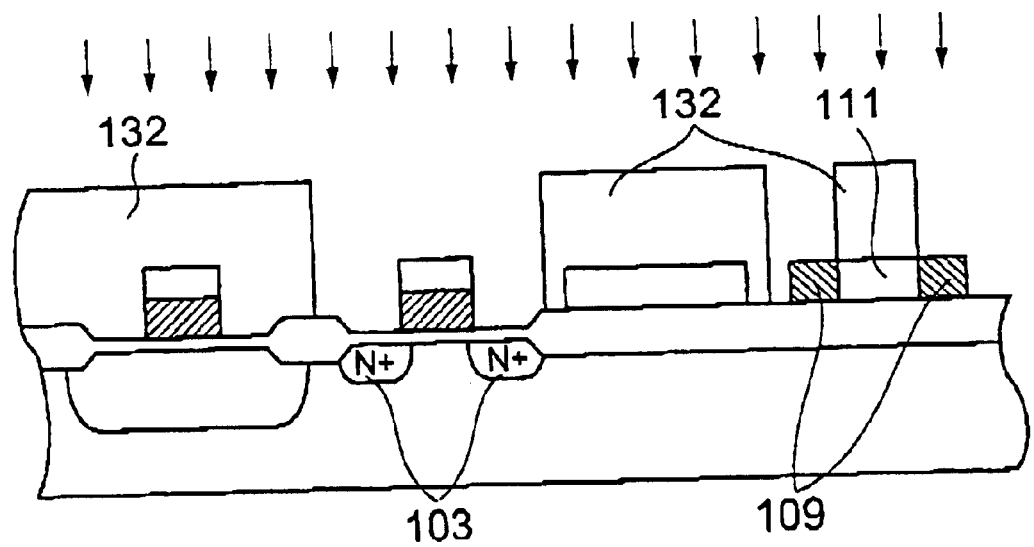
FIG. 19 is a schematic cross sectional view showing the method of manufacturing the CMOS semiconductor device of the first embodiment of the present invention.

Next, after the photo resist is peeled, as shown in FIG. 19, the photo resist 132 is patterned so as to open the portions of the NMOS and the N-type resistor, which are to be contacts with the wiring metal, by the photolithography method. Then, the donor such as phosphorous or arsenic is introduced into the P-type substrate and the N-type resistor at high concentration by the ion injection method, and the N+regions 103, which correspond to the source and the drain of the NMOS, and the N+polycrystalline silicon region 109 are formed.

Arsenic having a small diffusion coefficient with which a shallow source and a shallow drain are obtained is generally used as impurities. The dose amount is $1 \times 10^{15}$ atoms/cm$^2$ or more in order to attain low resistance as much as possible, and the concentration is $1 \times 10^{19}$ atoms/cm$^3$ or more in this case.

Further, since the first insulating film is provided on the gate electrode of the NMOS in this case, the donor does not enter the P+gate electrode of the NMOS. Thus, the working function and the resistance value do not change.

Figure 20:
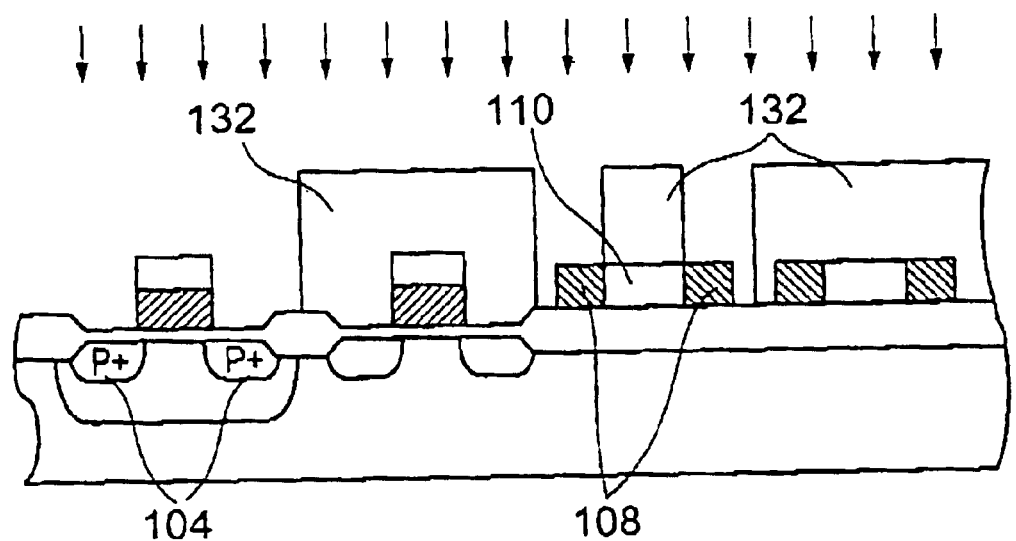
FIG. 20 is a schematic cross sectional view showing the method of manufacturing the CMOS semiconductor device of the first embodiment of the present invention.

Then, after the photo resist is peeled, heat treatment for activation of the impurities is conducted if necessary. Thereafter, as shown in FIG. 20, the photo resist 132 is patterned so as to open the portions of the PMOS and the P-type resistor, which are to be contacts with the wiring metal, by the photolithography method. Then, the acceptor such as BF$_2$ or boron is introduced into the N-well and the P-type resistor at high concentration, and a P+region 104, which corresponds to a source and a drain of the PMOS, and a P+polycrystalline silicon region 108 are formed. Since the resistance is as low as much as possible as in the NMOS, the dose amount is $1 \times 10^{15}$ atoms/cm$^2$ or more, and the concentration in this case is $1 \times 10^{19}$ atoms/cm$^3$ or more.

Figure 21:
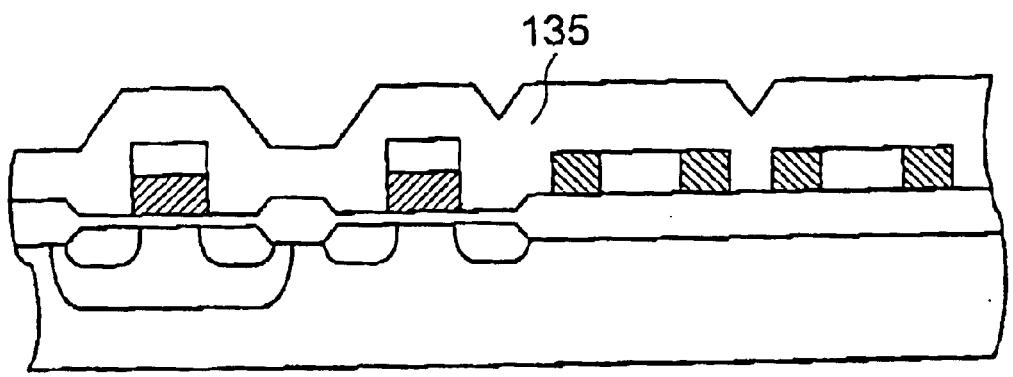
FIG. 21 is a schematic cross sectional view showing the method of manufacturing the CMOS semiconductor device of the first embodiment of the present invention.

Next, after the photo resist is peeled, as shown in FIG. 21, a middle insulating film 135 is deposited by a CVD method, and heat treatment is conducted to level the middle insulating film.

The middle insulating film has a two-layer structure in which the lower layer is a nondoped silicate glass (NSG) film or a nitride film and the upper layer is a phosphorous silicate glass (PSG) film or a boron phosphorous silicate glass (BPSG) film. The PSG and the BPSG are used for making glass flow leveling by the heat treatment effective. In addition, the NSG or the nitride film as the lower layer is provided for preventing the impurities from diffusing into the polycrystalline silicon resistor during the heat treatment and avoiding influence on the resistance value. The lower layer with a thickness of 1000 Å or more has a sufficient capacity of preventing diffusion.

The thermal budget from the completion of the introduction of the acceptor impurity at high concentration into the polycrystalline silicon through the heat treatment for leveling shown in FIG. 21 is limited such that boron as the acceptor impurity is not diffused into the channel region from the P+gate electrode. The heat treatment is performed at 800° C. to 900° C. for several tens of minutes in an electric furnace although depending on the thickness of the gate insulating film, and is performed at 1000° C. to 1100° C. for several tens of seconds in case of rapid thermal annealing (RTA).

In the subsequent steps, contact holes are formed and a wiring metal is formed as in the CMOS process.

As described above, through the steps of FIG. 12 to FIG. 21, the structure of the CMOS semiconductor device of the first embodiment of the present invention in FIG. 1 can be obtained.

Further, a CMOS semiconductor device of a second embodiment of the present invention in FIG. 2 is obtained as follows. That is, through the steps of FIG. 12 to FIG. 21, in the step of introducing the impurity to the source and the drain in FIG. 19 and FIG. 20, the impurity having the same concentration as the source and drain of the NMOS are introduced into the entire resistor region in case of the N+resistor while the impurity having the same concentration as the source and drain of the PMOS are introduced into the entire resistor region in case of the P+resistor. The addition of any step does not needed.

Figure 22:
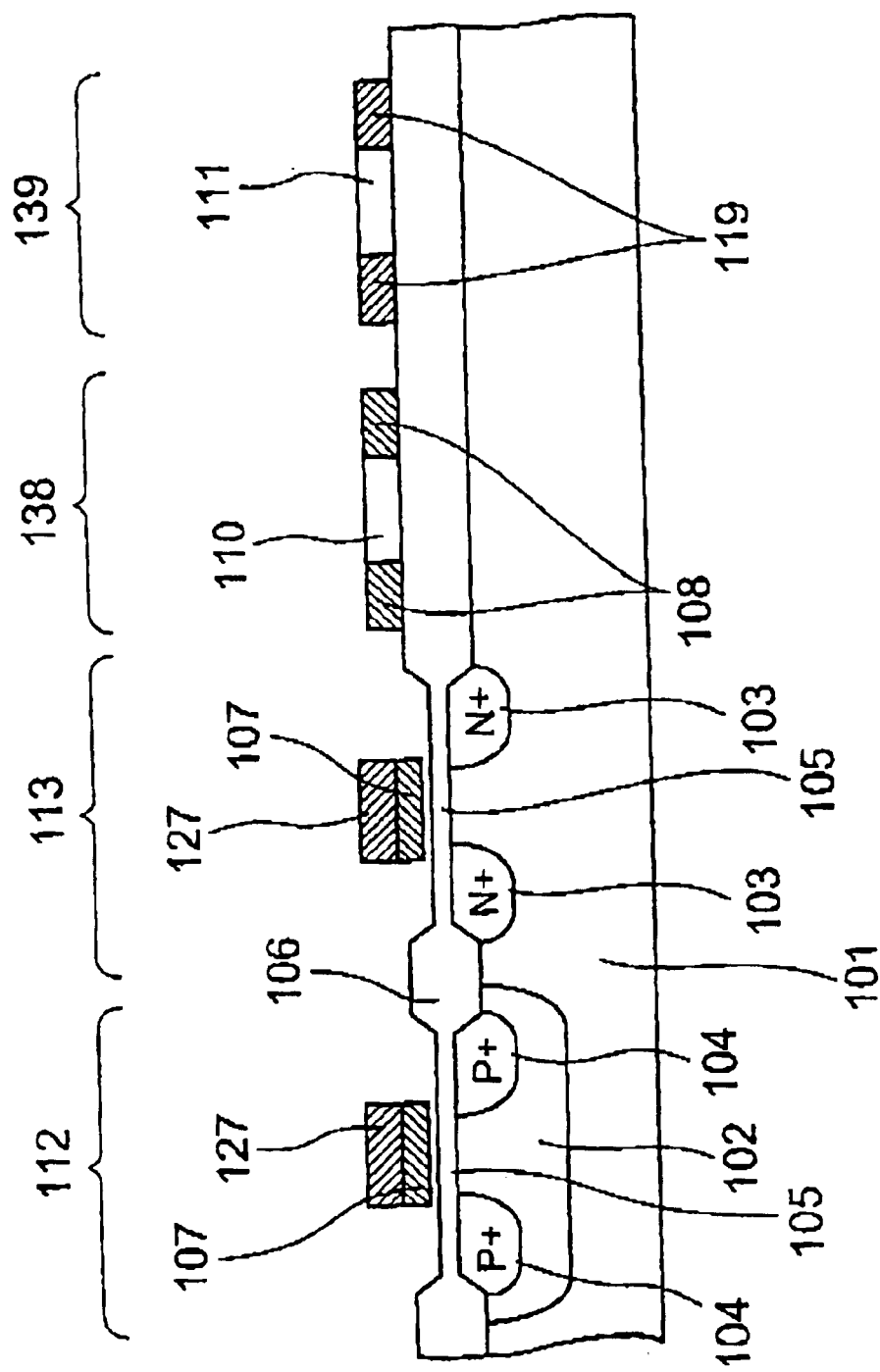
FIG. 22 is a schematic cross sectional view showing a CMOS semiconductor device in accordance with a third embodiment of the present invention.

FIG. 22 is a schematic cross sectional view showing a CMOS semiconductor device of a third embodiment of the present invention.

The different points from the CMOS semiconductor devices according to the present invention in FIG. 1 and FIG. 2 are that a gate electrode has a so-called polycide structure that is a lamination layer of a high melting point metal silicide 127 and the P+polycrystalline silicon 107 and that the resistors formed on the field insulating film 106 are a thin film P–resistor 138 and a thin film N–resistor 139 which are made of polycrystalline silicon thinner than the polycrystalline silicon used for the lower layer of the gate electrode.

In order to attain low resistance of the gate electrode and wiring as much as possible from the viewpoint of high speed, the polycide structure is such that the high melting point metal silicide 127 is provided on the P+polycrystalline silicon 107 containing the acceptor impurity such as boron or BF$_2$ at a concentration of $1 \times 10^{19}$ atoms/cm$^3$ or more. The sheet resistance value can be made low to several Ω/square to ten Ω/square in comparison with several tens of Ω/square in case of a single layer of the polycrystalline silicon.

The resistors 138 and 139 are formed of the polycrystalline silicon that is thinned so as to sufficiently keep the absolute value and the resistance specific precision even though the sheet resistance value is set high.

The CMOS semiconductor device of the third embodiment has the same structure as the P+gate electrode CMOS semiconductor devices in FIG. 1 and FIG. 2, which are the basis of the present invention except for the gate electrode structure and the thin film resistors. Thus, the effect on low voltage operation and low power consumption is the same.

Next, a method of manufacturing the CMOS semiconductor device of the third embodiment of the present invention is described with reference to the drawings.

Figure 23:
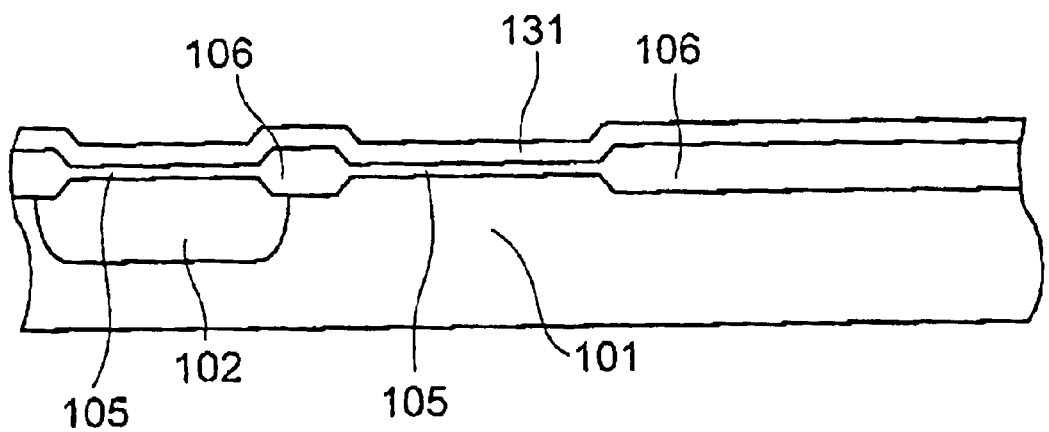
FIG. 23 is a schematic cross sectional view showing a first embodiment of a method of manufacturing the CMOS semiconductor device of the third embodiment of the present invention.

In FIG. 23, the following state is shown. After the N-well 102 is formed in the P-type semiconductor substrate 101 as in the step shown in FIG. 12, the field insulating film 106 that is the element isolating region is formed, and doping of the impurity into the channel region for threshold control is selectively conducted or each of the NMOS and the PMOS by the ion injection method. Thereafter, a gate insulating film is formed, and the first polycrystalline silicon 131 is deposited.

The polycrystalline silicon 131 is the lower layer of the polycide gate electrode, and thus, requires to be thinned in comparison with the case where the gate electrode is formed of the polycrystalline silicon single layer.

The polycrystalline silicon 131 is required to have a thickness to a certain extent because there may be the case where the semiconductor substrate or the gate insulating film is damaged at the time of deposition of the high melting point metal silicide to be formed on the polycrystalline silicon as described later if the polycrystalline silicon 131 is thin. In consideration of the throughput in patterning, etching selective ratio with the base gate oxide film, and the like of the polycide, the thickness is generally in a range of 1000 Å to 4000 Å.

Figure 24:
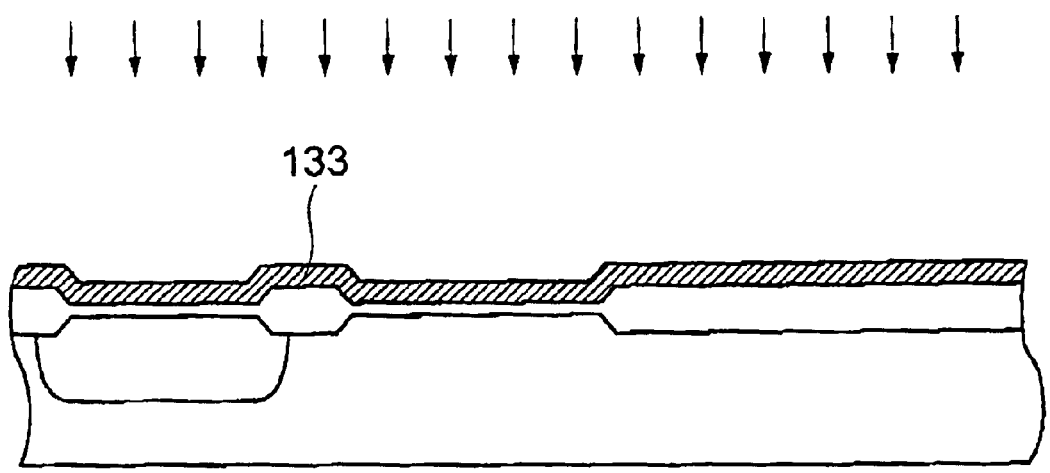
FIG. 24 is a schematic cross sectional view showing the first embodiment of the method of manufacturing the CMOS semiconductor device of the third embodiment of the present invention.

Next, as shown in FIG. 24, $BF_2$ as the acceptor impurity is introduced into the first polycrystalline silicon 131 by the ion injection method to make P+polycrystalline silicon 133.

Ion injection to the gate electrode is conducted with the conditions of the concentration of $1\times10^{19}$ atoms/cm$^3$ or more and the dose amount of $1\times10^{15}$ atoms/cm$^2$ or more in order to prevent depletion to the gate electrode side.

The introduction of the acceptor impurity into the first polycrystalline silicon 131 may be performed by a method of conducting pre-deposition and drive-in in an electric furnace or a step of conducting heat treatment after doping of a molecular layer.

These methods are advantageous in terms of depletion since the acceptor concentration can be remarkably made high in comparison with the ion injection method. However, in these methods, the concentration controllability is low, and there may be the case where boron as the acceptor impurity diffuses into the channel through the gate insulating film from the gate electrode to cause fluctuation of the threshold voltage due to the heat treatment in the subsequent step. Thus, the formation with the ion infection is safe.

Further, the same structure as that described through FIG. 24 is obtained by a Doped-CVD method in which the introduction of the acceptor impurity is conducted simultaneously with the formation of the first polycrystalline silicon 131 described in FIG. 23 for the simplified step. In this case, the impurity concentration is set to $1\times10^{19}$ atoms/cm$^3$ or more for low resistance.

Figure 25:
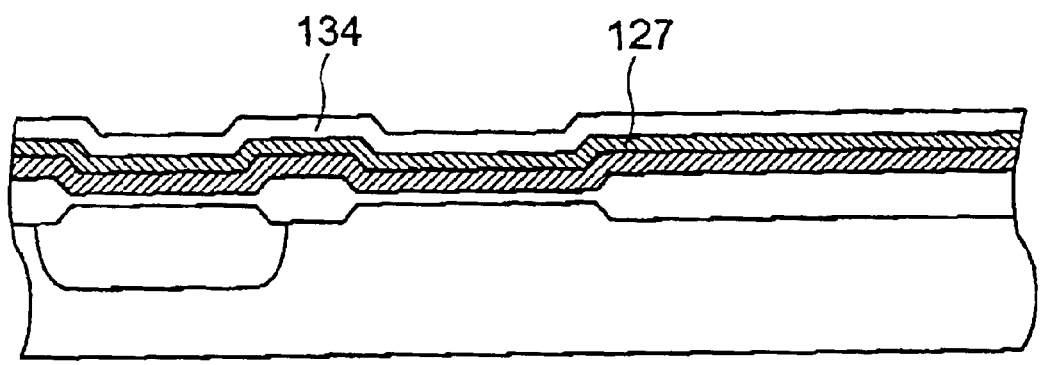
FIG. 25 is a schematic cross sectional view showing the first embodiment of the method of manufacturing the CMOS semiconductor device of the third embodiment of the present invention.

Subsequently, as shown in FIG. 25, the high melting point metal silicide 127 is deposited on the P+polycrystalline silicon 133 by a sputtering method or a CVD method. Further, the insulating film 134 is deposited on the high melting point metal silicide by the CVD method.

One of molybdenum silicide, tungsten silicide, titanium silicide and platinum silicide is used as the high melting point metal silicide, and the thickness of the high melting point metal silicide is 500 Å to 2500 Å. A sputtering method is generally used for the formation from the viewpoint of adhering property of the high melting point metal silicide and the polycrystalline silicon although there is a fear for damage. The high melting point metal silicide enables the remarkable reduction of the sheet resistance value of the gate electrode and wiring to several Ω/square to 10 Ω/square in comparison with several tens of Ω/square of the gate electrode and wiring made of the polycrystalline silicon single layer. Thus, the function of the semiconductor product is improved.

The insulating film 134 is provided for the same reason as described in FIG. 16 as a mask for preventing donor dopant from entering the gate electrode. An oxide film or a nitride film is used as its material and the thickness is 1000 Å to 2000 Å. Heat treatment at approximately 900° C. for about 30 minutes is conducted after the deposition of the insulating film 134 if necessary.

Figure 26:
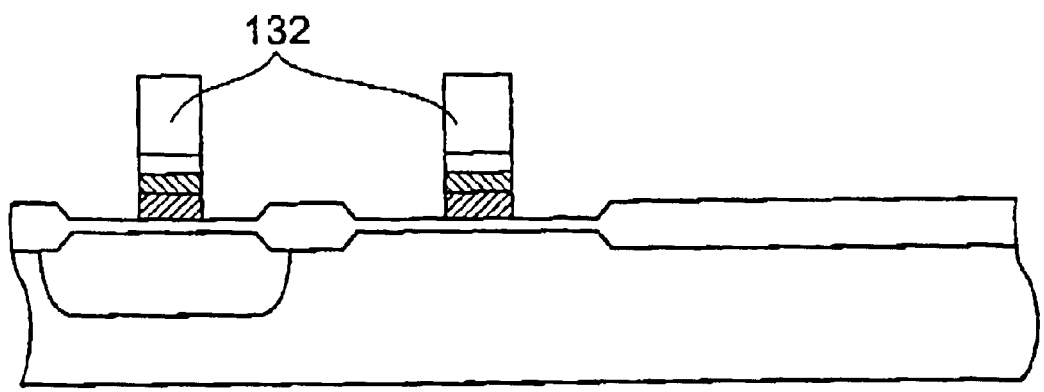
FIG. 26 is a schematic cross sectional view showing the first embodiment of the method of manufacturing the CMOS semiconductor device of the third embodiment of the present invention.

Next, as shown in FIG. 26, the insulating film 134, the high melting point metal silicide 127 and the P+polycrystalline silicon 133 are patterned by the photolithography method and etching to form gate electrodes and wiring.

The formation is carried out by two methods. That is, one method is such that after the photo resist is patterned by the photolithography method, the insulating film 134 is etched using the photo resist as a mask, the high melting point metal silicide 127 and the P+polycrystalline silicon 133 are etched while the photo resist is left, and thereafter, the photo resist is removed. The other method is such that after the photo resist is patterned by the photolithography method, the insulating film 134 is etched using the photo resist as a mask, the photo resist is peeled, and thereafter, the high melting point metal silicide 127 and the polycrystalline silicon 133 are etched using the insulating film 134 as a mask.

Anisotropic dry etching is adopted or the processing of the gate electrode or resistor because precision is required. Anisotropic etching is attained by the effect of a side wall defensive film of the product with the photo resist in etching, and thus, in general, the high melting point metal silicide and the polycrystalline silicon are dry-etched while the photo resist is left.

The completion of etching of the upper layer is detected by an end point detection mechanism in etching of a multi-layer film made of a plurality of materials, and the etching of the multi-layer film is carried out by charging gas corresponding to the material or an etcher itself as occasion demands.

Figure 27:
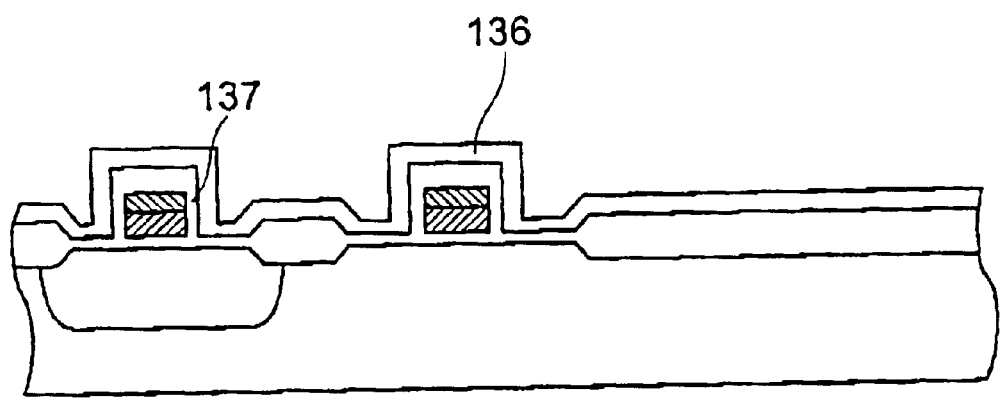
FIG. 27 is a schematic cross sectional view showing the first embodiment of the method of manufacturing the CMOS semiconductor device of the third embodiment of the present invention.

Next, as shown in FIG. 27, after an insulating film 137 is formed, thin film polycrystalline silicon 136 is deposited.

The insulating film is, for example, an oxide film with a thickness of several hundred Å by a thermal oxidization method or an oxide film with a thickness of several hundred Å by a CVD method.

The thin film polycrystalline silicon 136 is deposited by the CVD method similarly in case of the polycrystalline silicon used for the gate electrode and wiring. However, there may be the case where the thin film polycrystalline silicon 136 is deposited at the lowered deposition temperature since it has a thickness of 500 Å to 2000 Å and is thinner than the polycrystalline silicon used for the gate electrode and wiring. In addition, the film deposition in this step may be performed by a sputtering method.

The resistor is formed by using the polycrystalline silicon thinner than the polycrystalline silicon used for the gate electrode and wiring. Thus, the precision of the resistance value can be sufficiently kept even though the sheet resistance value of the resistor is set high to several kΩ/square to several tens of Ω/square.

Figure 28:
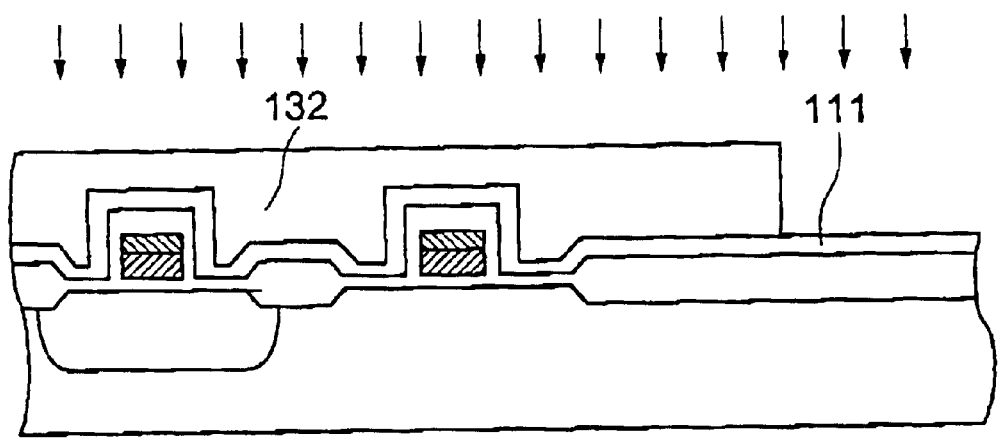
FIG. 28 is a schematic cross sectional view showing the first embodiment of the method of manufacturing the CMOS semiconductor device of the third embodiment of the present invention.

Next, as shown in FIG. 28, the photo resist 132 is patterned so as to open the portion to be an N-type resistor by the photolithography method, and phosphorous or arsenic as a donor impurity is selectively introduced into the thin film polycrystalline silicon 136 by the ion injection method.

There may be the case where the ion injection of the acceptor dopant at low concentration is conducted into the entire surface of the thin film polycrystalline silicon in the later step as described later. However, the dose amount is set such that the conductivity type is N-type and the concentration is in a certain range even after the ion injection. The dose amount is generally in a range of $10^{14}$ atoms/cm$^2$ to $10^{15}$ atoms/cm$^2$, and the net concentration is approximately $1\times10^{14}$ atoms/cm$^3$ to $9\times10^{19}$ atoms/cm$^3$. The sheet resistance value is several kΩ/square to several tens of kΩ/square. It is necessary to set the sheet resistance value to the above value in order to set a consumption current in the voltage dividing circuit due to resistance to at least μA or less.

Further, there may be the case where high resistance of the N-type polycrystalline silicon is unnecessary depending on the circuit or product. In this case, the step shown in FIG. 28 is omitted.

Figure 29:
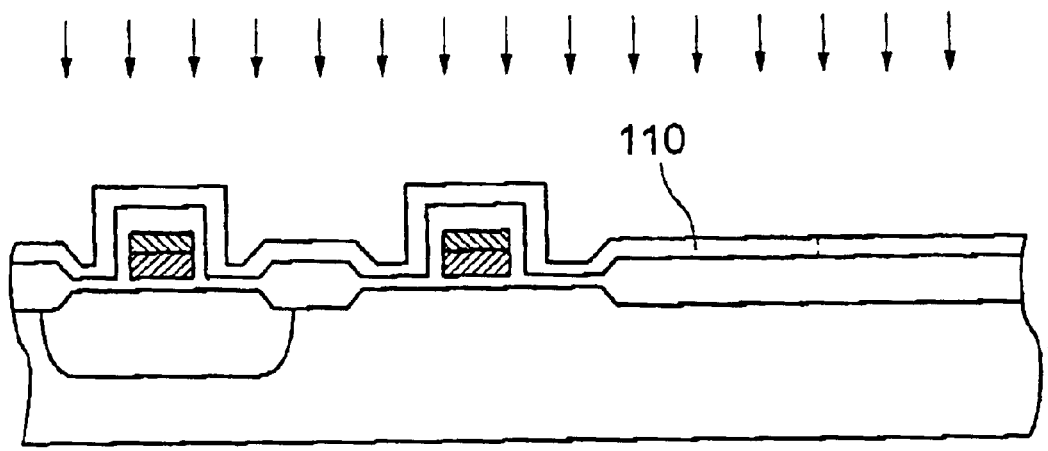
FIG. 29 is a schematic cross sectional view showing the first embodiment of the method of manufacturing the CMOS semiconductor device of the third embodiment of the present invention.

Next, after the photo resist 132 is peeled, as shown in FIG. 29, boron or $BF_2$ as the acceptor impurity is introduced into the thin film polycrystalline silicon 136 by the ion injection method to form a P-type resistor region.

The dose amount is generally in a range of $10^{14}$ atoms/$cm^2$ to $10^{15}$ atoms/$cm^2$, and the net concentration is approximately $1×10^{14}$ atoms/$cm^3$ to $9×10^{18}$ atoms/$cm^3$. The sheet resistance value is several kΩ/square to several tens of kΩ/square. The sheet resistance value is set to the above value in order to set a consumption current in the voltage dividing circuit due to resistance to at least $\mu A$ or less as in the N-type resistor.

Further, there may be the case where high resistance or the P-type polycrystalline silicon is unnecessary depending on the circuit or product. In this case, the step shown in FIG. 29 is omitted.

The N-type resistor region and the P-type resistor region are formed in the thin film polycrystalline silicon through the steps shown in FIG. 28 and FIG. 29. However, this step order is not necessary adopted. The N-type resistor region and the P-type resistor region are similarly formed by exchanging the steps in FIG. 28 and FIG. 29.

Figure 30:
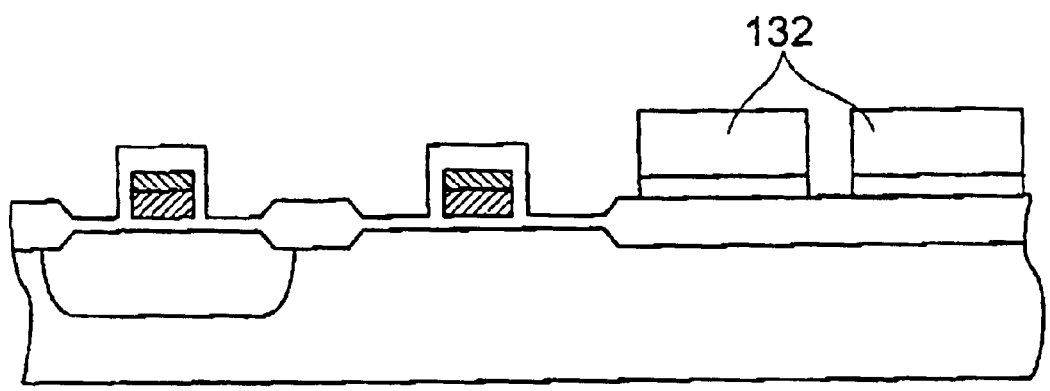
FIG. 30 is a schematic cross sectional view showing the first embodiment of the method of manufacturing the CMOS semiconductor device of the third embodiment of the present invention.

Next, as shown in FIG. 30, second polycrystalline silicon is patterned by the photolithography method and etching to form a resistor.

The processing of the resistor, requires precision, and thus, is conducted by an anisotropic dry etching method.

Figure 31:
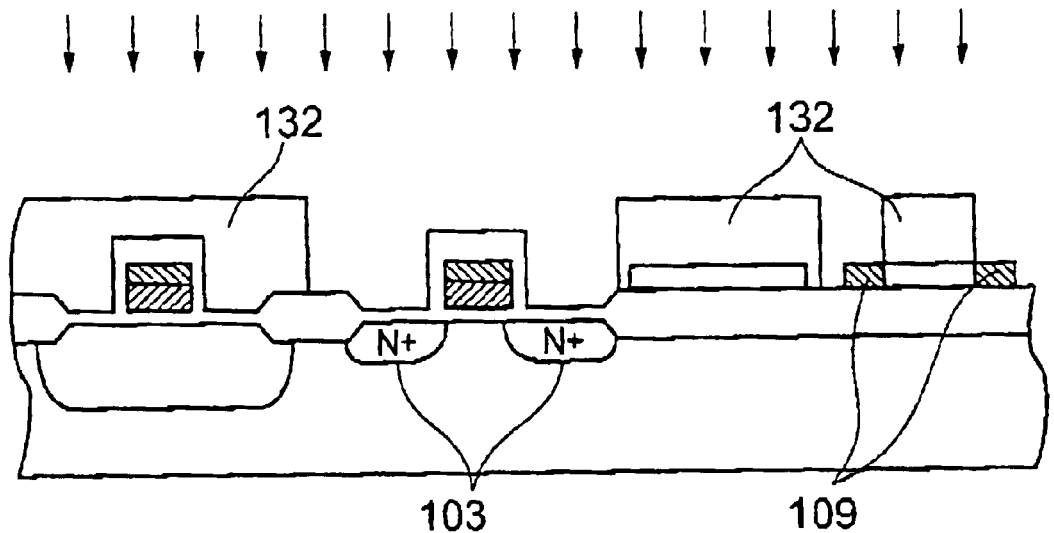
FIG. 31 is a schematic cross sectional view showing the first embodiment of the method of manufacturing the CMOS semiconductor device of the third embodiment of the present invention.

Then, after the photo resist 132 is peeled, as shown in FIG. 31, the photo resist 132 is patterned so as to open the portions of the NMOS and the N-type resistor, which are to be contacted with the wiring metal, by the photolithography method. Then, the donor such as phosphorous or arsenic is introduced into the P-type substrate and the N-type resistor at high concentration by the ion injection method, and N−regions 103, which correspond to a source and a drain of the NMOS, and an N−polycrystalline silicon region 109 are formed.

Arsenic having a small diffusion coefficient with which a shallow source and a shallows drain are obtained is generally used as the impurity. The dose amount is $1×10^{15}$ atoms/$cm^3$ or more in order to attain low resistance as much as possible, and the concentration is $1×10^{14}$ atoms/$cm^3$ or more in this case.

Further, in this case, since the insulating film 134 and the insulating film 137 are formed on the gate electrode of the NMOS, the donor does not enter the gate electrode of the NMOS. Thus, the working function and the resistance value do not change.

Moreover, although not shown in the figure, the N+resistor formed of thin film polycrystalline silicon, in which the entire N-type resistor region is at high concentration, can be formed for the purpose of improvement of a temperature coefficient.

Figure 32:
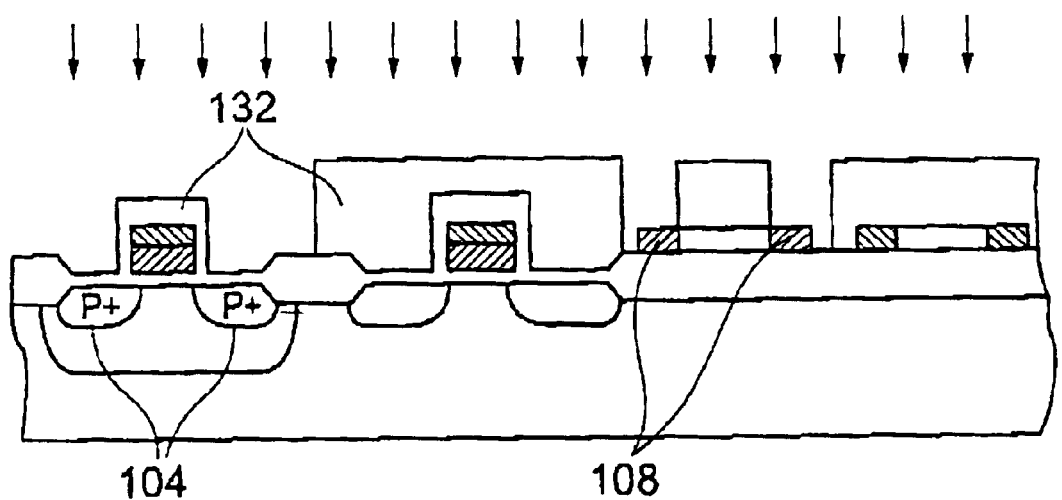
FIG. 32 is a schematic cross sectional view showing the first embodiment of the method of manufacturing the CMOS semiconductor device of the third embodiment of the present invention.

Then, after the photo resist is peeled, heat treatment for activation of the impurities is conducted if necessary. Thereafter, as shown in FIG. 32, the photo resist 132 is patterned so as to open the portions of the PMOS and the P-type resistor, which are to be contacted with the wiring metal, by the photolithography method. Then, the acceptor such as $BF_2$ or boron is introduced into the N-well and the P-type resistor at high concentration by the ion injection method, and the P−region 104, which corresponds to the source and the drain of the PMOS, and the P−polycrystalline silicon region 108 are formed. Since the resistance is made low as much as possible as in the NMOS, the dose amount is $1×10^{15}$ atoms/$cm^2$ or more, and the concentration is $1×10^{19}$ atoms/$cm^3$ or more in this case.

Further, in this step as well, the P+resistor at high concentration over the entire region can be formed as described in FIG. 31.

After the above-described steps are performed, the middle insulating film 135 is formed as in the step shown in FIG. 21. As a result, the structure of the CMOS semiconductor device of the third embodiment of the present invention in FIG. 22 can be obtained.

Next, a second embodiment of a method of manufacturing the CMOS semiconductor device of the third embodiment of the present invention is described.

Figure 33:
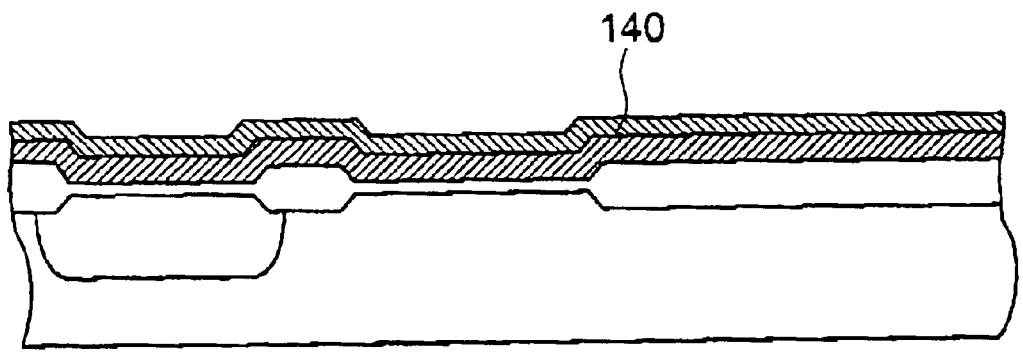
FIG. 33 is a schematic cross sectional view showing a second embodiment of a method of manufacturing the CMOS semiconductor device of the third embodiment of the present invention.

In FIG. 33, after the steps in FIG. 23 and FIG. 24 are conducted, a high melting metal 140 such as cobalt or titanium is deposited on the P+polycrystalline silicon 133 by a sputtering method.

The thicknesses of cobalt and titanium are in a range of 100 Å to 500 Å. In case of cobalt, there may be the case where titanium or titanium nitride is laminated with a thickness of several tens of Å to several hundred Å.

Figure 34:
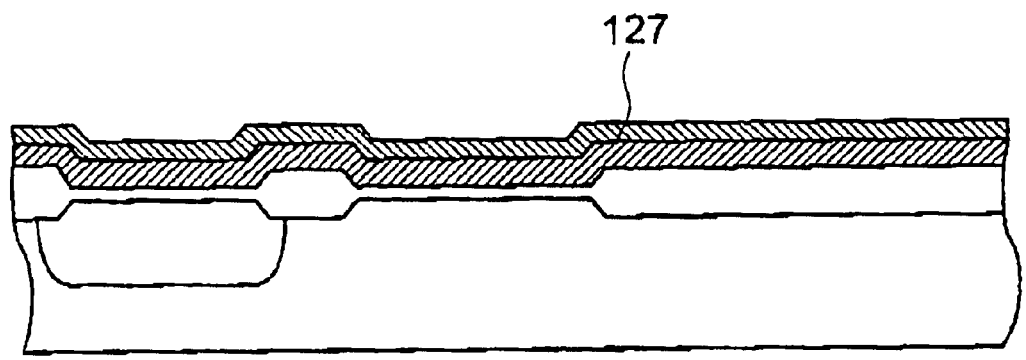
FIG. 34 is a schematic cross sectional view showing the second embodiment of the method of manufacturing the CMOS semiconductor device of the third embodiment of the present invention.

Next, heat treatment is performed at 600° C. to 750° C. for several tens of seconds to one minute by, for example, a rapid thermal process (RTP) to silicide the portion of the high melting point metal which contacts the polycrystalline silicon 131. Thereafter, the RTP is conducted at 700° C. to 900° C. for several tens of seconds. The state is shown in FIG. 34.

The same steps as in the manufacturing method described through FIG. 25 to FIG. 32 are carried out for the subsequent steps. As a result, the structure of the CMOS semiconductor device of the third embodiment in FIG. 22 can be obtained.

Figure 35:
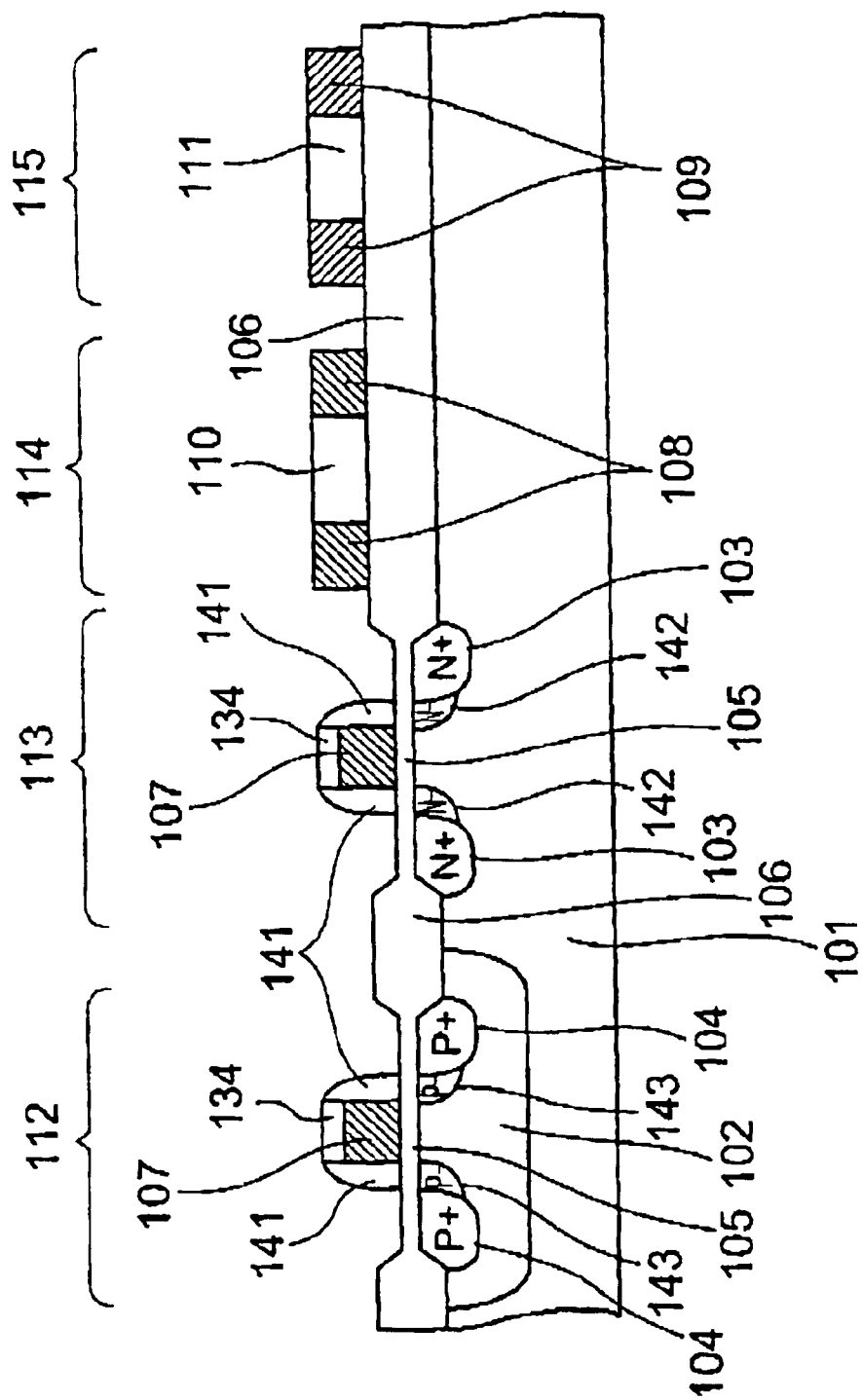
FIG. 35 is a schematic cross sectional view showing a CMOS semiconductor device In accordance with a fourth embodiment of the present invention.

FIG. 35 is a schematic cross sectional view of a CMOS semiconductor device of a fourth embodiment of the present invention.

The CMOS semiconductor device is constituted of a CMOS that is composed of the NMOS 113 having a lightly doped drain (LDD) structure in which a gate electrode formed on the P-type semiconductor substrate 101 is formed of the P+polycrystalline silicon 107 and a source and a drain each have an N-diffusion layer 142 for electric field relaxation and the PMOS 112 having an LDD structure in which a gate electrode formed on the N-well region 102 is also formed of the P+polycrystalline silicon 107 and the P−resistor 114 and the N−resistor 115 which are formed of the polycrystalline silicon of the same layer as the gate electrode formed on the field insulating film 106.

The structure shown in FIG. 35 is advantageous in terms of minuteness of a gate length and reliability since the MOS has the LDD structure. However, the structure shown in FIG. 35 is the same as the P+gate electrode CMOS semiconductor devices that is the basis of the present invention in FIG. 1, FIG. 2 and FIG. 22 except for the above point. Thus, the effect on low voltage operation and low power consumption is the same.

Next, a method of manufacturing the CMOS semiconductor device of the fourth embodiment of the present invention is described with reference to the drawings.

The same steps as in FIG. 12 to FIG. 17 are performed to form gate electrodes, wiring and resistor regions. In this embodiment, a lamination structure in which the lower layer is a silicon oxide film and the upper layer is a silicon nitride film is adopted for the insulating film 134 on the polycrystalline silicon.

The silicon oxide film is formed by thermal oxidization of polycrystalline silicon or a CVD method, and the silicon nitride film is formed by the CVD method. The total thickness of the insulating film 134 is 1000 Å to 3000 Å. The total thickness and the thicknesses of the oxide film and the nitride film are set such that the insulating film 134 functions as a mask for preventing the donor dopant from entering the P+gate electrode in the formation of the source and drain of the NMOS and that the oxide film as the lower layer of the insulating film 134 does not expose in the formation of the side spacer, which is described later. For example, the silicon nitride film is 2000 Å thick, and the silicon oxide film is 1000 Å.

In the case where the lower layer of the insulating film 134 is the oxide film formed by the CVD method, heat treatment may be conducted after the insulating film 134 is formed for the closeness.

In the formation of the gate electrode and the resistor pattern, etching of the insulating film that is a lamination layer of the oxide film and the nitride film is carried out by conducting detection or an end point in etching and changing gas between the nitride film and the oxide film. Further, not only the gas is changed but also the etcher itself is changed if necessary, and thus, the etching of the insulating film 134 is carried out without fail. The subsequent etching of the polycrystalline silicon is similarly conducted by selecting appropriate gas and etcher.

Figure 36:
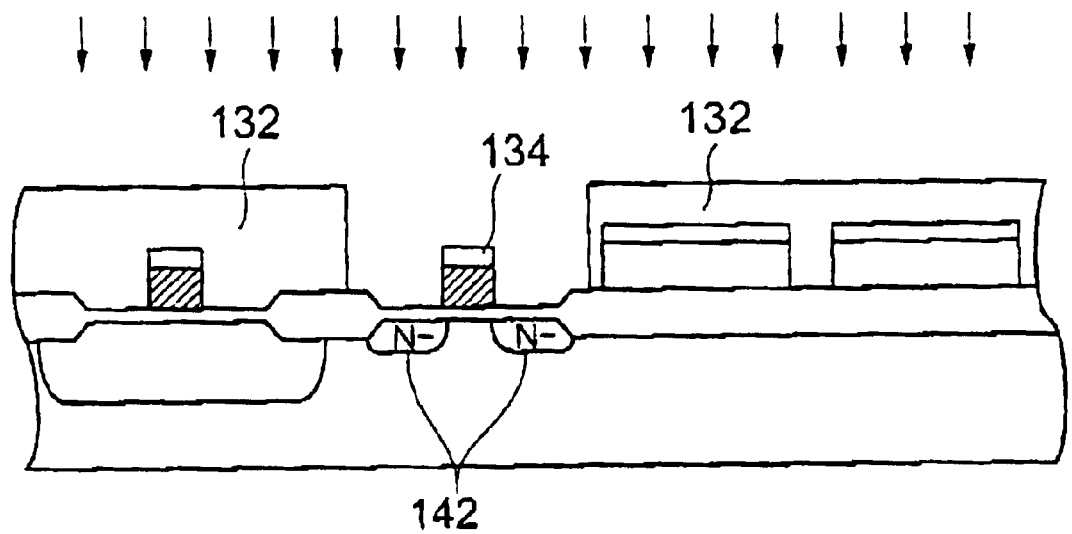
FIG. 36 is a schematic cross sectional view showing a first embodiment of a method of manufacturing the CMOS semiconductor device of the fourth embodiment of the present invention.

After the above-described steps are performed, as shown in FIG. 36, the photo resist 132 is patterned so as to open the NMOS by the photolithography method. Then, the donor such as phosphorous or arsenic is introduced into the P-type substrate at low concentration by the ion injection method, and the N−regions 142, which correspond to the source and the drain at low concentration of the NMOS are formed.

The impurity concentration depends on the operation voltage of the semiconductor product, but the dose amount is generally $10^{12}$ atoms/cm$^2$ to $10^{14}$ atoms/cm$^2$. The concentration is $10^{16}$ atoms/cm$^3$ to $10^{18}$ atoms/cm$^3$ in this case.

Figure 37:
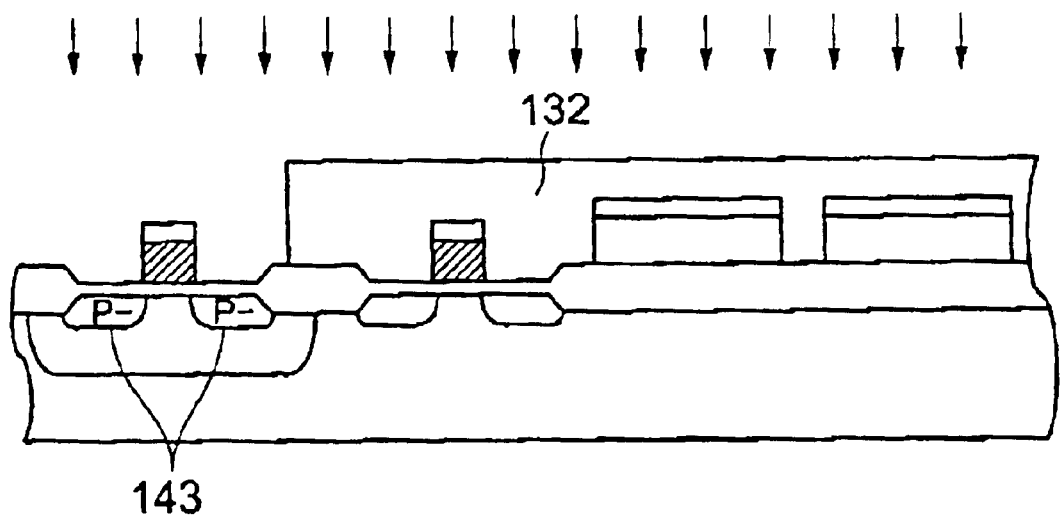
FIG. 37 is a schematic cross sectional view showing the first embodiment of the method of manufacturing the CMOS semiconductor device of the fourth embodiment of the present invention.

Next, after the photo resist is removed, as shown in FIG. 37, the photo resist 132 is patterned so as to open the PMOS by the photolithography method. Then, the acceptor such as boron or $BF_2$ is introduced into the N-well at low concentration by the ion injection method, and P−regions 143, which correspond to the source and the drain at low concentration of the PMOS are formed.

The impurity concentration is the same as in the NMOS, and the dose amount is generally $10^{12}$ atoms/cm$^2$ to $10^{14}$ atoms/cm$^2$. The concentration is $10^{16}$ atoms/cm$^3$ to $10^{18}$ atoms/cm$^3$ in this case.

Figure 38:
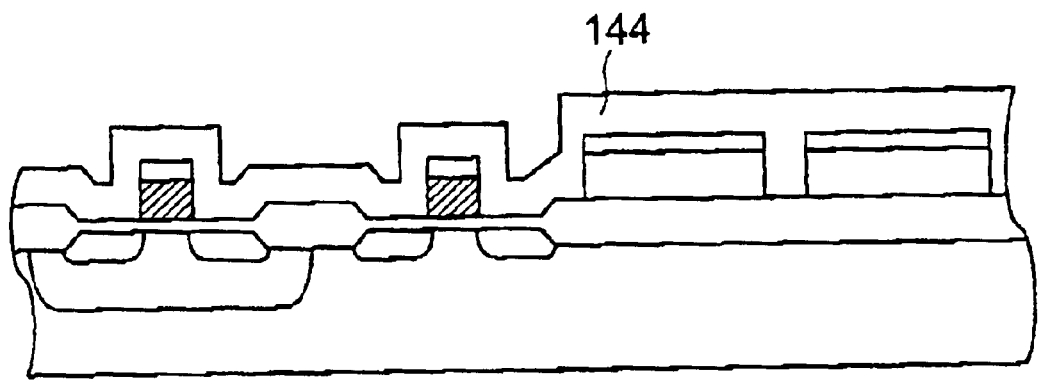
FIG. 38 is a schematic cross sectional view showing the first embodiment of the method of manufacturing the CMOS semiconductor device of the fourth embodiment of the present invention.
Figure 39:
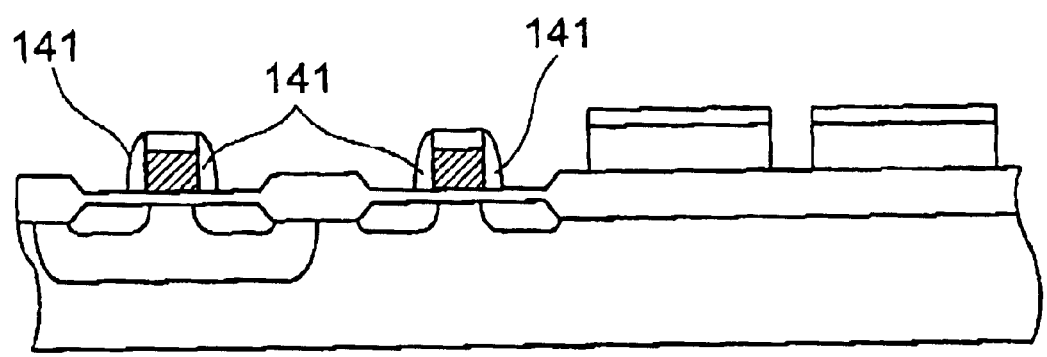
FIG. 39 is a schematic cross sectional view showing the first embodiment of the method of manufacturing the CMOS semiconductor device of the fourth embodiment of the present invention.

Next, after the photo resist is removed, as shown in FIG. 38, an insulating film 144 that becomes side spacers later is formed on the semiconductor substrate by a CVD method. The side spacer needs to be formed such that the insulating film 134 on the polycrystalline silicon is left for the insulating film in this case. Thus, a silicon oxide film, which has the etching selective ratio to the silicon nitride film as the upper layer of the insulating film 134, is used. The thickness of the insulating film 144 is generally 2000 Å to 6000 Å although depending on the degree of required electric field relaxation. Heat treatment may be conducted after the insulating film 144 is deposited for the closeness of the oxide film, and the like.

Subsequently, the insulating film 144 is etched by anisotropic dry etching, whereby the side spacers 141 are formed on the side walls of the polycrystalline silicon that is the gate electrode and side walls of the wiring and the resistor, which are not shown in the figure. The width of the side spacer 141 depends on the etching condition, but is generally 0.2 $\mu$m to 0.5 $\mu$m.

In the formation of the side spacers 141, since the insulating film 144 is the silicon oxide film and the upper layer of the insulating film 134 on the polycrystalline silicon is the silicon nitride file, the large selective ratio in anisotropic dry etching can be sufficiently kept. Thus, the polycrystalline silicon does not need to be exposed in etching.

In this embodiment, the upper layer of the insulating film 134 on the polycrystalline silicon is the silicon nitride film, and the insulating film 144 for the spacers is the silicon oxide film. However, the same structure can be obtained when the insulating film 134 is the silicon oxide film and the insulating film 144 for the spacers is the silicon nitride film.

Figure 40:
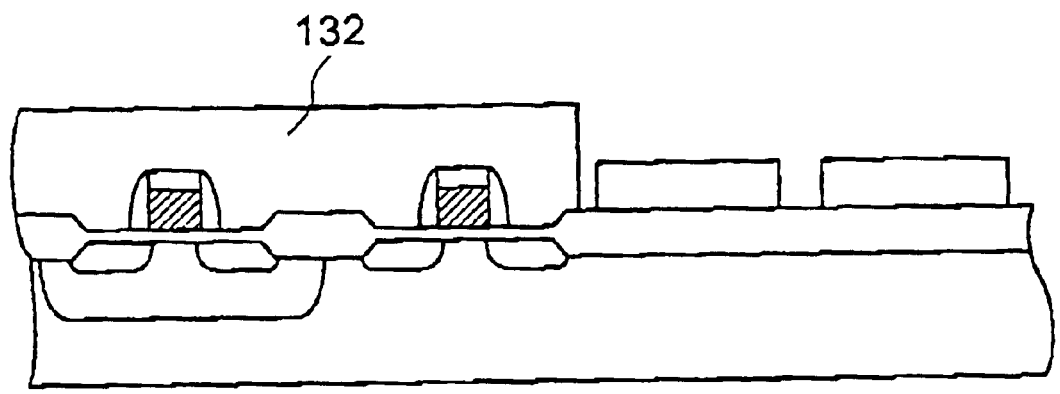
FIG. 40 is a schematic cross sectional view showing the first embodiment of the method of manufacturing the CMOS semiconductor device of the fourth embodiment of the present invention.

Next, as shown in FIG. 40, the photo resist 132 is patterned so as to cover the gate electrode and wiring region other than the resistor by the photolithography method. Then, the insulating film 134 on the resistor is removed by etching.

In this case, it is not preferable that the resistor is damaged by etching. Thus, in this embodiment, the silicon nitride film as the upper layer of the insulating film 134 is removed by dry etching, and the silicon oxide film as the lower layer which directly contacts the resistor is removed by wet etching in which etching progresses solely with chemical reaction.

Figure 41:
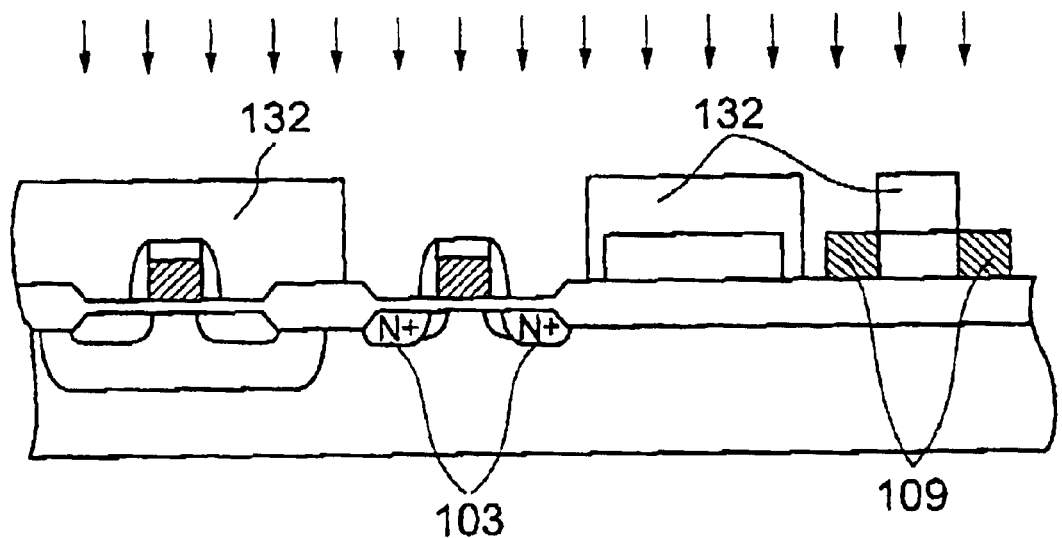
FIG. 41 is a schematic cross sectional view showing the first embodiment of the method of manufacturing the CMOS semiconductor device of the fourth embodiment of the present invention.
Figure 42:
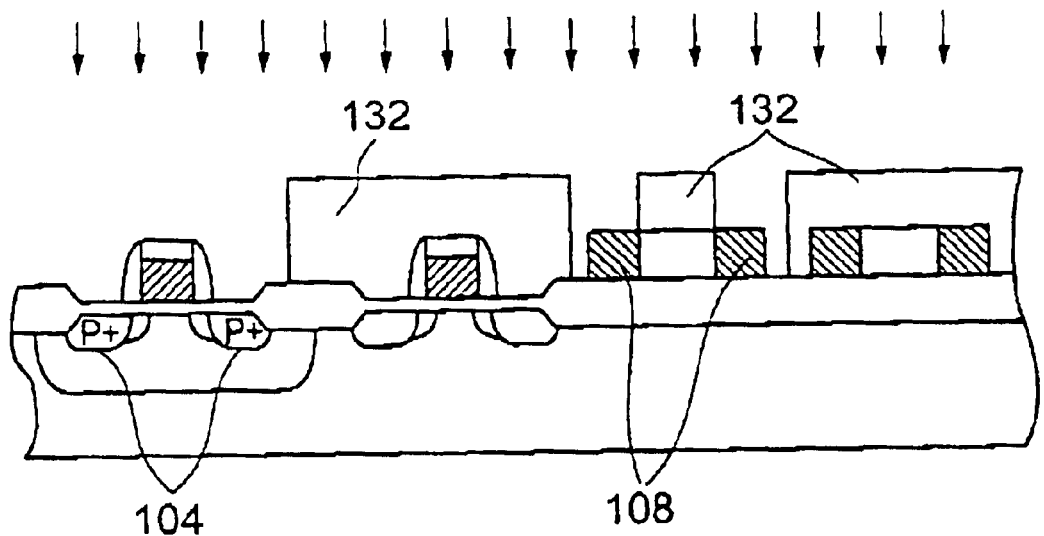
FIG. 42 is a schematic cross sectional view showing the first embodiment of the method of manufacturing the CMOS semiconductor device of the fourth embodiment of the present invention.

Next, after the photo resist is removed, as shown in FIG. 41, the photo resist 132 is patterned so as to open the portions of the NMOS and the N-type resistor, which are to be contacts with the wiring metal, by the photolithography method. Then, the donor such as phosphorous or arsenic is introduced into the P-type substrate and the N-type resistor at high concentration by the ion injection method, and the N+regions 103, which correspond to the source and the drain of the NMOS, and the N+polycrystalline silicon region 109 are formed.

Arsenic having a small diffusion coefficient with which a shallow source and a shallow drain are obtained is generally used as the impurity. The dose amount is $1 \times 10^{15}$ atoms/cm$^2$ or more in order to attain low resistance as much as possible, and the concentration is $1 \times 10^{19}$ atoms/cm$^3$ or more in this case.

Further, in this case, since the insulating film is formed on the gate electrode of the NMOS, the donor does not enter the P+gate electrode of the NMOS. Thus, the working function and the resistance value do not change. Besides, the donor does not enter the portion below the region provided with the side spacer, and thus, it is possible to attain low electric film at the end of the drain.

Moreover, although not shown in the figure, the N+resistor formed of polycrystalline silicon, in which the entire N-type resistor region is at high concentration, can be formed for the purpose of improvement of a temperature coefficient in accordance with this step.

Next, after the photo resist is peeled, and after heat treatment or activation of the impurities is conducted if necessary, the photo resist 132 is patterned so as to open the portions of the PMOS and the P-type resistor, which are to be contacts with the wiring metal, by the photolithography method. Then, the acceptor such as $BF_2$ or boron is introduced into the N-well and the P-type resistor at high concentration by the ion injection method, and the P+regions 104, which correspond to the source and the drain of the PMOS, and the P+polycrystalline silicon region 108 are formed. Since the resistance is made low as much as possible as in the NMOS, the dose amount is $1 \times 10^{15}$ atoms/cm$^2$ or more, and the concentration is $1 \times 10^{14}$ atoms/cm$^3$ or more in this case.

Further, the P+resistor in which the entire P-type resistor region is at high concentration can be formed similarly to the N+resistor in accordance with this step.

In the subsequent step, the middle insulating film is forced as in the step shown in FIG. 21.

As described above, through the steps of FIG. 36 to FIG. 43, the CMOS semiconductor structure of the fourth embodiment according to the present invention in FIG. 35 can be obtained.

Next, a second embodiment of a method of manufacturing the CMOS semiconductor device of the fourth embodiment of the present invention will be described. The same steps as in FIG. 12 to FIG. 17 are performed to form gate electrodes, wiring and resistor regions. In this embodiment, however, the introduction of impurities into the polycrystalline silicon resistor shown in FIGS. 13 and 15 is not performed.

After performing the steps described above, the same step as in FIG. 40 is performed to remove the insulating film 134 on the resistor.

Figure 43:
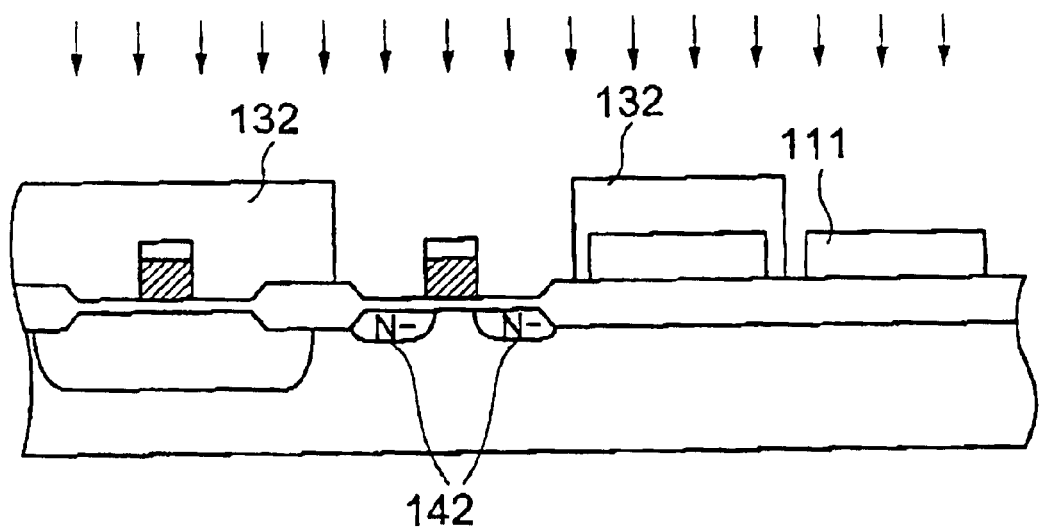
FIG. 43 is a schematic cross sectional view showing a second embodiment of a method of manufacturing the CMOS semiconductor device of the fourth embodiment of the present invention.

Next, as shown in FIG. 43 the photo resist 132 is patterned so as to open the portions of the NMOS and the N-type resistor. Then, the donor such as phosphorous or arsenic is introduced into the P-type semiconductor substrate and polycrystalline silicon at low concentration by the ion injection method, N-region 142, which correspond to the source and the drain at low concentration of the NMOS, and the N-polycrystalline silicon that becomes the N-type resistor are formed at the same time.

Although in the above embodiments the LDD source and drain regions at low concentration of the NMOS and the N-polycrystalline silicon resistor are respectively formed by different steps, since their impurity concentrations are relatively close to each other, they can be formed simultaneously as described above depending on product specifications. Thus the manufacturing cost and time can be reduced.

Figure 44:
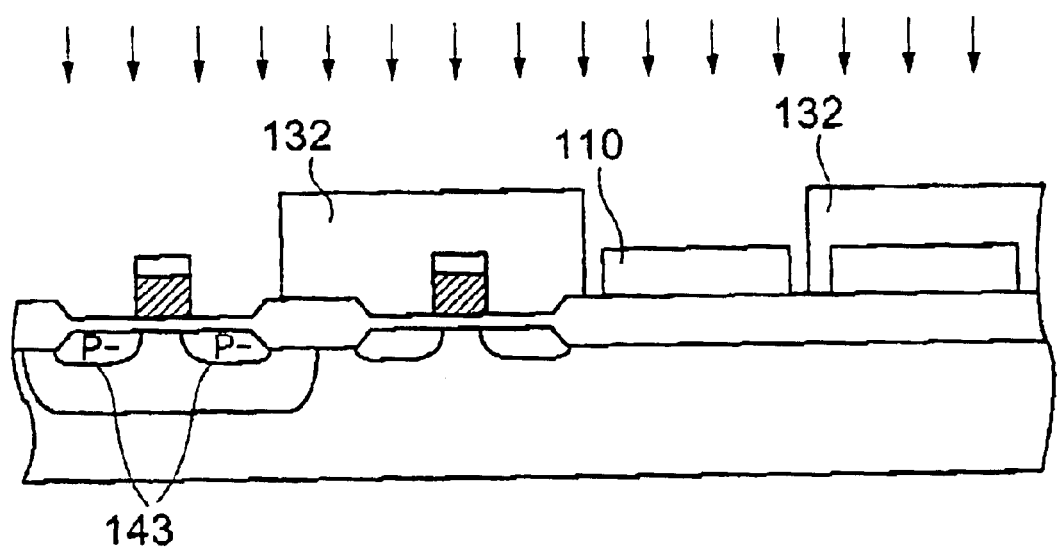
FIG. 44 is a schematic cross sectional view showing the second embodiment of the method of manufacturing the CMOS semiconductor device of the fourth embodiment of the present invention.

Next, after the photo resist is removed, as shown in FIG. 44, the photo resist 132 is patterned so as to open the portions of the PMOS and the P-type resistor as in FIG. 43. Then, the acceptor such as $BF_2$ or boron is introduced into the N-well and the polycrystalline silicon at low concentration by the ion injection method, and the P-region 143, which corresponds to the source and the drain at low concentration of the PMOS, and the P-polycrystalline silicon 110 which becomes the P-type resistor, are formed at the same time. Therefore, due to the reason already explained with respect to FIG. 43, the manufacturing cost and time can be reduced.

The same steps as in the manufacturing method described through FIG. 38 to FIG. 42 are carried out for the subsequent steps. As a result, the structure of the CMOS semiconductor device of the fourth embodiment of the present invention shown in FIG. 35 can be obtained. According to the another manufacturing method of the present invention described above, it is possible to reduce the mask step, and is therefore advantageous in terms of the manufacturing cost and time.

Note, however, that since the anisotropic dry etching is performed in the state where there is no insulating film provided on the resistor at the time of forming the side spacer, the resistor may be damaged due to its exposure to plasma during the etching, with the result that the resistance value thereof may be changed.

Figure 45:
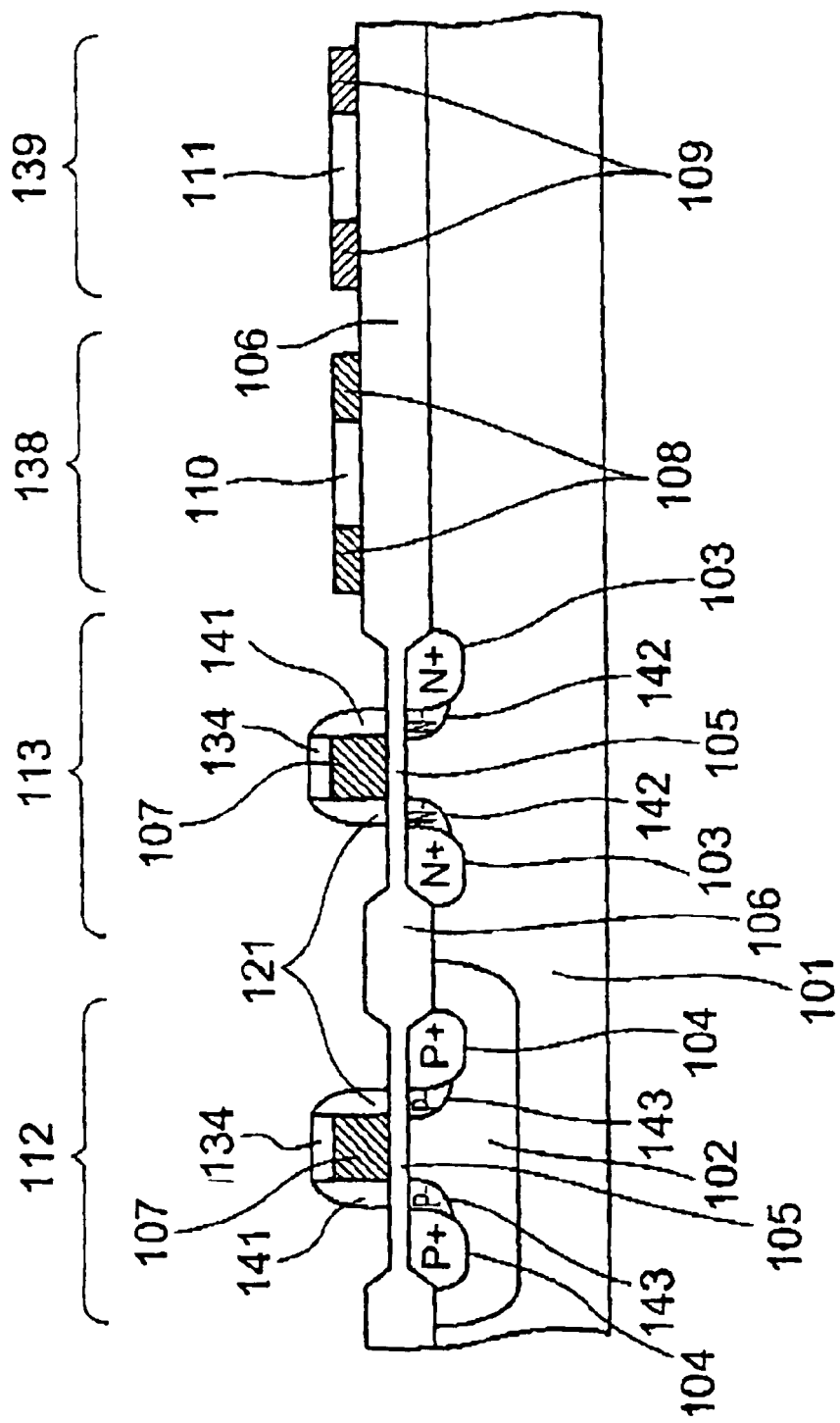
FIG. 45 is a schematic cross sectional view showing a CMOS semiconductor device in accordance with a fifth embodiment of the present invention.

FIG. 45 is a schematic cross sectional view of a CMOS semiconductor device of a fifth embodiment of the present invention.

The CMOS semiconductor device is constituted of a CMOS that is composed of: the NMOS 113 having an LDD structure in which a gate electrode formed on the P-type semiconductor substrate 101 is formed of the first P+polycrystalline silicon 107 and a source and a drain are intended for electric field relaxation; the PMOS 112 having an LDD structure In which a gate electrode formed on the N-well region 102 is also formed of the first P+polycrystalline silicon 107; and the thin-film P-resistor 138 and thin-film N-resistor 139 which are formed of the thin-film polycrystalline silicon formed on the field insulating film 106.

The reason for adopting an LDD structure as the MOS structure is as already explained with respect to the CMOS semiconductor device shown in FIG. 35. Similarly, the reason for adopting a thin-film polycrystalline silicon as the resistor is as already explained with respect to the third embodiment shown in FIG. 22. However, since the CMOS structure that forms the basis of the present invention is of the P-gate electrode, the effect on low voltage operation and low power consumption is the same as in the embodiments described above.

Next, a fifth embodiment of a method of manufacturing the CMOS semiconductor device of the present invention will be described with reference to the drawings.

The same steps as in FIG. 23 to FIG. 24 are performed to form P+polycrystalline silicon gate 133. The film thickness of the P+polycrystalline silicon is from 2000 Å to 6000 Å, since the gate electrode is formed of a single layer of the polycrystalline silicon.

Figure 46:
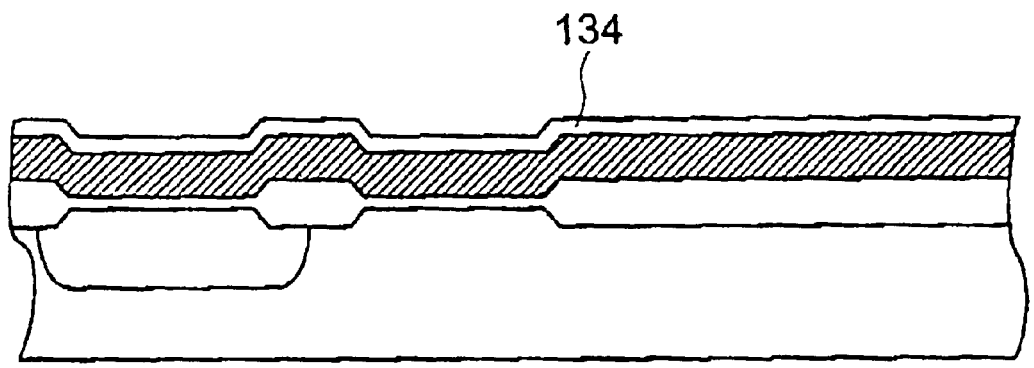
FIG. 46 is a schematic cross sectional view showing a method of manufacturing the CMOS semiconductor device of the fifth embodiment of the present invention.

Next, as shown in FIG. 46, the insulating film 134 is formed on the polycrystalline silicon. As in the method of manufacturing the CMOS semiconductor device of the fourth embodiment described above, a lamination structure in which the lower layer is a silicon oxide film and the upper layer is a silicon nitride is adopted for this insulating film 134. The total thickness of the insulating film 134 is 1000 Å to 3000 Å.

Figure 47:
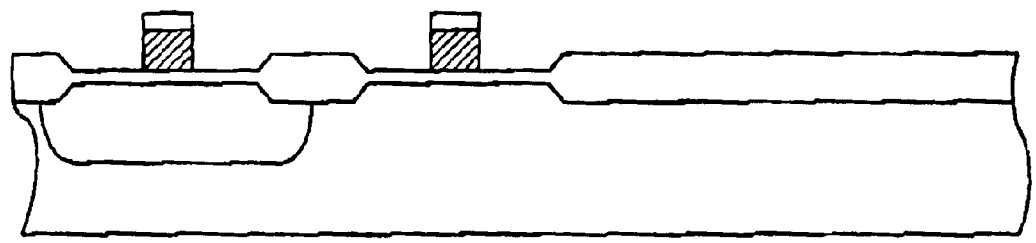
FIG. 47 is a schematic cross sectional view showing the method of manufacturing the CMOS semiconductor device of the fifth embodiment of the present invention.

Next, as shown in FIG. 47, the insulating film 134 and the P+polycrystalline silicon are patterned by the photolithography method and anisotropic dry etching to form gate electrodes and wiring.

The formation is carried out by two methods. That is, one method is such that after the photo resist is patterned by the photolithography method, the insulating film is etched using the photo resist as a mask, the polycrystalline silicon is etched while the photo resist is left, and thereafter, the photo resist is removed. The other method is such that after the photo resist is patterned by the photolithography method, the insulating film is etched using the photo resist as a mask, the photo resist is peeled, and thereafter, the polycrystalline silicon is etched using the insulating film as a mask.

Figure 48:
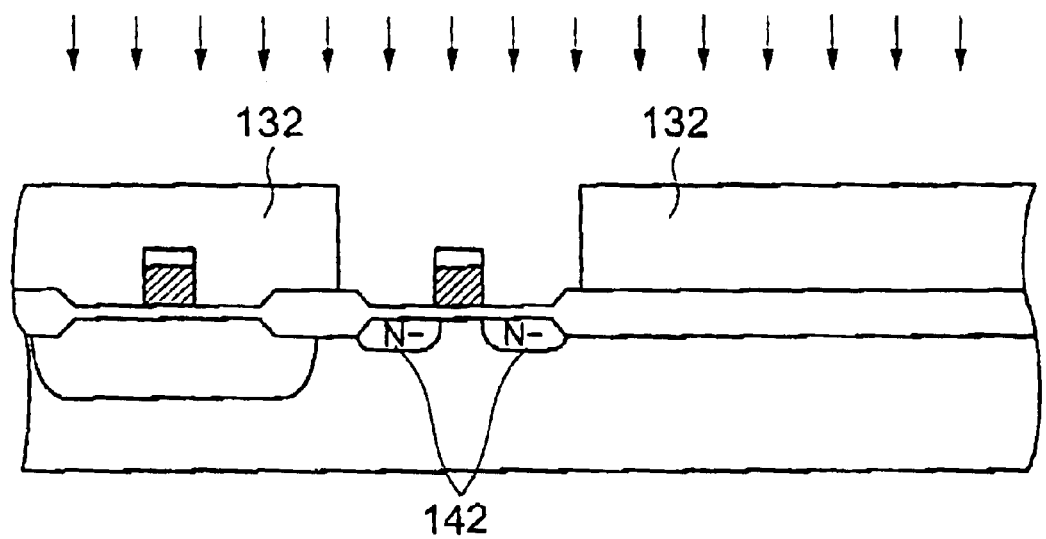
FIG. 48 is a schematic cross sectional view showing the method of manufacturing the CMOS semiconductor device of the fifth embodiment of the present invention.

Next, as shown in FIG. 48, the photo resist 132 is patterned so as to open the NMOS by the photolithography method. Then, the donor such as phosphorous or arsenic is introduced into the P-type substrate at low concentration by the ion injection method, and the N-regions 142, which correspond to the source and the drain at low concentration of the NMOS are formed.

The impurity concentration depends on the operation voltage of the semiconductor product, but the dose amount is generally $10^{12}$ atoms/cm$^2$ to $10^{14}$ atoms/cm$^2$. The concentration is $10^{16}$ atoms/cm$^3$ to $10^{18}$ atoms/cm$^2$ in this case.

Figure 49:
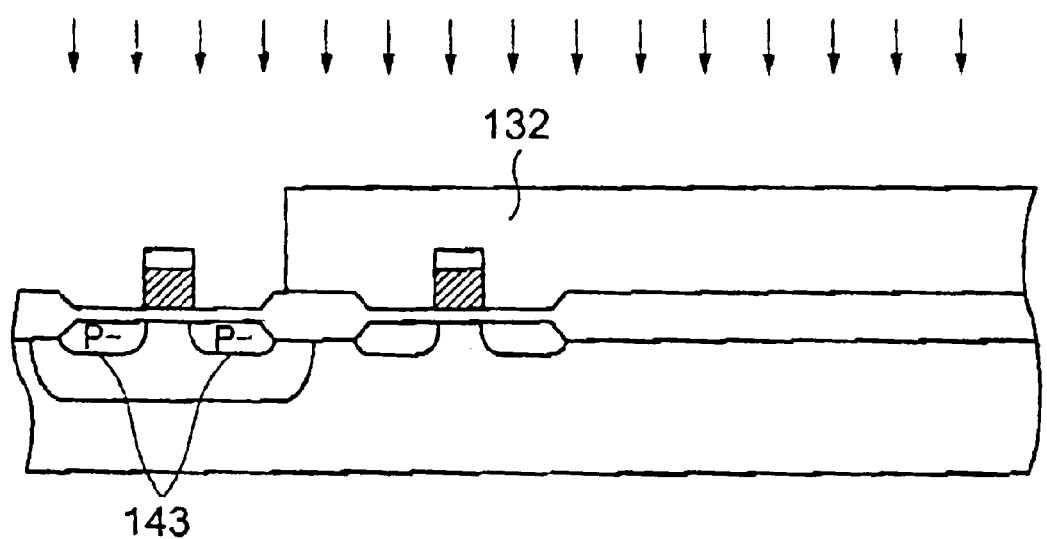
FIG. 49 is a schematic cross sectional view showing the method of manufacturing the CMOS semiconductor device of the fifth embodiment of the present invention.

Next, after the photo resist is removed, as shown in FIG. 49, the photo resist 132 is patterned so as to open the PMOS by the photolithography method. Then, the acceptor such as boron or $BF_2$ is introduced into the N-well at low concentration by the ion injection method, and P-regions 143, which correspond to the source and the drain at low concentration of the PMOS are formed.

The impurity concentration is the same as in the NMOS, and the dose amount is generally $10^{12}$ atoms/cm$^2$ to $10^{14}$ atoms/cm$^2$. The concentration is $10^{16}$ atoms/cm$^3$ to $10^{18}$ atoms/cm$^3$ in this case.

Figure 50:
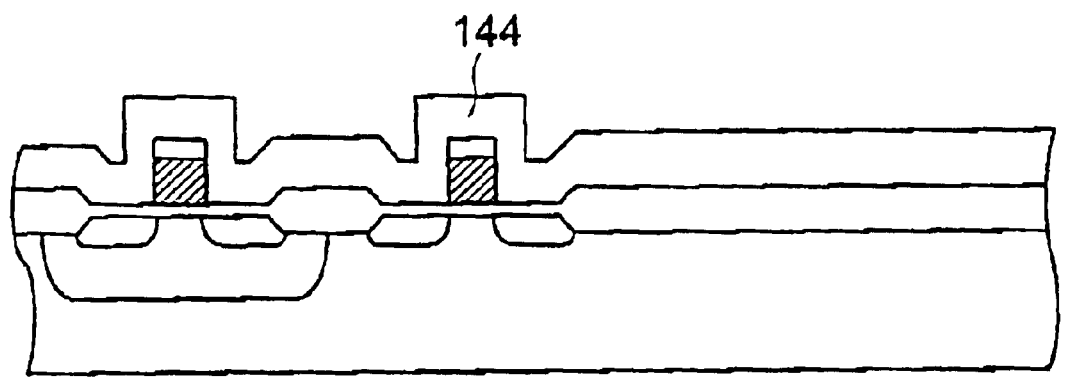
FIG. 50 is a schematic cross sectional view showing the method of manufacturing the CMOS semiconductor device of the fifth embodiment of the present invention.

Next, after the photo resist is removed, as shown in FIG. 50, an insulating film 144 that becomes side spacers later is formed on the semiconductor substrate by a CVD method. The side spacer needs to be formed such that the insulating film 134 on the polycrystalline silicon is left for the insulating film in this case. Thus, a silicon oxide film, which has the etching selective ratio to the silicon nitride film as the upper layer of the insulating film 134, is used as this insulating film 144. The thickness of the insulating film 144 is generally 2000 Å to 6000 Å although depending on the degree of required electric field relaxation. Heat treatment may be conducted after the insulating film 144 is deposited for the closeness of the oxide film, and the like.

Figure 51:
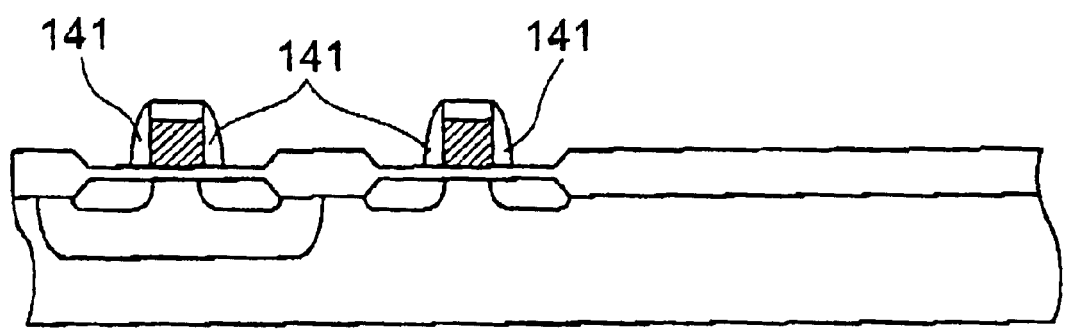
FIG. 51 is a schematic cross sectional view showing the method of manufacturing the CMOS semiconductor device of the fifth embodiment of the present invention.

Subsequently, as shown in FIG. 51, the insulating film 144 is etched by anisotropic dry etching, whereby the side spacers 141 are formed on the side walls of the polycrystalline silicon being the gate electrode or wiring.

In the formation of the side spacers 141, since the insulating film 144 is the silicon oxide film and the upper layer of the insulating film 134 on the polycrystalline silicon is the silicon nitride film, sufficiently large selective ratio in anisotropic dry etching can be obtained. Thus, the insulating film on the polycrystalline silicon is not etched during the etching and remains thereon.

Figure 52:
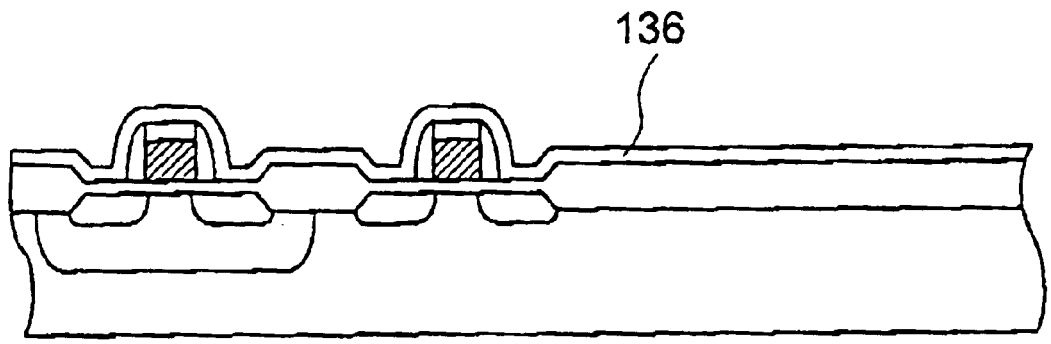
FIG. 52 is a schematic cross sectional view showing the method of manufacturing the CMOS semiconductor device of the fifth embodiment of the present invention.

Next, as shown in FIG. 52, thin film polycrystalline silicon 136 is deposited.

The thin film polycrystalline silicon is deposited by the CVD method similarly in case of the polycrystalline silicon used for the gate electrode and wiring. However, in many cases, the than film polycrystalline silicon is deposited at the lowered deposition temperature since it has a small thickness of 500 Å to 2000 Å. In addition, the film deposition may also be performed by a sputtering method.

Since the resistor is formed by using the thin-film polycrystalline, the precision of the resistance value can be sufficiently kept even though the sheet resistance value of the resistor is set high to several kΩ/square to several tens of Ω/square.

Figure 53:
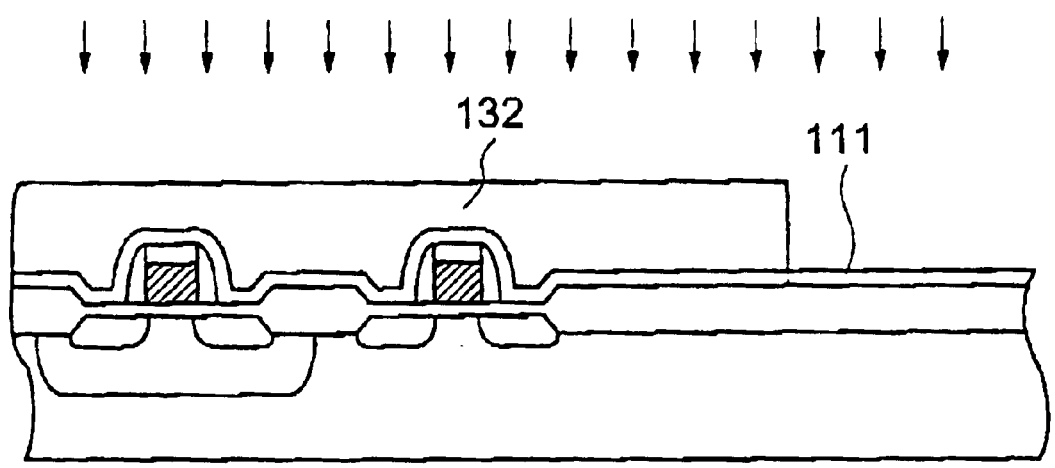
FIG. 53 is a schematic cross sectional view showing the method of manufacturing the CMOS semiconductor device of the fifth embodiment of the present invention.

Next, as shown in FIG. 53, the photo resist 132 is patterned so as to open the portion to be an N-type resistor by the photolithography method, and phosphorous or arsenic as donor impurities is selectively introduced into the thin film polycrystalline silicon 136 by the ion injection method.

As to be described later, there may be the case where the ion injection of the acceptor dopant at low concentration is conducted into the entire surface of the thin film polycrystalline silicon in the later step as described later. However, the dose amount is set such that the conductivity type is N-type even after the ion injection. The dose amount is generally in a range of $10^{14}$ atoms/cm$^2$ to $10^{15}$ atoms/cm$^2$, and the net concentration is approximately $1\times10^{14}$ atoms/cm$^3$ to $9\times10^{18}$ atoms/cm$^3$. The sheet resistance value is several kΩ/square to several tens of kΩ/square. It is necessary to set the sheet resistance value to the above value in order to set a consumption current in the voltage dividing circuit due to resistance to at least $\mu$A or less.

Further, there may be the case where high resistance of the N-type polycrystalline silicon is unnecessary depending on the circuit or product. In this case, the step shown in FIG. 53 is omitted.

Figure 54:
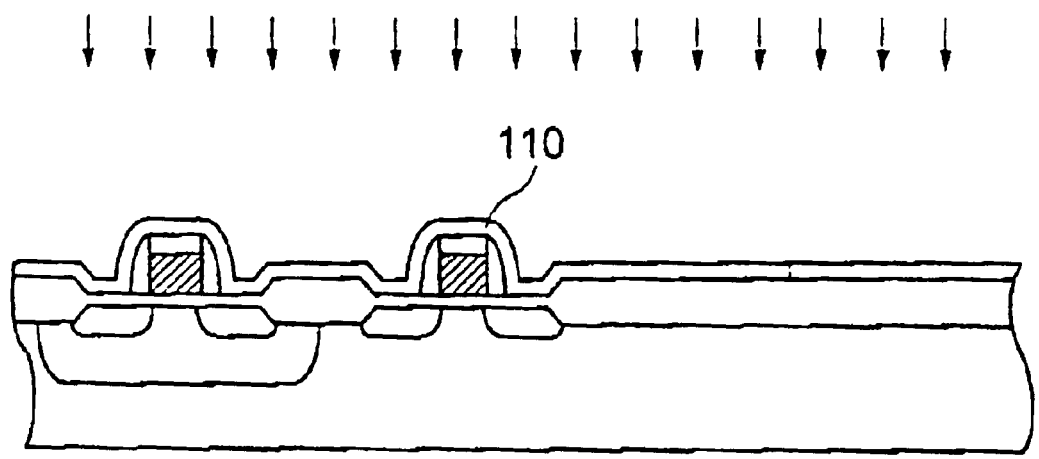
FIG. 54 is a schematic cross sectional view showing the method of manufacturing the CMOS semiconductor device of the fifth embodiment of the present invention.

Next, after the photo resist 132 is peeled, as shown in FIG. 54, boron or BF$_2$ as the acceptor impurities is introduced into the thin film polycrystalline silicon 136 by the ion injection method to form a P-type resistor region.

The dose amount is generally in a range of $10^{14}$ atoms/cm$^2$ to $10^{15}$ atoms/cm$^2$, and the net concentration is approximately $1\times10^{14}$ atoms/cm$^3$ to $9\times10^{18}$ atoms/cm$^3$. The sheet resistance value is several kΩ/square to several tens of kΩ/square. The sheet resistance value is set to the above value in order to set a consumption current in the voltage dividing circuit due to resistance to at least $\mu$A or less as in the N-type resistor.

Further, there may be the case where high resistance of the P-type polycrystalline silicon is unnecessary depending on the circuit or product. In this case, the step shown in FIG. 54 is omitted.

The N-type resistor region and the P-type resistor region are formed in the thin film polycrystalline silicon through the steps shown in FIG. 53 and FIG. 54. However, this step order is not necessary adopted. The N-type resistor region and the P-type resistor region can be similarly formed by exchanging the steps in FIG. 53 and FIG. 54.

Figure 55:
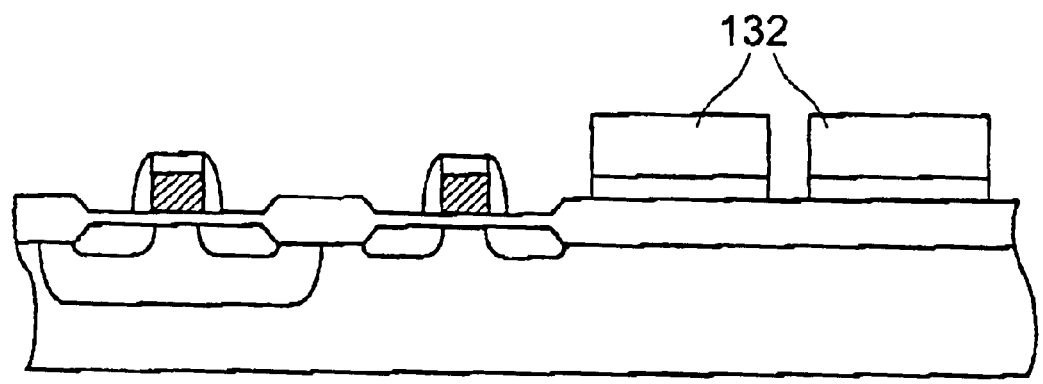
FIG. 55 is a schematic cross sectional view showing the method of manufacturing the CMOS semiconductor device of the fifth embodiment of the present invention.

Next, as shown is FIG. 55, the thin film polycrystalline silicon 136 is patterned by the photolithography method and etching to form a resistor.

Since the processing or the resistor requires precision, this is performed by an anisotropic dry etching method. Generally, the selective ratio in the dry etching of the polycrystalline silicon and the nitride film cannot be set very large. Therefore, there may be a case where, during the etching of the thin film polycrystalline silicon, the nitride film, which is the upper layer of the insulating film 134 on the P+polycrystalline silicon 133 used for the gate electrode and wiring, is entirely removed. However, as for the oxide film that is the lower layer of the insulating film 134, sufficiently large selective ratio to polycrystalline silicon can be secured during the dry etching. As a result, since the insulating film 134 on the P+polycrystalline silicon 133 is not entirely removed, it can adequately function as a mask during ion injection performed when forming a source and a drain which will be described later.

Figure 56:
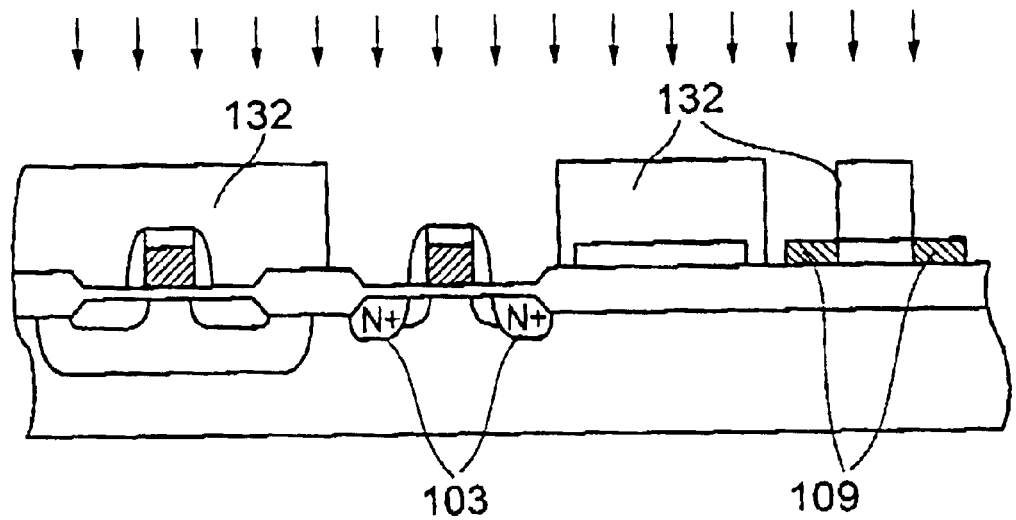
FIG. 56 is a schematic cross sectional view showing the method or manufacturing the CMOS semiconductor device of the fifth embodiment of the present invention.

Then, after the photo resist 132 is peeled, as shown in FIG. 56, the photo resist 132 is patterned so as to open the portions of the NMOS and the N-type resistor, which are to be contacted with the wiring metal, by the photolithography method. Then, the donor such as phosphorous or arsenic is introduced into the P-type substrate and the N-type resistor at high concentration by the ion injection method, and N+regions 103, which correspond to a source and a drain of the NMOS, and an N+polycrystalline silicon region 109 are formed.

Arsenic having a small diffusion coefficient with which a shallow source and a shallow drain are obtained is generally used as impurities. The dose amount is $1\times10^{15}$ atoms/cm$^3$ or more in order to attain low resistance as much as possible, and the concentration $1\times10^{19}$ atoms/cm$^3$ or more in this case.

Further, in this case, since the insulating film 134 is formed on the gate electrode of the NMOS, the donor does not enter the P–gate electrode of the NMOS. Thus, the working function and the resistance value do not change. Further, the donor does not enter the area below the region where side spacer is formed, so the drain edge can be made low electric field.

Moreover, although not shown in the figure, the N+resistor formed of thin film polycrystalline silicon, in which the entire N-type resistor region is at high concentration, can be formed for the purpose of improvement of a temperature coefficient.

Figure 57:
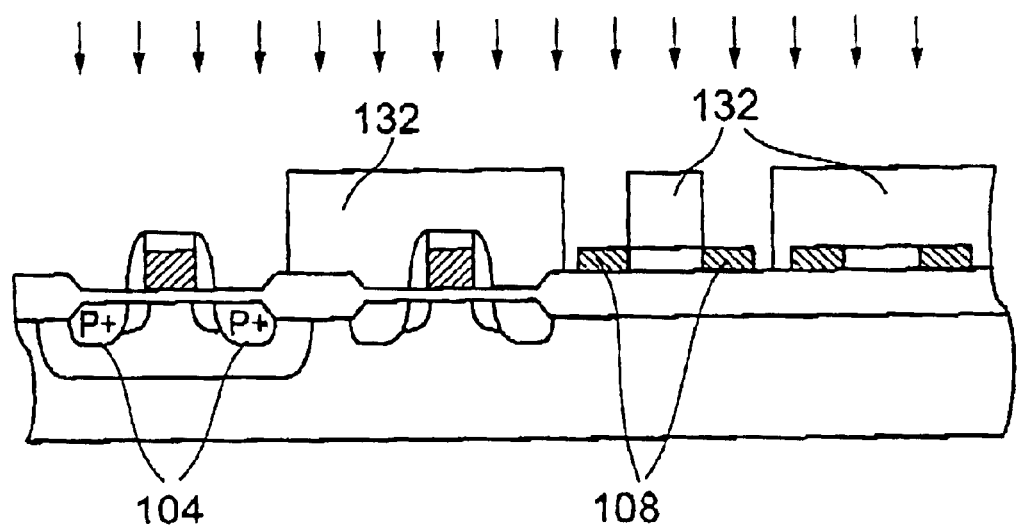
FIG. 57 is a schematic cross sectional view showing the method of manufacturing the CMOS semiconductor device of the fifth embodiment of the present invention.

Then, after the photo resist is peeled, heat treatment for activation of impurities is conducted if necessary. Thereafter, as shown in FIG. 57, the photo resist 132 is patterned so as to open the portions of the PMOS and the P-type resistor, which are to be contacted with the wiring metal, by the photolithography method. Then, the acceptor such as BF$_2$ or boron is introduced into the N-well and the P-type resistor at high concentration by the ion injection method, and the P+region 104, which corresponds to the source and the drain of the PMOS, and the P+polycrystalline silicon region 108 are formed. Since the resistance is made low as much as possible as in the NMOS, the dose amount is $1 \times 10^{15}$ atoms/cm$^2$ or more, and the concentration is $1 \times 10^{19}$ atoms/cm$^3$ or more in this case.

Further, in this step as well, the P+resistor at high concentration over the entire region can be formed as described in FIG. 56.

As described above, through the steps of FIGS. 23 and 24 and FIGS. 46 to 57, he structure of the CMOS semiconductor device of the fifth embodiment of the present invention shown in FIG. 45 can be obtained.

Figure 58:
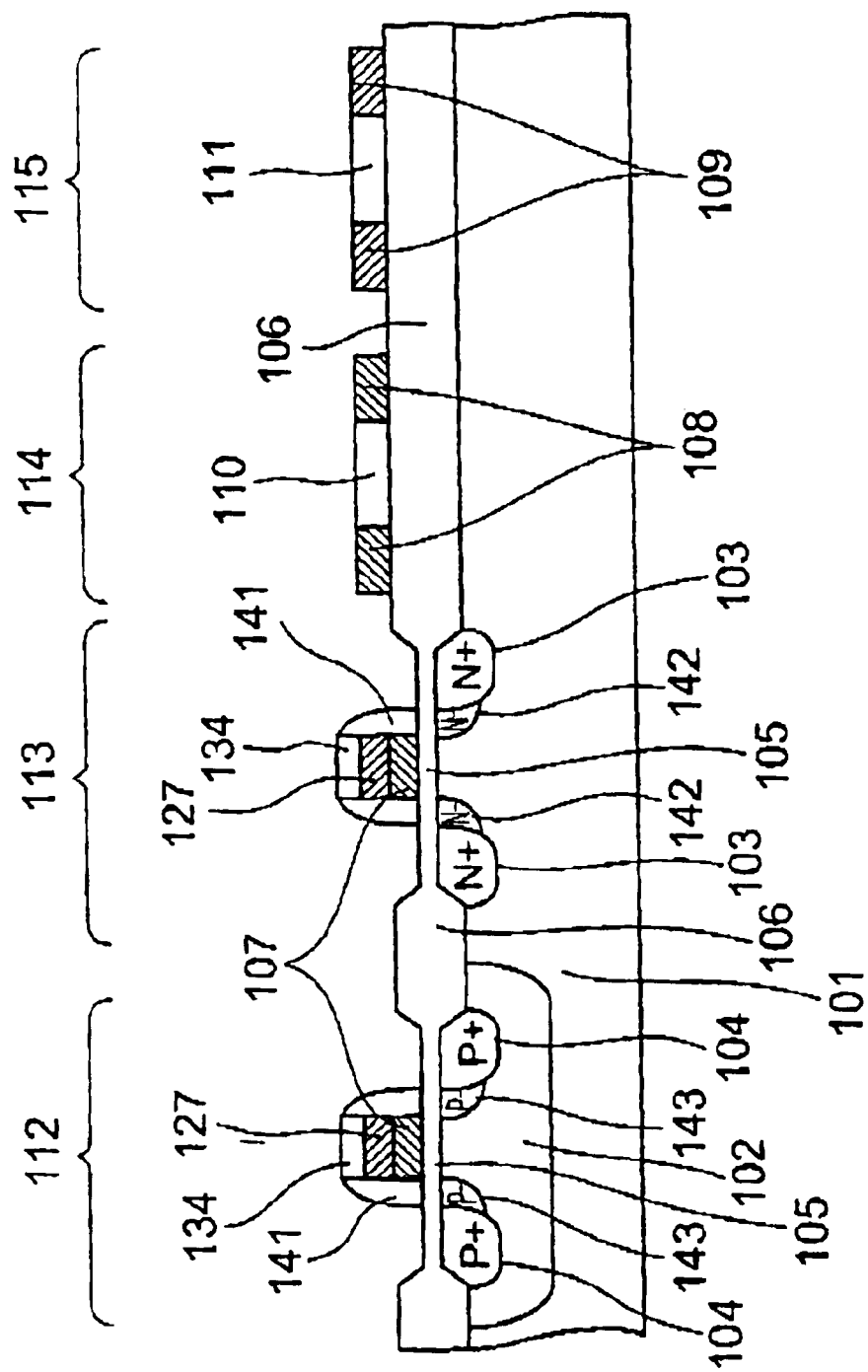
FIG. 58 is a schematic cross sectional view showing a CMOS semiconductor device in accordance with a sixth embodiment of the present invention.

FIG. 58 is a schematic cross sectional view of a CMOS semiconductor device of a sixth embodiment of the present invention.

The CMOS semiconductor device is constituted of a CMOS that is composed of: the NMOS 113 having an LDD structure in which a gate electrode formed on the P-type semiconductor substrate 101 has a so-called polycide structure that is a lamination layer of a high melting point metal silicide 127 and the P+polycrystalline silicon 107 and in which a source and a drain have an LDD structure; and the PMOS 112 having an LDD structure in which a gate electrode formed on the N-well region 102 also has a polycide structure that is a lamination layer of a high melting point metal silicide 127 and the P+polycrystalline silicon 107, and the P–resistor 114 and N–resistor 115 which are formed of the polycrystalline silicon from the same layer of the polycrystalline silicon that is the lower layer of the polycide electrode formed on the field insulating film 106.

Since the resistors are formed of the polycrystalline silicon from the same layer of the polycrystalline silicon that is the lower layer of the polycide electrode, the film thickness of the resistors is small at 1000 Å to 4000 Å. Therefore, excellent precision of the resistance value can be achieved.

The reason for adopting an LDD structure as the MOS structure is two-fold, that is, for achieving minuteness and improved reliability, as already explained with respect to the fourth embodiment of the CMOS semiconductor device shown in FIG. 35. Similarly, the reason for adopting a polycide structure for the gate electrode is for achieving high speed, as already explained with respect to the third embodiment shown in FIG. 22. However, since the CMOS structure that forms the basis of the present invention is of the P+gate electrode, the effect on low voltage operation and low power consumption is the same as in the embodiments described above.

Next, a method of manufacturing the CMOS semiconductor device of the sixth embodiment of the present invention is described with reference to the drawings.

Figure 59:
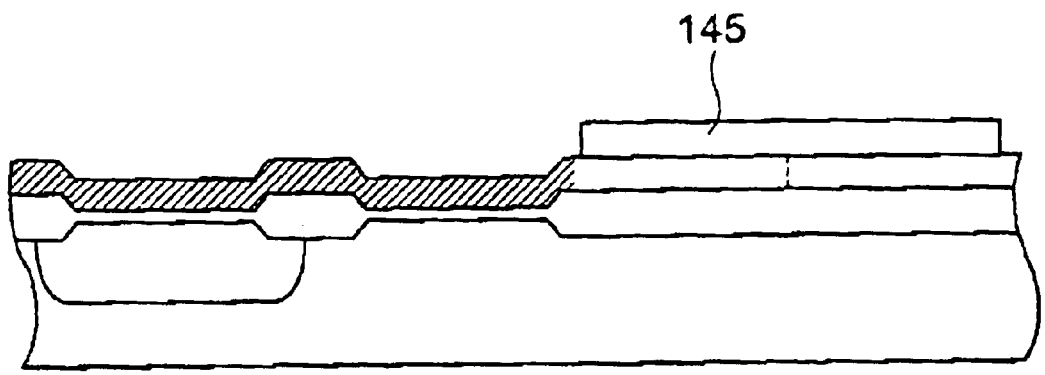
FIG. 59 is a schematic cross sectional view showing a first embodiment of a method of manufacturing the CMOS semiconductor device of the sixth embodiment of the present invention.

In the FIG. 59, the following state is shown. After the P+polycrystalline silicon region 133, the N–polycrystalline silicon region 111, and the P–polycrystalline silicon region 110 are formed in the polycrystalline silicon 131 by the steps shown in FIG. 12 to FIG. 15, the insulating film 145 is deposited by the CVC method. Then, the insulating film 145 is patterned by the photolithography method and etching such that it is deposited over the N–polycrystalline silicon region 111 and the P–polycrystalline silicon region 110.

Here, the difference from the steps shown in FIG. 12 to FIG. 15 resides in the film thickness of the polycrystalline silicon 131, which is stall at 1000 Å to 4000 Å. This is to achieve the polycide structure of the gate electrode.

A silicon oxide film is generally used as the insulating film 145, and the thickness thereof is in a range of 1000 Å to 4000 Å. After the deposition of the insulating film 145, it maybe subjected to heat treatment for thirty minutes at a temperature of 900° C. in an electric furnace in order to enhance the closeness of the film.

Figure 60:
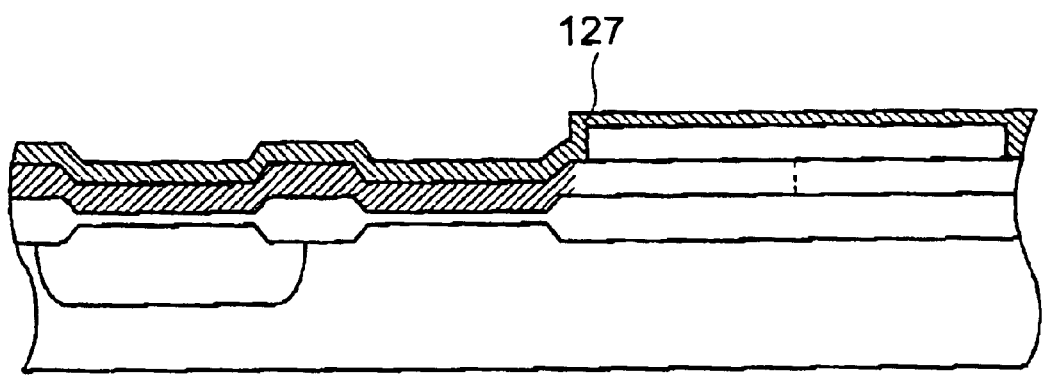
FIG. 60 is a schematic cross sectional view showing the first embodiment of the method of manufacturing the CMOS semiconductor device of the sixth embodiment of the present invention.

Subsequently, as shown in FIG. 60, the high melting point metal is deposited on the P+polycrystalline silicon 133 and the insulating film 145 by a sputtering method or a CVD method. One of molybdenum silicide, tungsten silicide, titanium silicide and platinum silicide is used as the high melting point metal silicide, and the thickness of the high melting point metal silicide is 500 Å to 2500 Å. As for the formation thereof, although there is some fear for potential damages, a sputtering method is generally used from the viewpoint of adhering property of the high melting point metal silicide with the polycrystalline silicon.

Figure 61:
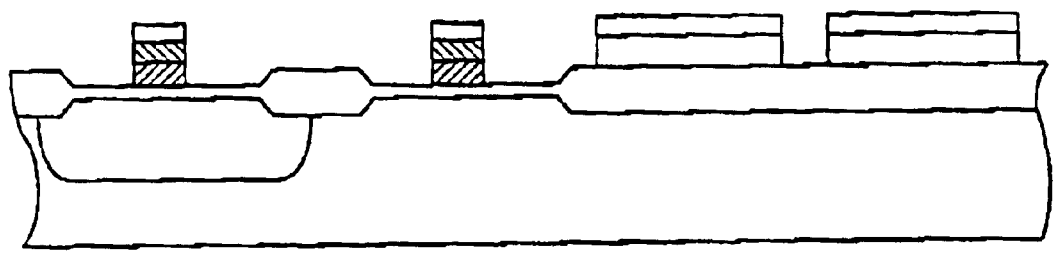
FIG. 61 is a schematic cross sectional view showing the first embodiment of the method of manufacturing the CMOS semiconductor device of the sixth embodiment of the present invention.

Then, as shown in FIG. 61, the photo resist 132 is patterned by the photolithography method so as to open the insulating film 145 and its vicinity, and the high melting point metal silicide is selectively removed by the dry etching method.

Figure 62:
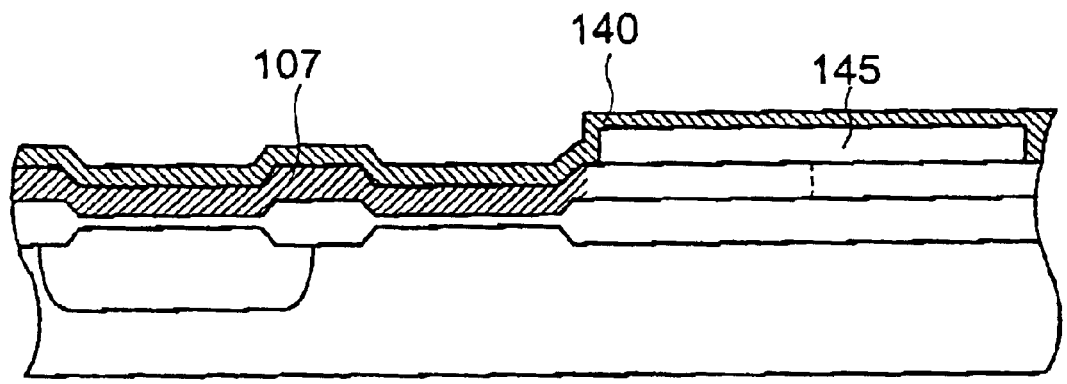
FIG. 62 is a schematic cross sectional view showing the first embodiment of the method of manufacturing the CMOS semiconductor device of the sixth embodiment of the present invention.

Next, the photo resist is removed, and after removing the insulating film 145 on the resistor by wet etching using the HF solution or the like, the insulating film 134 is formed on the high melting point metal silicide 127 and the polycrystalline silicon being the resistor, as shown in FIG. 62. This insulating film has a lamination structure in which the lower layer is a silicon oxide film and the upper layer is a silicon nitride film. The silicon nitride film is formed by a CVD method. Similarly, the nitride film is also formed by the CVD method. The total thickness and the thicknesses of the oxide film and she nitride film are set such that the insulating film 134 functions as a mask for preventing the donor dopant from entering the gate electrode in the formation so she source and drain of the NMOS and that the oxide film as she lower layer of the insulating film 134 does not expose in the formation of the side spacer, which his described later. For example, the thickness of the silicon nitride film is set 2000 Å, and that of the silicon oxide film is set 1000 Å.

Further, in this step heat treatment may be conducted after the insulating film 134 is formed to enhance the closeness of the film.

Figure 63:
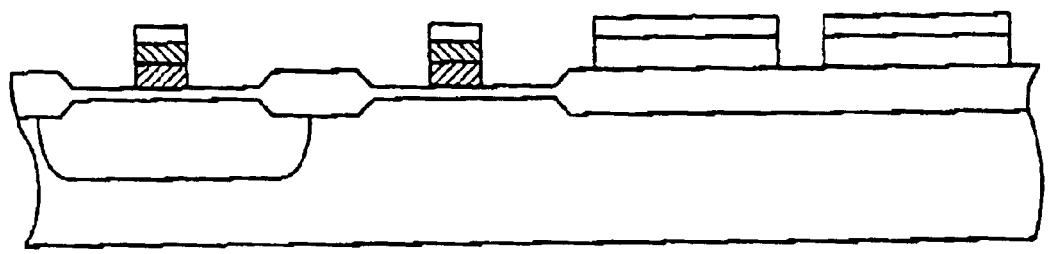
FIG. 63 is a schematic cross sectional view showing the first embodiment of the method of manufacturing the CMOS semiconductor device of the sixth embodiment of the present invention.

Next, as shown in FIG. 63, the insulating film 134, the high melting point metal silicide 127 and the polycrystalline silicon are patterned by the photolithography method and etching to form gate electrodes, wiring and resistors. As to the resistor portion, since the high melting point metal silicide 127 does not exist on the polycrystalline silicon, etching is completed before etching of the gate electrode and wiring regions. However, the base film is the thick field insulating film 106, and thus, no problems occur.

The steps shown in FIG. 36 to FIG. 42 are conducted for the subsequent steps to obtain the structure to the CMOS semiconductor device of the sixth embodiment in FIG. 58.

Figure 64:
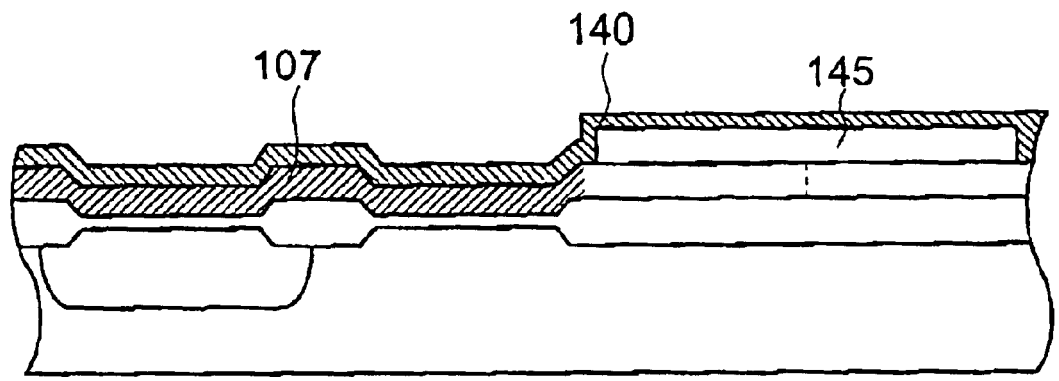
FIG. 64 is a schematic cross sectional view showing a second embodiment of a method of manufacturing the CMOS semiconductor device of the sixth embodiment of the present invention.

In FIG. 64, after the steps through the step of FIG. 59 are conducted, the high melting point metal 140 such as cobalt or titanium is deposited on the P+polycrystalline silicon 107 and the insulating film 145 by a sputtering method.

The thicknesses of cobalt and titanium are in a range of 100 Å to 300 Å. In case of cobalt, there may be the case where titanium or titanium nitride is laminated with a thickness of several tens of Å to several hundred of Å.

Figure 65:
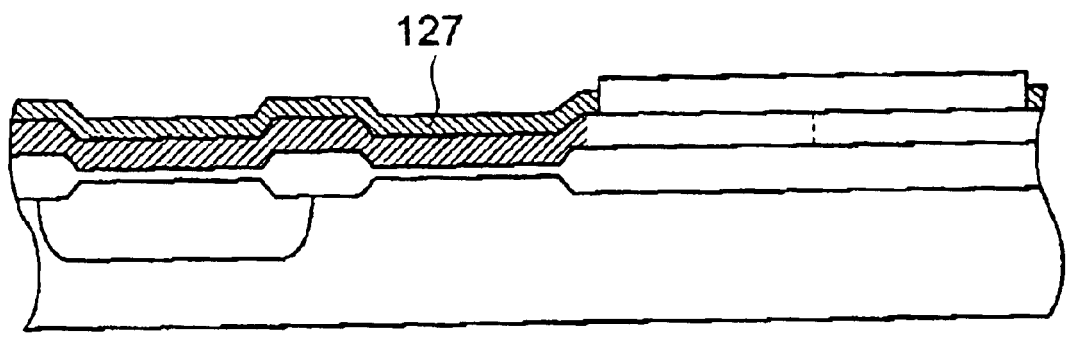
FIG. 65 is a schematic cross sectional view showing the second embodiment of the method of manufacturing the CMOS semiconductor device of the sixth embodiment of the present invention.

Next, heat treatment is performed at 600° C. to 750° C. for several tens of seconds to one minute by, for example, the rapid thermal process (RTP) to silicide the portion of the high melting point metal which contacts the polycrystalline silicon. Then, the high melting point metal that does not react on the insulating film 145 is selectively removed by, for example, a mixed solution of hydrogen peroxide and ammonia or a mixed solution of sulfuric acid and hydrogen peroxide. The state is shown in FIG. 65.

Figure 66:
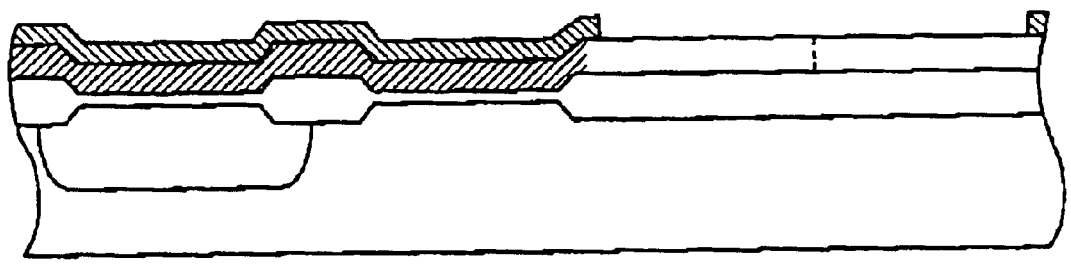
FIG. 66 is a schematic cross sectional view showing the second embodiment of the method of manufacturing the CMOS semiconductor device of the sixth embodiment of the present invention.

Next, the RTP is conducted at 700° C. to 900° C. for several tens of seconds. Thereafter, the insulating film 145 on the polycrystalline silicon resistor is removed by etching with the HF solution. Thus, the structure shown in FIG. 66 can be obtained.

In the second embodiment, it Is possible to left the high melting point metal silicide on the gate electrode and wiring regions in a self-aligning manner in comparison with the above-described embodiments. Thus, the second embodiment has an advantage that the photolithography step can be reduced in comparison with the above-described embodiments.

Through the same steps as in the manufacturing method shown in the step of FIG. 62 and the subsequent steps, the structure of the CMOS semiconductor device of the sixth embodiment in FIG. 58 can be obtained.

Also, the above-described method of forming the high melting point metal silicide electrode in the gate electrode and wiring regions in a self-aligning manner and the method of simultaneously doping the impurity in the low concentration regions of the NMOS and the PMOS and the resistor region of the polycrystalline silicon region are combined, whereby the structure of the CMOS semiconductor device of the sixth embodiment in FIG. 58 can be obtained. In this case, the further reduction of the step is possible, which leads to remarkable improvement of the manufacturing period and the manufacturing cost.

Further, in the method of manufacturing the CMOS semiconductor device of the sixth embodiment, in the state of FIG. 59, after the N−polycrystalline silicon region 111, the P−polycrystalline silicon region 110 and the P+polycrystalline silicon region 107 are formed into the polycrystalline silicon, which corresponds to the steps of FIG. 12 to FIG. 15, the insulating film 145 is deposited and patterned. However, the following possible. That is, the above step order is changed. After the N−polycrystalline silicon region 111 and the P−polycrystalline silicon region 110 are formed, the insulating film 145 is patterned as shown in FIG. 59. Thereafter, the P+region 107 is formed into the polycrystalline silicon using the patterned insulating film 145 as a mask. In this case, the masking step is reduced, which is advantageous in terms of the manufacturing period and cost.

Figure 67:
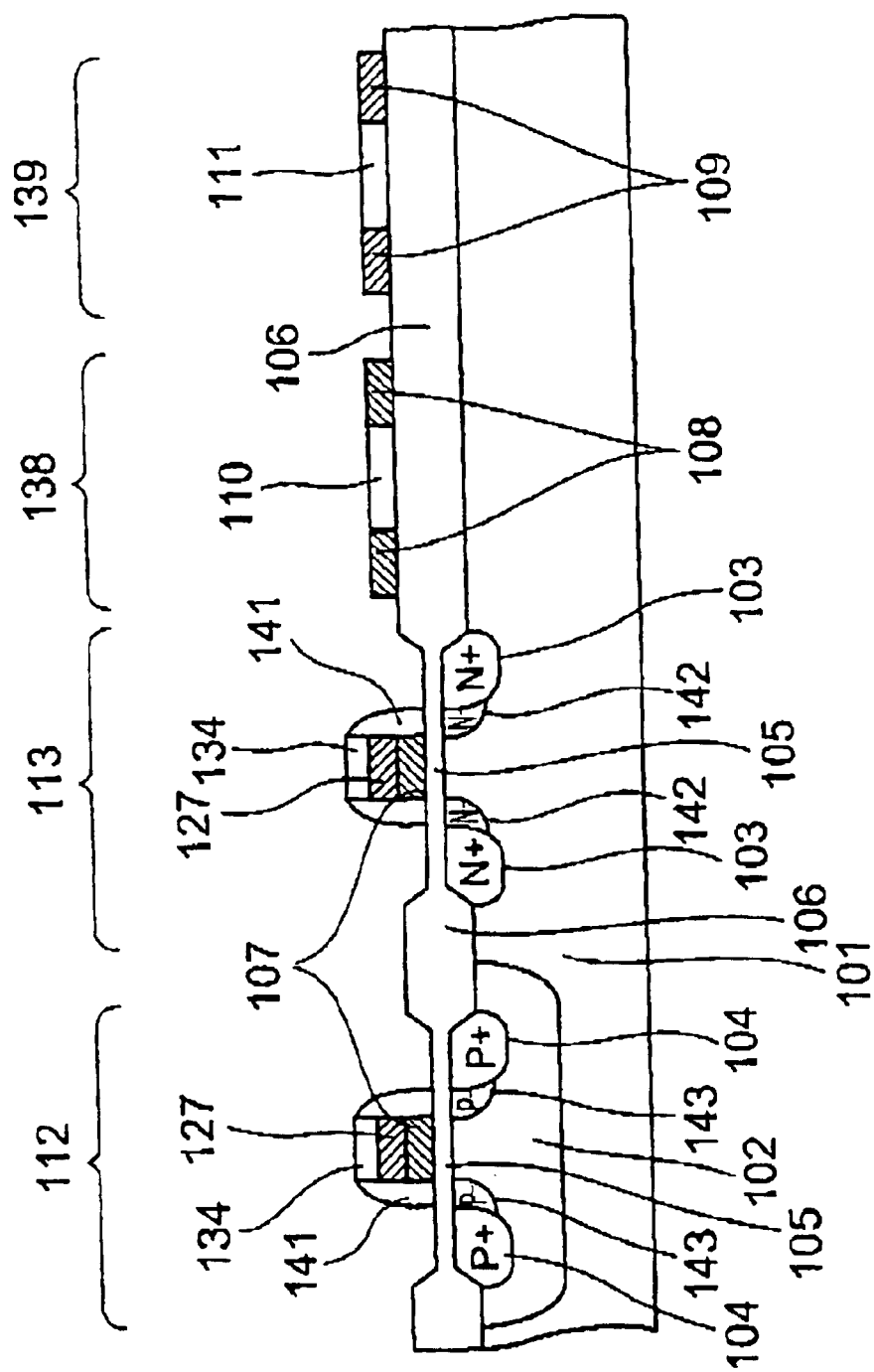
FIG. 67 is a schematic cross sectional view showing a CMOS semiconductor device in accordance with a seventh embodiment of the present invention.

FIG. 67 is a schematic cross sectional view of a CMOS semiconductor device of a seventh embodiment of the present invention.

The CMOS semiconductor device is constituted of a CMOS composed of the NMOS 113, in which the gate electrode formed on the P-type semiconductor substrate 101 has a lamination structure of the high melting point metal silicide 127 and the P+polycrystalline silicon 107 and the source and the drain have the LDD structure, and the PMOS 112 with the LDD structure, in which the gate electrode formed on the N-well region 102 has a polycide structure of the lamination structure of the high melting point metal silicide 127 and the P+polycrystalline silicon 107, and the P−resistor 138 and the N−resistor 139 formed of the thin film polycrystalline silicon which are formed on a P-type semiconductor substrate 101.

The reason for adoption is for the minuteness and improvement of the reliability as in the CMOS semiconductor device of the fourth embodiment in FIG. 35. The reason the resistor is formed of the thin film polycrystalline silicon is for the resistance precision as in the fifth embodiment.

However, the CMOS structure that is the basis of the present invention is the P+gate electrode. Thus, the effect on the low voltage operation and low power consumption is the same as in the above-described embodiments.

The CMOS semiconductor device of the seventh embodiment of the present invention in FIG. 67 is formed by conducting the combination of the methods of manufacturing the CMOS semiconductor device of the third to sixth embodiments, for example, the combination of the steps of FIG. 23 to FIG. 26 and the steps of FIG. 48 to FIG. 57.

Figure 68:
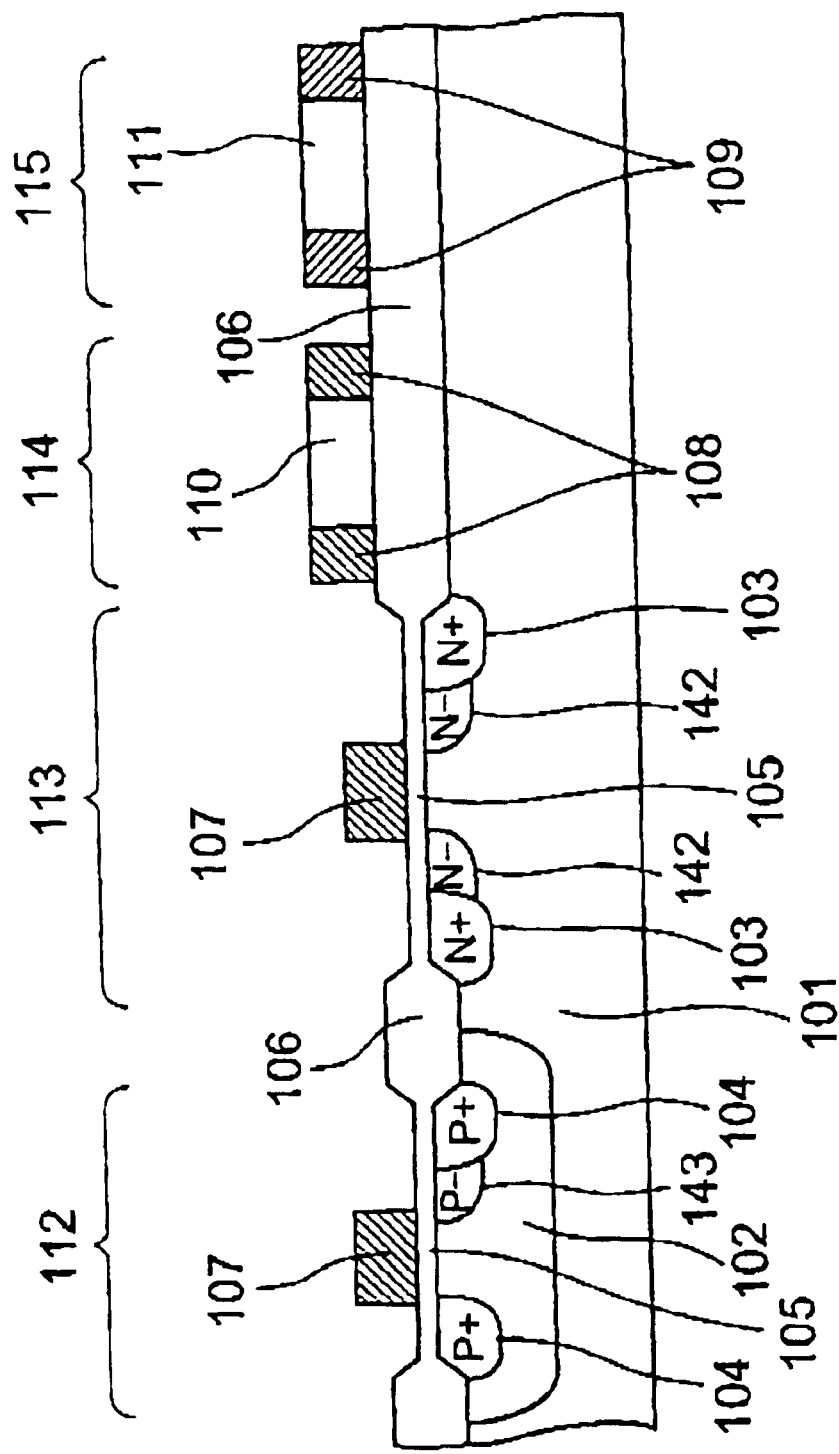
FIG. 68 is a schematic cross sectional view showing a CMOS semiconductor device in accordance with an eighth embodiment of the present invention.

FIG. 68 is a schematic cross sectional view of a CMOS semiconductor device of an eighth embodiment of the present invention.

The gate electrode has the CMOS with the single polarity of the P+polycrystalline silicon and the P−resistor 113 and the N−resistor 115 which are formed of the polycrystalline silicon of the same layer as the gate electrode, which are the basis of the present invention.

The CMOS semiconductor device of this embodiment has the effects of the low voltage operation, low power consumption and low cost as in the above-described embodiments. Further, the CMOS semiconductor device has a so-called drain extension MOS structure in which a source and a drain or only a drain is the diffusion layers N-142 or the diffusion layer P-143, in which the impurity concentration is low, and a source and a drain or only a drain is the diffusion layers N+103 or the diffusion layers P+104, in which the impurity concentration is high, for the purpose of attaining improvement of the modulation of the channel length in an analog circuit, suppression or the reduction of the reliability due to hot carriers, and improvement of the drain withstand voltage. This structure is for coping with a VD and a VR with high input voltage and a boosting type SWR with high output voltage.

The distance from the gate electrode to the diffusion layer at high impurity concentration that is formed away from the gate electrode, that is, the offset length is generally 0.5 $\mu$m to several $\mu$m although depending on the voltage input to the semiconductor device. In FIG. 68, the offset structure is adopted for one side of the PMOS 112 while both sides of the NMOS 113 take the offset structure. However, as to the PMOS, an appropriate structure for an element circuit can be selected in accordance with the usage of the circuit irrespective of the conductivity type of the MOS transistor. Normally, in the case where a current direction is a bidirection and a source and a drain are changed depending on circumstances so that a withstand voltage is needed in both directions, both the source and the drain take the offset structure. On the other hand, in the case where the current direction is one direction and the source and the drain are fixed, only the drain takes the offset structure for the reduction of parasitic capacitance.

Next, a method of manufacturing the CMOS semiconductor device of the eighth embodiment or the present invention in FIG. 68 is described with reference to the accompanying drawings.

Figure 69:
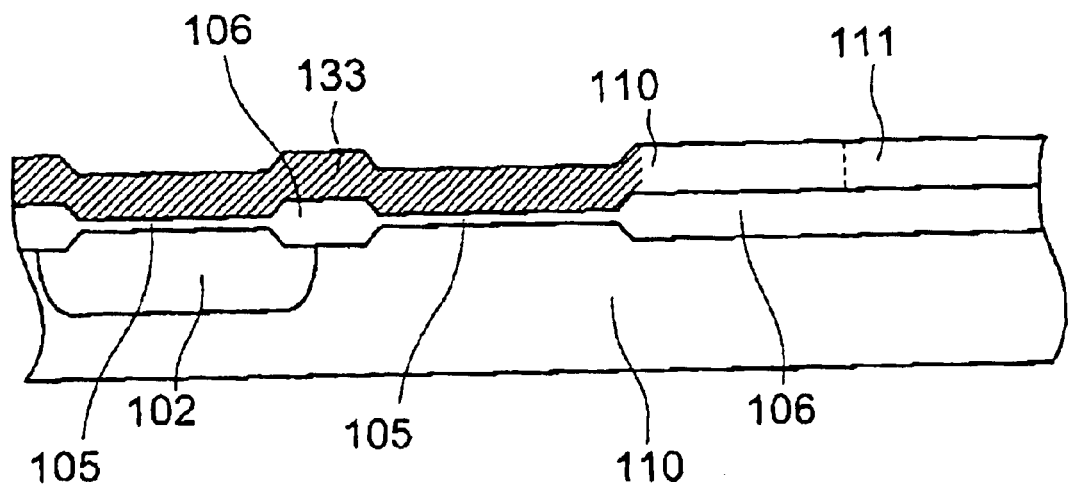
FIG. 69 is a schematic cross sectional view showing a first embodiment of a method of manufacturing the CMOS semiconductor device of the eighth embodiment of the present invention.

The steps shown in FIG. 12 to FIG. 15 are conducted to obtain the structure shown in FIG. 69.

FIG. 68 is a schematic cross sectional view of a CMOS semiconductor device of a eighth embodiment of the present invention.

The gate electrode that is the basis of the present invention has the CMOS with the single electrode of the P+polycrystalline silicon and the P−resistor 113 and the N−resistor 115 which are formed of the polycrystalline silicon of the same layer as the gate electrode.

The CMOS semiconductor device of this embodiment has the effects of the low voltage operation, low power consumption and low cost as in the above-described embodiments. Further, the CMOS semiconductor device has a so-called drain extension MOS structure in which a source and a drain or only a drain is the diffusion layers N-142 or the diffusion layer P-143, in which the impurity concentration is low and a source and a drain or only a drain is the diffusion layers N+103 or the diffusion layers P+104, in which the impurity concentration is high, for the purpose of attaining improvement of the modulation of the channel length in an analog circuit, suppression of the reduction of the reliability due to hot carriers, and improvement of the drain withstand voltage. This structure is or coping with a VD and a VR with high input voltage and a boosting type SWR with high output voltage.

The distance from the gate electrode to the diffusion layer at high impurity concentration that is formed away from the gate electrode, that is, the offset length is generally 0.5 µm to several µm although depending on the voltage input to the semiconductor device. In FIG. 68, the offset structure is adopted for one side of the PMOS 112 while both sides of the NMOS 113 take the offset structure. However, as to the PMOS, an appropriate structure for an element circuit can be selected in accordance with the usage of the circuit irrespective of the conductivity type of the MOS transistor. Normally, in the case where a current direction is a bidirection and a source and a drain are changed depending on circumstances so that a withstand voltage is needed in both directions, both the source and the drain take the offset structure. On the other hand, in the case where the current direction is one direction and the source and the drain are fixed, only the drain takes the offset structure for the reduction of parasitic capacitance.

Next, a method of manufacturing the semiconductor device of the eighth embodiment of the present invention in FIG. 68.

The stems shown in FIG. 12 to FIG. 15 are conducted to obtain the structure shown in FIG. 69.

Figure 70:
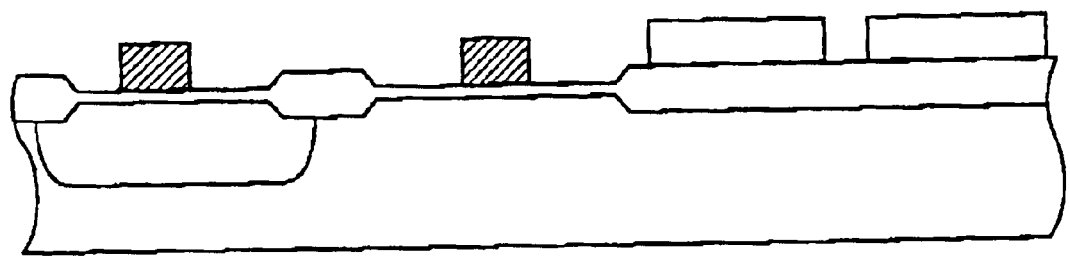
FIG. 70 is a schematic cross sectional view showing the first embodiment of the method of manufacturing the CMOS semiconductor device of the eighth embodiment of the present invention.

Then, as shown in FIG. 70, the polycrystalline silicon 131 is patterned by the photolithography method and etching to form gate electrodes, wiring and resistors.

In the so-called mask offset CMOS structure in FIG. 70, a mask of the photo resist to the gate electrode is possible in the formation of the source and drain at high concentration, and thus, the donor impurity at high concentration can be prevented from being introduced into the gate electrode of the NMOS. Therefore, the formation of the insulating film on the polycrystalline silicon 131, which is needed in the method of manufacturing the CMOS semiconductor device of the first to seventh embodiments, is not required.

Figure 71:
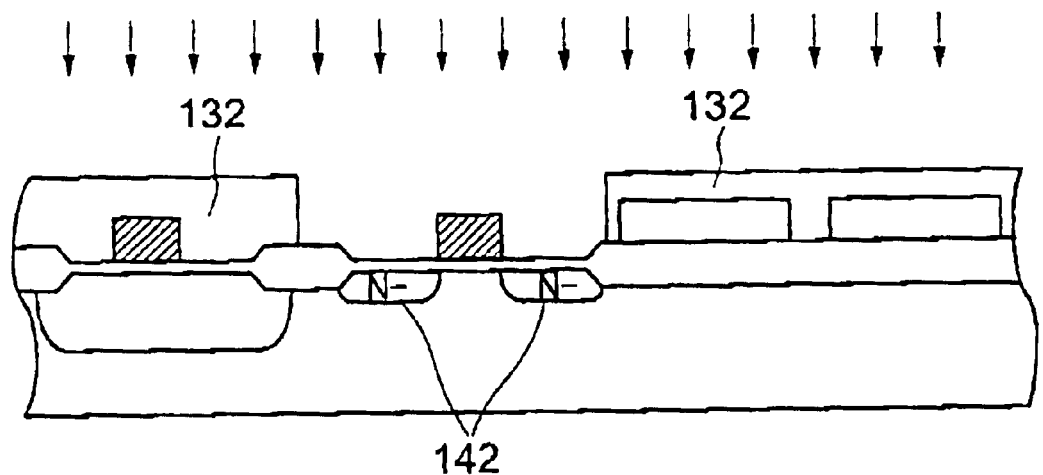
FIG. 71 is a schematic cross sectional view showing the first embodiment of the method of manufacturing the CMOS semiconductor device of the eighth embodiment of the present invention.

Next, as shown in FIG. 71, the photo resist 132 is patterned so as to open the NMOS by the photolithography method. Then, the donor such as phosphorous or arsenic is introduced into the P-type substrate at low concentration by the ion injection method, and the N−regions 142, which correspond to the source and the drain at low concentration of the NMOS are formed.

The impurity concentration depends on the operation voltage of the semiconductor product, but the dose amount is generally $10^{12}$ atoms/cm$^2$ to $10^{14}$ atoms/cm$^2$. The concentration is $10^{16}$ atoms/cm$^3$ to $10^{18}$ atoms/cm$^3$ in this case.

It is necessary to mask the gate electrode by the photo resist and introduce the impurity in the formation of the source and drain at high concentration in the NMOS as described above. Thus, in the step of FIG. 71, the donor impurity at low concentration needs to be introduced into both the source and the drain. At this time, the donor impurity is also introduced into the P+polycrystalline silicon gate electrode of the NMOS. However, since the order of the donor impurity differs, the working function and the resistance value of the gate electrode are not influenced.

Further, there may be the case where the acceptor impurity is introduced with relatively high energy using the same photo resist pattern as a mask by the ion injection method to provide a so-called P-type pocket at the lower portion of the N-low concentration region 142.

Next, after the photo resist is removed, the photo resist 132 is patterned so as to open the PMOS by the photolithography method. Then, the acceptor such as boron or BF$_2$ is introduced into the N-well at low concentration by the ion injection method, and the P−regions 143, which correspond to the source and the drain at low concentration of the PMOS are formed.

Figure 72:
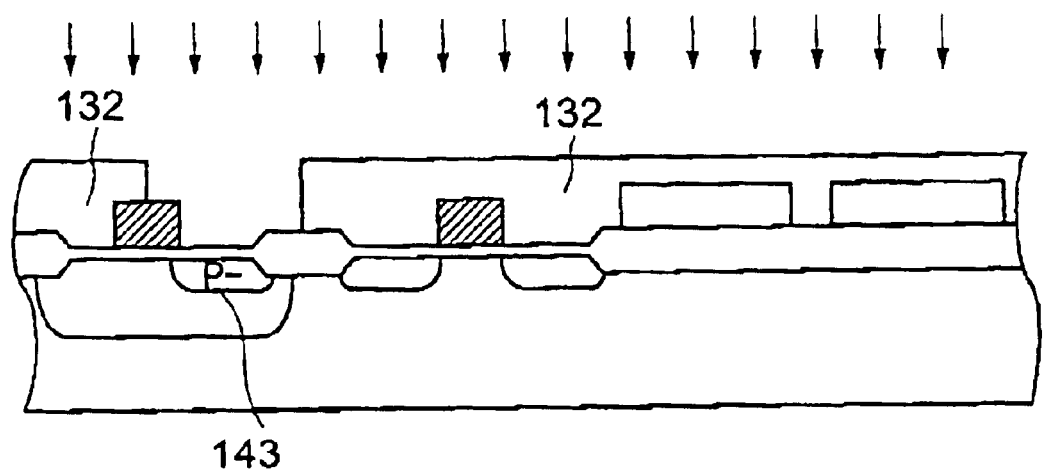
FIG. 72 is a schematic cross sectional view showing the first embodiment of the method of manufacturing the CMOS semiconductor device of the eighth embodiment of the present invention.

In FIG. 72, the P−region is formed for one side of the PMOS, that is, only the drain side. However, as described above, the P−regions may be formed for both the source and the drain in accordance with the usage of the circuit of the PMOS.

Further, in this step, there may be the case where the donor impurity is introduced with relatively high energy by the ion injection method to provide a so-called N-type pocket at the lower portion of the P-low concentration region 143 as in the step of FIG. 71.

Figure 73:
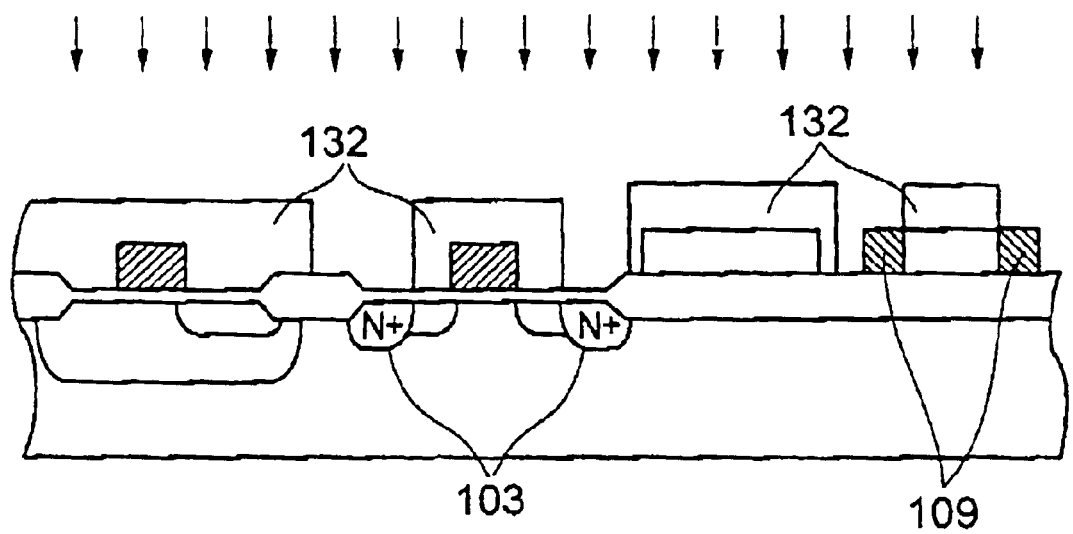
FIG. 73 is a schematic cross sectional view showing the first embodiment of the method of manufacturing the CMOS semiconductor device of the eighth embodiment of the present invention.

Next, after the photo resist 132 is peeled, as shown in FIG. 73, the photo resist 132 is patterned so as to open the portions of the NMOS and the N-type resistor, which are to be contacted with the wiring metal, by the photolithography method. Then, the donor such as phosphorous or arsenic is introduced into the P-type substrate and the N-type resistor at high concentration by the ion injection method, and the N+regions 103, which correspond to the source and the drain of the NMOS, and the N+polycrystalline silicon region 109 are formed.

Arsenic having a small diffusion coefficient with which a shallow source and a shallow drain are obtained is generally used as impurities. The dose amount is $1\times10^{15}$ atoms/cm$^2$ or more in order to attain low resistance as much as possible, and the concentration is $1\times10^{19}$ atoms/cm$^3$ or more in this case.

Further, since the photo resist is provided on the gate electrode of the NMOS in this case, the donor does not enter the P+gate electrode of the NMOS. Thus, the working function and the resistance value do not change.

At this time, the photo resist is patterned so as to mask parts of the source and the drain, which are adjacent to the gate electrode, and the mask width is generally 0.5 µm to several µm as described above. However, the photo resist is provided on the source side, which does not need consideration of hot carriers and channel length modulation, for the purpose of only masking the gate electrode. Therefore, it is only necessary to make the photo resist project from the gate electrode only by an alignment error value of an aligner that is used in the photolithography method at this time. For example, the mask width suffices at approximately 0.3 µm.

Figure 74:
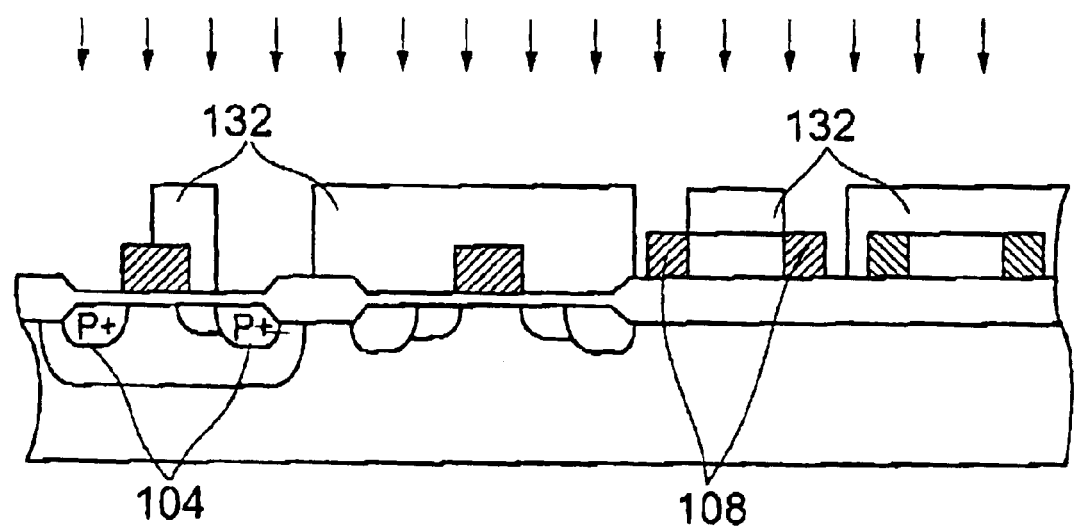
FIG. 74 is a schematic cross sectional view showing the first embodiment of the method of manufacturing the CMOS semiconductor device of the eighth embodiment of the present invention.

Next, after the photo resist is peeled, and after heat treatment for activation of the impurity is conducted if necessary, as shown in FIG. 74, the photo resist 132 is patterned so as to open the portions of the PMOS and the P-type resistor, which are to be contacted with the wiring metal, by the photolithography method. Then, the acceptor such as BF$_2$ or boron is introduced into the N-well and the P-type resistor at high concentration by the ion injection method, and the P+regions 104, which correspond to the source and the drain of the PMOS, and the P+polycrystalline silicon region 108 are formed. Since the resistance is made low as much as possible as in the NMOS, the dose amount is $1 \times 10^{15}$ atoms/cm$^2$ or more, and the concentration is $1 \times 10^{19}$ atoms/cm$^3$ or more in this case.

Through the above-described steps, the structure of the CMOS semiconductor device of the eighth embodiment in FIG. 68 can be obtained.

Figure 75:
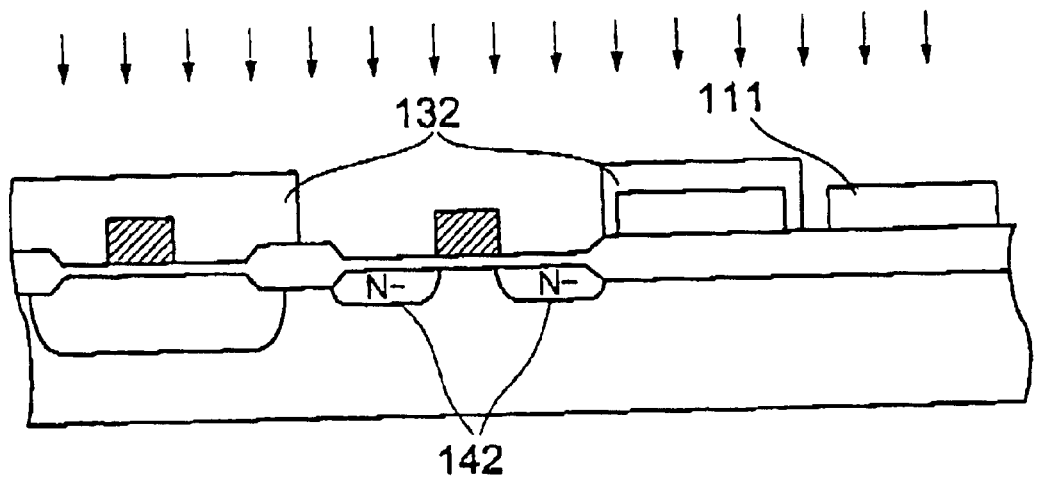
FIG. 75 is a schematic cross sectional view showing a second embodiment of a method of manufacturing the CMOS semiconductor device of the eighth embodiment of the present invention.
Figure 76:
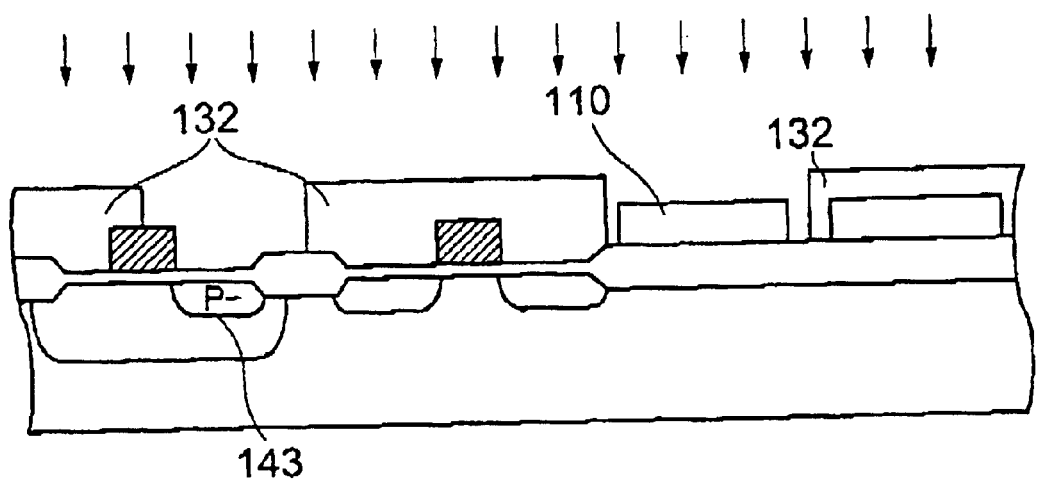
FIG. 76 is a schematic cross sectional view showing the second embodiment of the method of manufacturing the CMOS semiconductor device of the eighth embodiment of the present invention.

A second embodiment of a method of manufacturing the CMOS semiconductor device of the eighth embodiment in FIG. 68 is shown in FIG. 75 and FIG. 76.

In the manufacturing method shown in FIG. 12 to FIG. 15, without forming the N–polycrystalline silicon 111 in FIG. 13 and forming the P–polycrystalline silicon 110 in FIG. 15, patterning of the polycrystalline silicon shown in FIG. 70 is conducted to form the regions to be gate electrodes, wiring and resistors. Thereafter, as shown in FIG. 75, the photo resist 132 is patterned so as to open the portions to be the NMOS and the N-type resistor. Then, the donor such as phosphorous or arsenic is introduced into the P-type semiconductor substrate and the polycrystalline silicon at low concentration by the ion injection method, and the N–regions 142, which correspond to the source and the drain at low concentration of the NMOS, and the N–polycrystalline silicon 111 to be the N-type resistor are simultaneously formed.

The impurity concentrations or the low concentration offset source and drain regions of the NMOS and the N-type polycrystalline silicon resistor are relatively close to each other. Thus, the simultaneous formation described above is possible depending on the specification of the product.

After the photo resist is removed, as shown in FIG. 76, the photo resist 132 is patterned so as to open the portions to be the PMOS and the P-type resistor as in FIG. 75. Then, the acceptor such as boron or BF$_2$ is introduced into the N-well and the polycrystalline silicon at low concentration by the ion injection method, and the P–regions 113, which correspond to the source and the drain at low concentration of the PMOS and the P–polycrystalline silicon 110 to be the P-type resistor are formed.

The same steps in the manufacturing method shown in FIG. 73 and FIG. 74 are conducted for the subsequent steps to obtain the structure of the CMOS semiconductor device of the eighth embodiment in FIG. 68. In accordance with the second manufacturing method of the present invention described above, the masking step can be reduced, which is advantageous in terms of cost and a manufacturing period.

Further, in the description of the method of manufacturing the CMOS semiconductor device of the eighth embodiment described above, the low concentration diffusion region of the MOS is formed before the formation of the high concentration diffusion region with respect to both the NMOS and the PMOS. However, the structure of the CMOS semiconductor device of the eighth embodiment in FIG. 68 can be obtained even when the high concentration diffusion region is formed before the formation of the low concentration diffusion region. The effect of the semiconductor device is completely the same.

Figure 77:
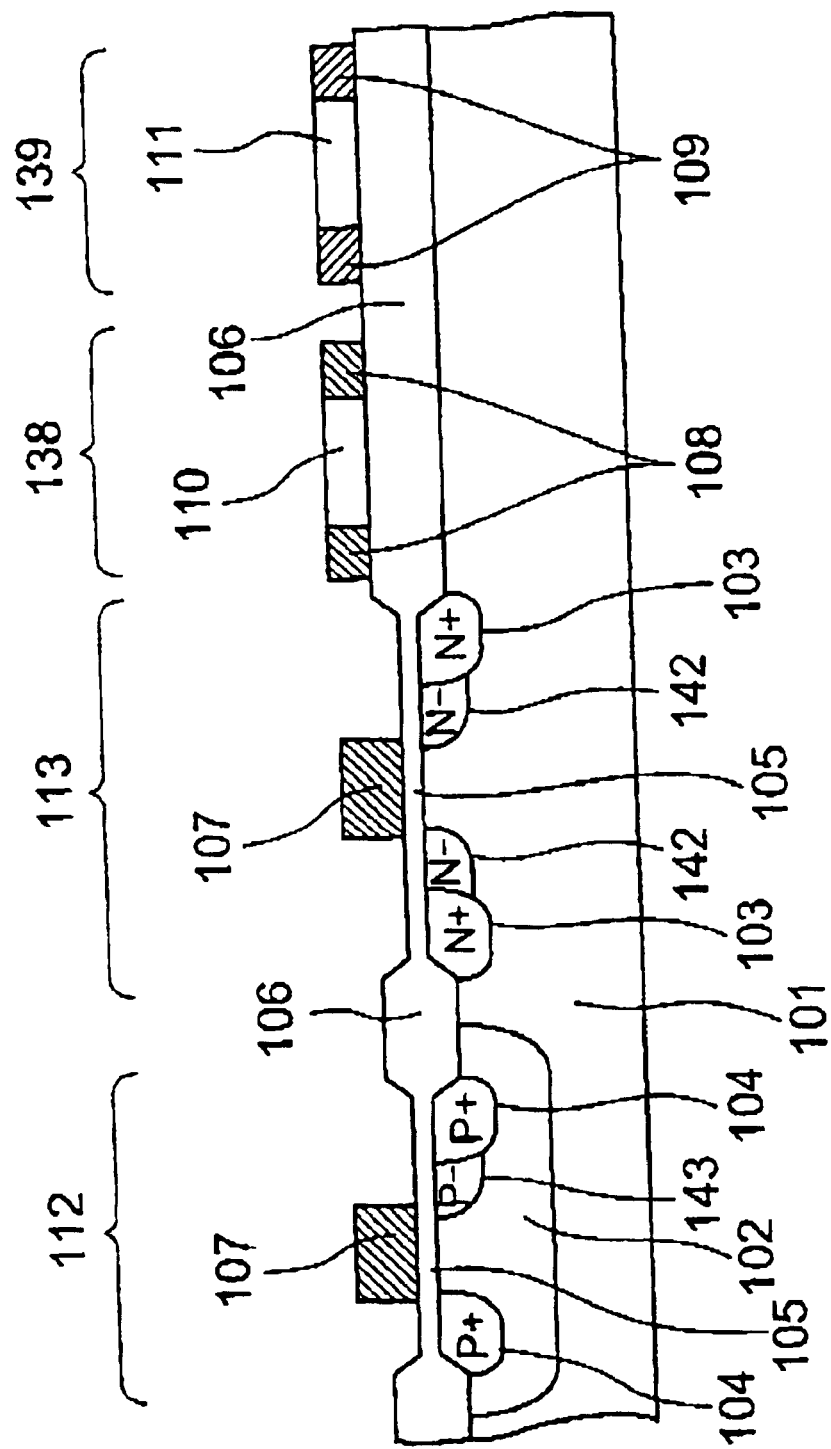
FIG. 77 is a schematic cross sectional view showing a CMOS semiconductor device in accordance with a ninth embodiment of the present invention.

FIG. 77 is a schematic cross sectional view of a CMOS semiconductor device of a ninth embodiment of the present invention.

The gate electrode has the CMOS with the single polarity of the P+polycrystalline silicon 107 and the P–resistor 138 and the N–resistor 139 which are formed of the polycrystalline silicon thinner than that of the gate electrode, which are the basis of the present invention.

The MOS has a drain extension structure for the purpose of attaining improvement of the modulation of the channel length, suppression of the reduction of the reliability due to hot carriers, and improvement of the drain withstand voltage, and the resistor is thinned with the purpose of improving precision. However, the semiconductor device of this embodiment has the effects of the low voltage operation, low power consumption and low cost as in the above-described embodiments.

Next, a method of manufacturing the CMOS semiconductor device of the ninth embodiment of the present invention in FIG. 77 is described with reference to the drawings.

Figure 78:
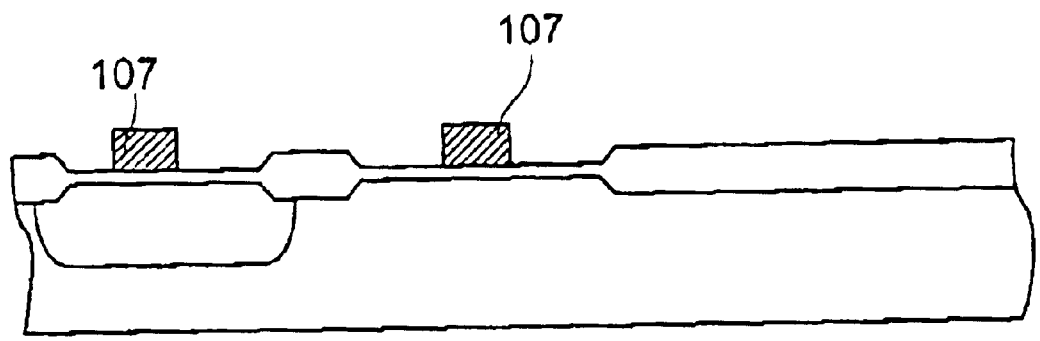
FIG. 78 is a schematic cross sectional view showing a method of manufacturing the CMOS semiconductor device of the ninth embodiment of the present invention.

Among the steps through the step shown in FIG. 46, the step of providing the insulating film 134 on the P+polycrystalline silicon 133 is omitted, and the P+polycrystalline silicon 133 is patterned by the photolithography method and dry etching. Thus, the structure shown in FIG. 78 is obtained. The reason the insulating film 134 is unnecessary is that the resist is used as a mask for preventing the donor from entering the P+polycrystalline silicon gate electrode.

The thickness of the P+polycrystalline silicon 133 is 2000 Å to 6000 Å since the gate electrode is formed of the polycrystalline silicon single layer.

Figure 79:
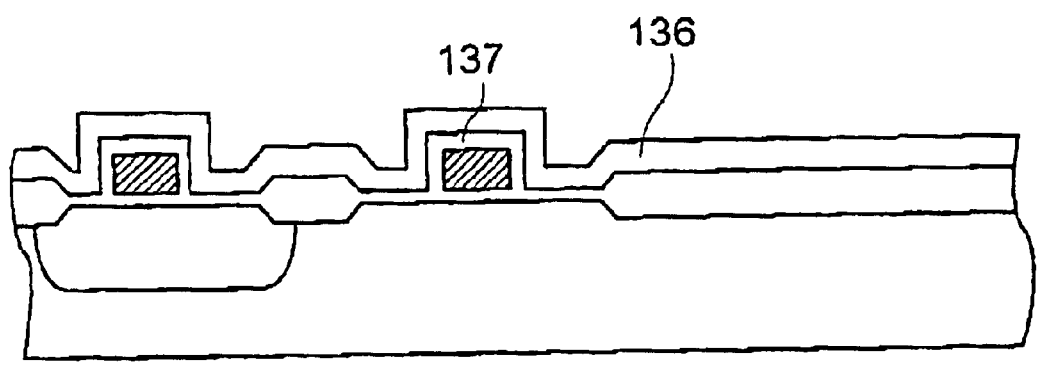
FIG. 79 is a schematic cross sectional view showing the method of manufacturing the CMOS semiconductor device of the ninth embodiment of the present invention.

Next, as shown in FIG. 79, after the insulating film 137 is formed, the thin film polycrystalline silicon 136 is deposited.

The insulating film 137 is, for example, an oxide film with a thickness of several hundred of Å by a thermal oxidization method or an oxide film with a thickness of several hundred of Å by a CVD method.

The thin film polycrystalline silicon 136 is formed by the CVD method or a sputtering method in which a deposition temperature is lowered.

The resistor is formed by using the polycrystalline silicon thinner than the polycrystalline silicon used for the gate electrode and wiring. Thus, the precision of the resistance value can be sufficiently kept even though the sheet resistance value of the resistor is set high to several kΩ/square to several tens of kΩ/square.

Figure 80:
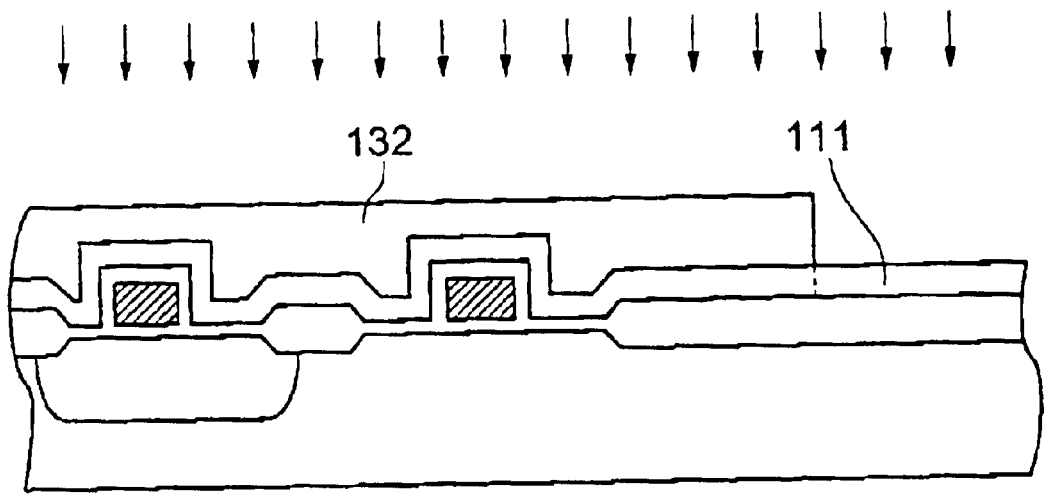
FIG. 80 is a schematic cross sectional view showing the method or manufacturing the CMOS semiconductor device of the ninth embodiment of the present invention.

Next, as shown in FIG. 80, the photo resist 132 is patterned so as to open the portion to be the N-type resistor by the photolithography method, and phosphorous or arsenic as the donor impurity is selectively introduced into the thin film polycrystalline silicon 136 by the ion injection method.

There may be the case where the ion injection of the acceptor dopant at low concentration is conducted into the entire surface of the thin film polycrystalline silicon in the later step as described later. However, the dose amount is set such that the conductivity type is N-type and the concentration is in a certain range even after the ion injection. The dose amount is generally in a range of $10^{14}$ atoms/cm$^2$ to $10^{15}$ atoms/cm$^2$, and the net concentration is approximately $1 \times 10^{14}$ atoms/cm$^3$ to $9 \times 10^{18}$ atoms/cm$^3$. The sheet resistance value is several kΩ/square to several tens of kΩ/square. It is necessary to set the sheet resistance value to the above value in order to set a consumption current in the voltage dividing circuit due to resistance to at least μA or less.

Further, there may be the case where high resistance of the N-type polycrystalline silicon is unnecessary depending on the circuit or product. In this case, the step shown in FIG. 80 is omitted.

Figure 81:
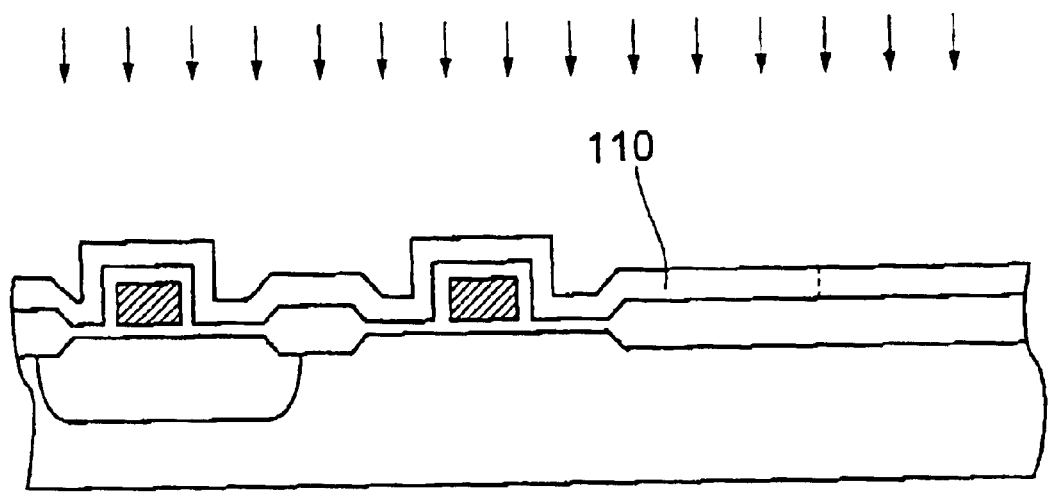
FIG. 81 is a schematic cross sectional view showing the method of manufacturing the CMOS semiconductor device of the ninth embodiment of the present invention.

Next, after the photo resist 132 is peeled, as shown in FIG. 81, boron or BF$_2$ as the acceptor impurity is introduced into the entire thin film, polycrystalline silicon 136 by the ion injection method to form a P-type resistor region.

The dose amount is generally in a range of $10^{14}$ atoms/cm$^2$ to $10^{15}$ atoms/cm$^2$, and the net concentration is approximately $1 \times 10^{14}$ atoms/cm$^3$ to $9 \times 10^{18}$ atoms/cm$^3$. The sheet resistance value is several kΩ/square to several tens of kΩ/square. The sheet resistance value is set to the above value in order to set a consumption current in the voltage dividing circuit due to resistance to at least µA or less as in the N-type resistor.

Further, there may be the case where high resistance of the P-type polycrystalline silicon is unnecessary depending on the circuit or product as in the N-type resistor. In this case, the step shown in FIG. 81 is omitted.

The N-type resistor region and the P-type resistor region are formed in the then film polycrystalline silicon 136 through the steps shown in FIG. 80 and FIG. 81. However, this step order is not necessary adopted. The N-type resistor region and the P-type resistor region are similarly formed by exchanging the steps in FIG. 80 and FIG. 81.

Figure 82:
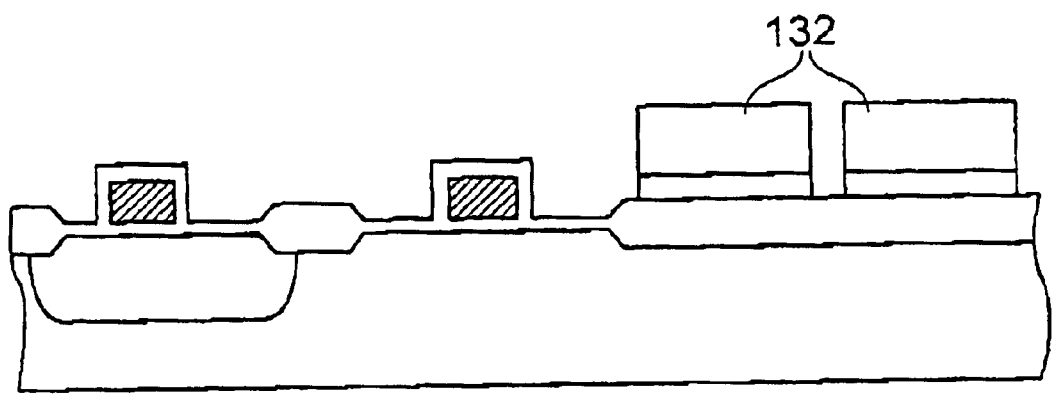
FIG. 82 is a schematic cross sectional view showing the method of manufacturing the CMOS semiconductor device of the ninth embodiment of the present invention.

Next, as shown in FIG. 82, the thin film polycrystalline silicon 136 is patterned by the photolithography method and etching to form the resistor.

Anisotropic dry etching is conducted since precision is required for the processing of the resistor.

The same steps as in the method of manufacturing the CMOS structure of the eighth embodiment shown in the step of FIG. 71 and the subsequent steps are conducted to obtain the structure of the CMOS semiconductor device of the ninth embodiment in FIG. 77.

Figure 83:
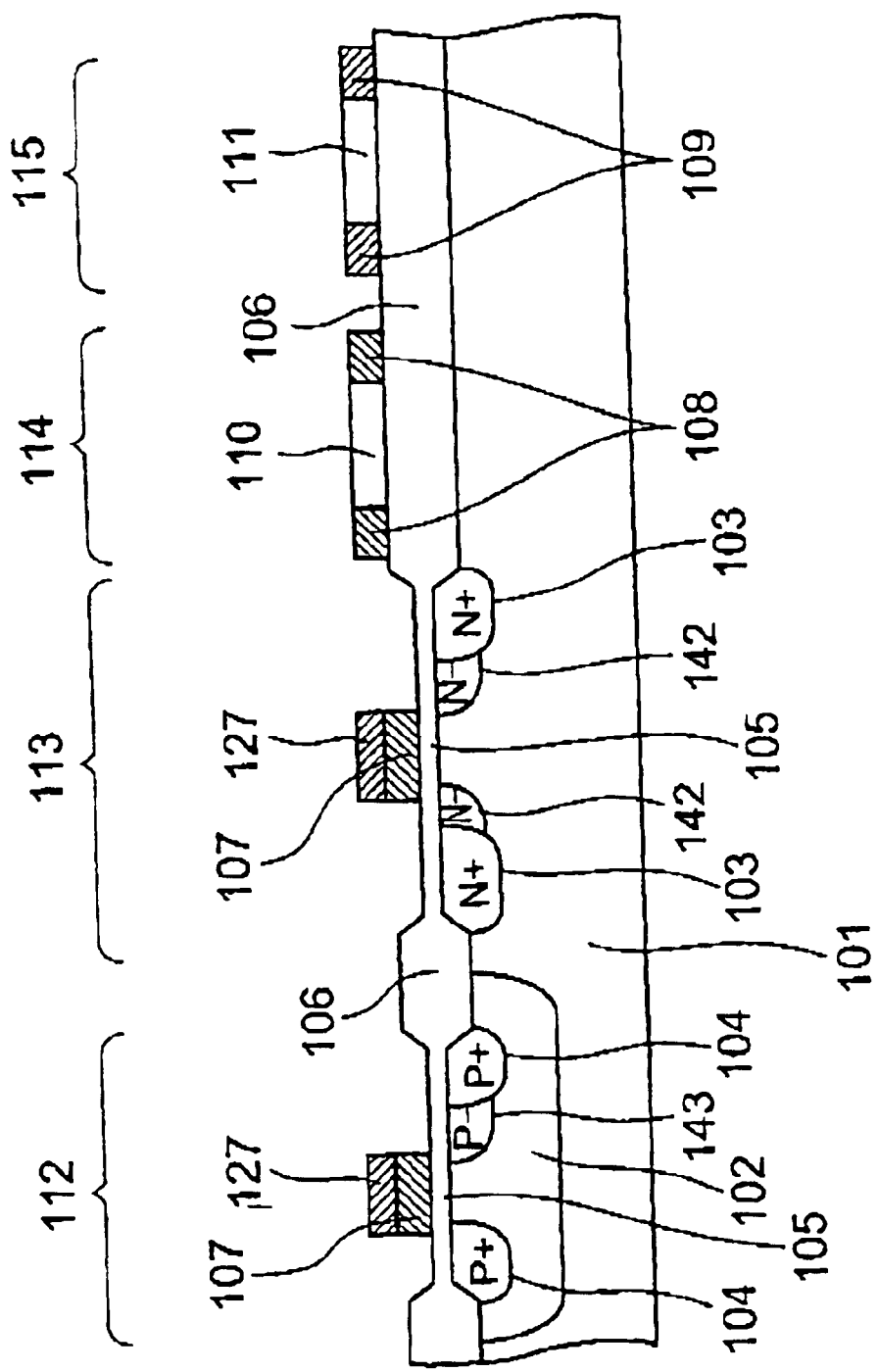
FIG. 83 is a schematic cross sectional view showing a CMOS semiconductor device in accordance with a tenth embodiment of the of present invention.

FIG. 83 is a schematic cross sectional view of a CMOS semiconductor device of a tenth embodiment of the present invention.

The gate electrode has the CMOS constituted of a lamination structure of the P+polycrystalline silicon 107 and the high melting point metal silicide 127, and the P-resistor 114 and the N-resistor 115 which are formed at the polycrystalline silicon of the same layer as the polycrystalline silicon of the lower layer of the gate electrode, which are the basis of the present intention.

For the gate electrodes and the wirings, the polycide structure is employed, which is suitable for enhancing the high-speed operation, and in the MOS structure, a drain extension structure is used for the purpose or attaining the improvement of the modulation of the channel length; suppressing the reduction of the reliability due to hot carriers; and attaining the improvement of the drain withstand voltage. However, as in the above-mentioned embodiment, there are such effects as low voltage operation, low power consumption, and low cost.

Then, description will be made of a manufacturing method of a CMOS semiconductor device in accordance with a tenth embodiment of the present invention with reference to the drawing shown in FIG. 33.

Figure 84:
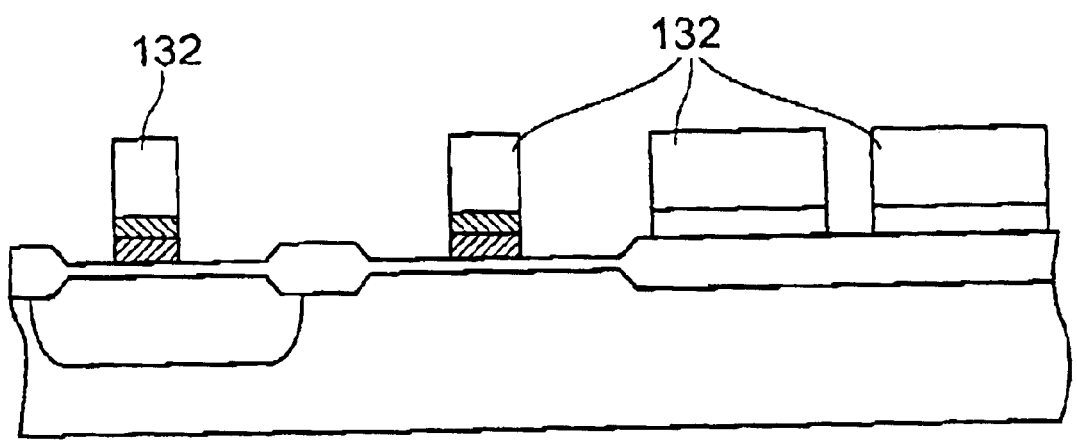
FIG. 84 is a schematic cross sectional view showing a method of manufacturing the CMOS semiconductor device of the tenth embodiment or the present invention.

Among the steps shown in FIGS. 59 to 63, the steps of forming the insulating film 34 on the N-polycrystalline silicon resistor, the P-polycrystalline silicon resistor, and the high melting point metal silicide 127 are omitted. The structure shown in FIG. 84 can be obtained by patterning the polycide structure, which is a lamination layer of the high melting point metal silicide and the polycrystalline silicon, and the resistor region formed of a single layer of polycrystalline silicon, by the photolithography method and by dry etching. The reason why the insulating film 134 is unnecessary, similarly to the manufacturing method in accordance with the ninth embodiment, resides in that the resist may be used as the mask for preventing the donor from entering into the P+gate electrodes.

Regarding the manufacturing steps after being obtained the above-mentioned state, the similar steps as the manufacturing method of the CMOS structure in accordance with the eighth embodiment of the present invention shown in FIG. 71 onwards, may be taken. As a result, as shown in FIG. 83, the structure of the CMOS semiconductor device in accordance with the tenth embodiment of the present invention can be obtained.

Figure 85:
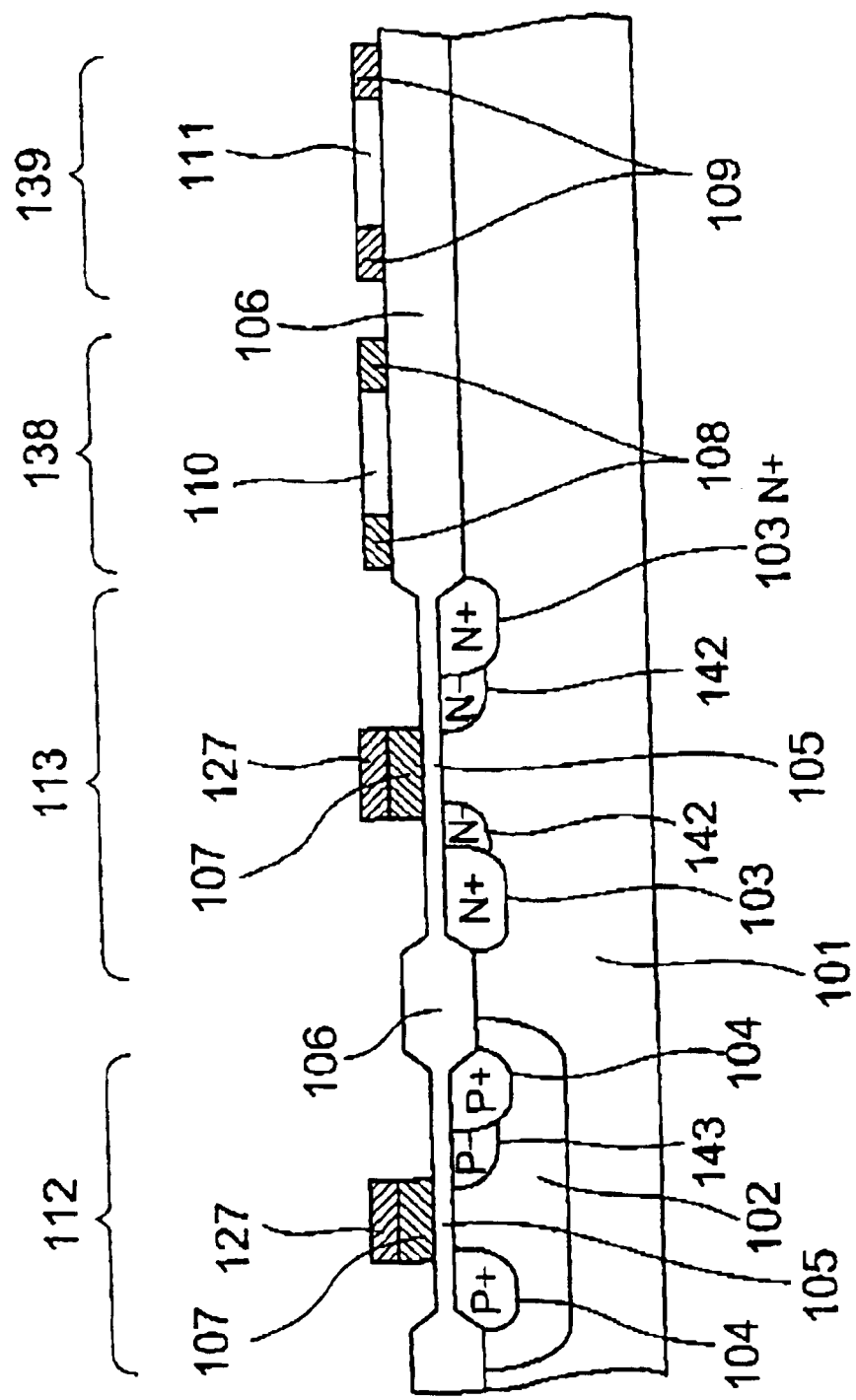
FIG. 85 is a schematic cross sectional view showing a CMOS semiconductor device in accordance with an eleventh embodiment of the present invention.

FIG. 85 is a schematic cross sectional view of a CMOS semiconductor device in accordance with an eleventh embodiment of the present invention. The gate electrode has the CMOS formed of a lamination of P+polycrystalline silicon 107 and the high melting point metal silicide 127, which is the basis of the present invention, and has the P-resistor 138 and the N-resistor 139 which are formed from the polycrystalline silicon and are thinner than the polycrystalline silicon layer which is a lower layer of the gate electrode.

For the gate electrodes and the wirings, the polycide structure is employed, which is suitable for enhancing the high-speed operation, and in the MOS structure, a drain extension structure is used for the purpose of attaining the improvement of the modulation of the channel length; suppressing the reduction of the reliability due to hot carriers; and attaining the improvement of the drain withstand voltage. Further, the resistor is made thinner for the purpose of attaining the improvement of its precision. However, as in the above-mentioned embodiment, there are such effects as low voltage operation, low power consumption, and low cost.

The manufacturing method of a CMOS semiconductor device in accordance with an eleventh embodiment of the present invention can be obtained by appropriately combining the manufacturing methods of the CMOS semiconductor device in accordance with the eighth embodiment to the tenth embodiment of the present invention.

Further, in the CMOS semiconductor device in accordance with the eighth embodiment to the tenth embodiment, the resist can be used as the mask for preventing donor impurities from doping into the P+gate electrode. Therefore, a hard mask material such as the insulating film 134 is not formed on the gate electrode. However, as shown in the first embodiment to the seventh embodiment, the hard mask material can be formed on the gate electrode. In this case, in the drain extension MOS structure, an overlapping of N+ and the gate electrode, in which the source side in NMOS is at high concentration diffusion, can be attained, with the result that parasitic capacitance on the source side can be reduced.

Further, in the manufacturing method for the CMOS semiconductor described in the third, fifth, seventh, ninth, and eleventh embodiments of the present invention, the thin film polycrystalline silicon that become the resistor is formed after the formation of the gate electrode. However, the resistor formed from the thin film polycrystalline silicon may be formed in advance, and the gate electrode may be formed thereafter.

Figure 86:
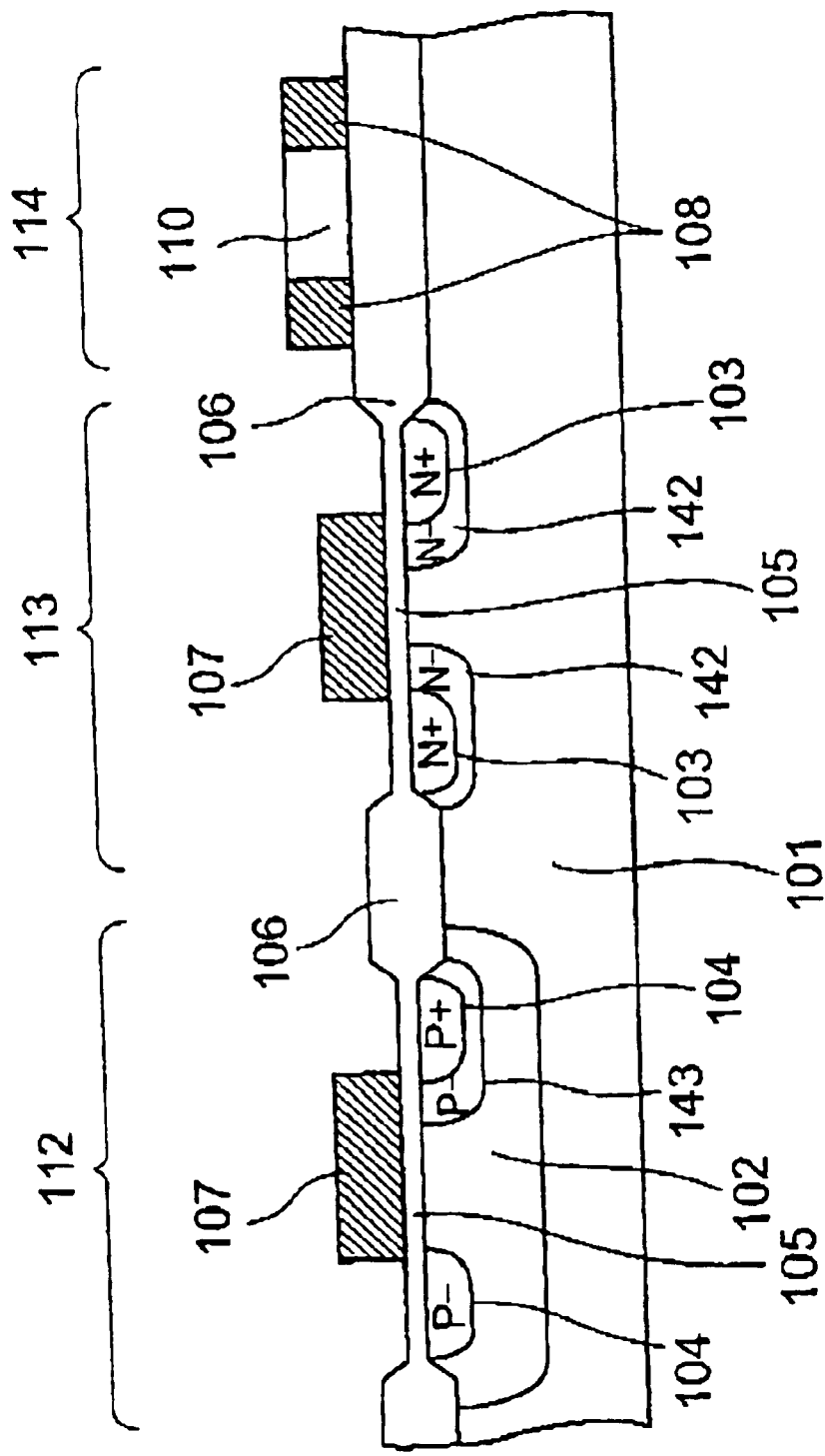
FIG. 86 is a schematic cross sectional view showing a CMOS semiconductor device in accordance with a twelfth embodiment of the present invention.

FIG. 86 is a schematic cross sectional view of a CMOS semiconductor device in accordance with a twelfth embodiment of the present invention. The gate electrode is a CMOS of single electrode consisting of the P+polycrystalline silicon 107, which is a basis of the present invention, and therefore has effects of low voltage operation, low power consumption, and low cost, which are shown in the embodiments described above. However, in this embodiment, a MOS transistor structure constructing of a so-called "double diffused drain (DDD)" structure is employed, in which the diffusion layers N+103 and P+104 with a dense impurity concentration are arranged on both the source and the drain while overlapping with the gate electrode, and on both the source and drain sides, or only the drain side thereof, the diffusion layers N-142 and P-143 with a low impurity concentration are arranged while overlapping with the gate electrode. The DDD structure is employed for the purpose of ensuring the reliability and attaining the improvement of the resistance voltage. However, the diffusion layer with a high impurity concentration overlaps the gate electrode, and therefore there is a merit in that the parasitic capacitance at the time of MOS operation can be reduced so much. However, the DDD structure has such a weak point that the overlapping of the gate with the drain, that is, a mirror capacity is large, with the result that the structure is not suitable for high frequency operation.

In the embodiment shown in FIG. 86, a high withstand voltage structure is provided on only one side of the PMOS 112, and NMOS 113 has the high withstand voltages structure on both sides. However, depending or the use method of the device in a circuit, an appropriate structure or the circuit may be selected notwithstanding of the conductivity type of the MOS transistor. Typically, in the case where current flowing direction is a two-way and the source and the drain are interchanged case by case, in which the withstand voltage is necessary for both directions, the high withstand voltage structure is employed for both the source and the drain. On the other hand, in the case where the current flowing direction is a single direction and the source and the drain are fixed, only one side, that is, only the drain side takes the high withstand voltage structure for the purpose of reducing the parasitic capacitance. Further, in FIG. 86, an example is described, in which a single layer of P+polycrystalline silicon is used as the gate electrode. However, it is possible to use the P+polycide structure as the gate electrode, and similarly, P–resistor, N–resistor, P+resistor, and N+resistor may be optionally, arbitrary selectee to use as the resistor.

The manufacture of the CMOS semiconductor device, as shown in FIG. 86, in accordance with the twelfth embodiment of the present invention, can be made by appropriately combining the manufacturing methods described in the above-mentioned embodiments.

Figure 87:
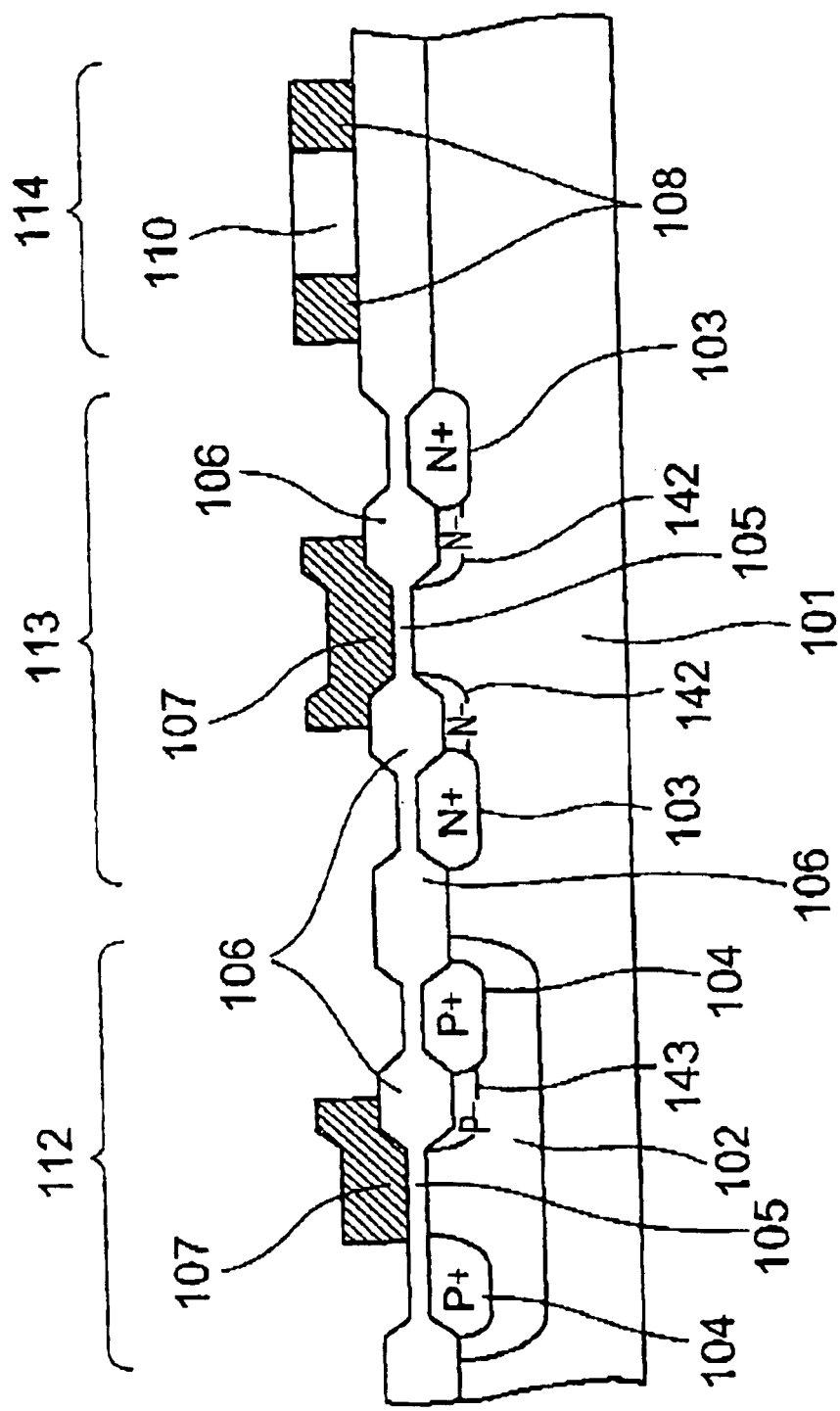
FIG. 87 is a schematic cross sectional view showing a CMOS semiconductor device in accordance with a thirteenth embodiment of the present invention.

FIG. 87 is a schematic cross sectional view of a CMOS semiconductor device in accordance with a thirteenth embodiment of the present invention. The gate electrode is a CMOS of single electrode consisting of the P+polycrystalline silicon 107, which is a basis of the present invention, and therefore has effects of low voltage operation, low power consumption, and low cost, which are shown in the embodiments described above. However, in this embodiment, a MOS transistor structure is employed, in which on both the source and drain sides, or only the drain side thereof, the diffusion layers N-142 and P-143 with a low impurity concentration are arranged, and the diffusion layers, N+103 and P+104 with a dense impurity concentration are arranged, in which both the source and the drain or only the drain is provided with a distance from the electrode and the field insulating film 106 is formed therebetween. Between the diffusion layer with a high impurity concentration and the gate electrode, a thick insulating film in a range of several thousand Å to about 1 μm formed. As a result, the electric field relaxation effect is remarkable, and has a merit in that the structure can withstand high voltage operation, for example, can correspond to the operation in several tens V to several hundred V. However, there is a drawback that the size of the device can not be reduced.

In the embodiment shown in FIG. 87, a high withstand voltage structure is provided on only one side of the PMOS 112, and NMOS 113 has the high withstand voltage structure on both sides. However, depending on the use method of the device in a circuit, an appropriate structure for the circuit may be selected notwithstanding of the conductivity type of the MOS transistor. Typically, in the case where current flowing direction is a two-way and the source and the drain are interchanged case by case, in which the withstand voltage is necessary for both directions, the high withstand voltage structure is employed for both the source and the drain. On the other hand, in the case where the current flowing direction is a single direction and the source and the drain are fixed, only one side, that is, only, the drain side takes the high withstand voltage structure for the purpose of reducing the parasitic capacitance. Further, in FIG. 87, an example is described, in which a single layer of P+polycrystalline silicon is used as the gate electrode. However, it is possible to use the P+polycide structure as the care electrode, and similarly, P–resistor, N–resistor, P+resistor, and N+resistor may be optionally, arbitrary selected to use as the resistor.

The manufacture of the CMOS semiconductor device, as shown in FIG. 87, in accordance with the thirteenth embodiment of the present invention, can be made such that the drift regions N-142 and P-143 are formed at the time of LOCOS formation, that is, at the time of the channel stopper formation. After that, by appropriately combining the manufacturing methods described in the above-mentioned embodiments, the device can be obtained.

Figure 88:
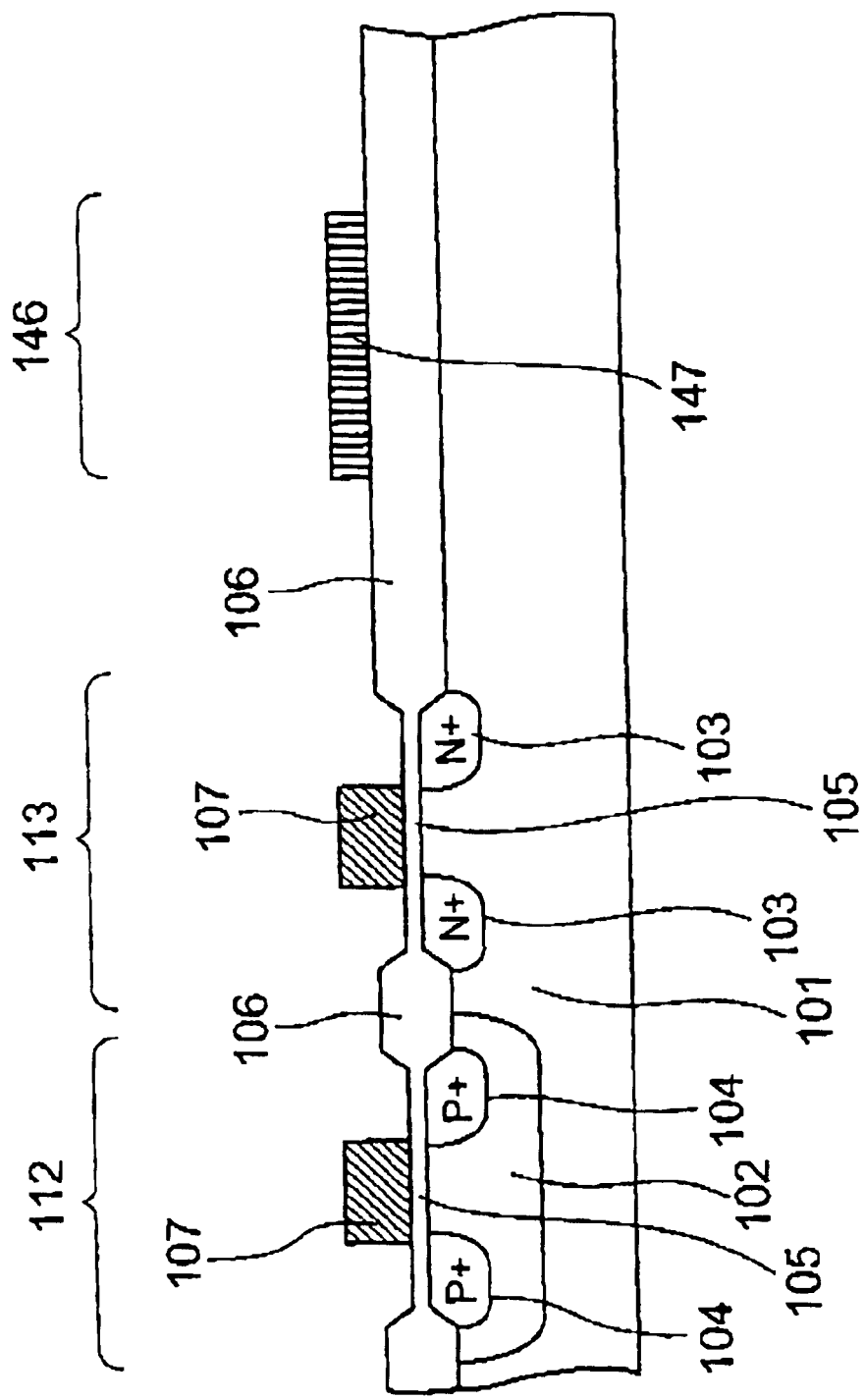
FIG. 88 is a schematic cross sectional view showing a CMOS semiconductor device in accordance with a fourteenth embodiment of the present invention.
Figure 89:
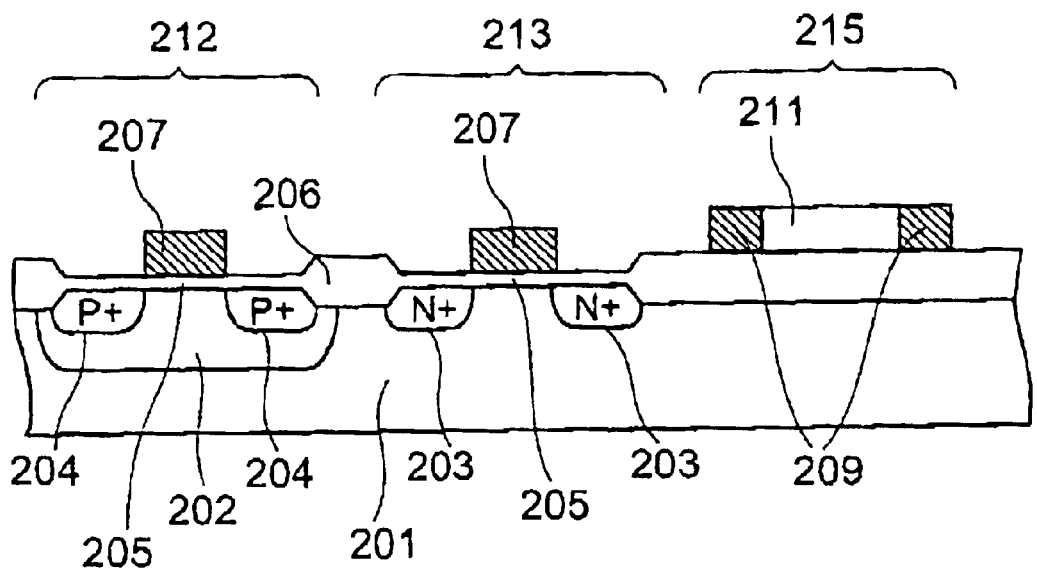
FIG. 89 is a schematic cross sectional view showing a conventional CMOS semiconductor device.
Figure 90:
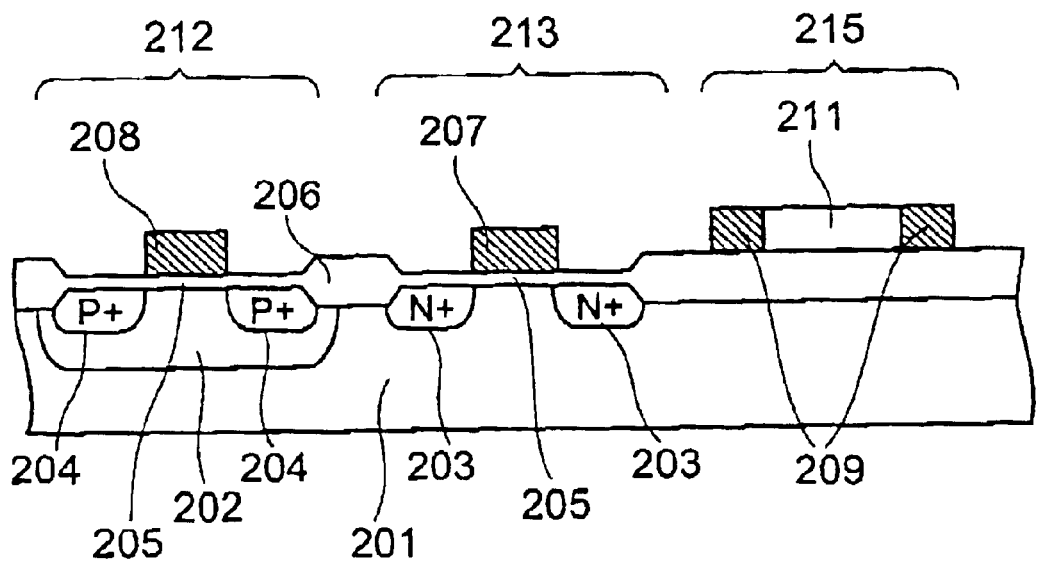
FIG. 90 is a schematic cross sectional view showing a conventional CMOS semiconductor device.
Figure 91:
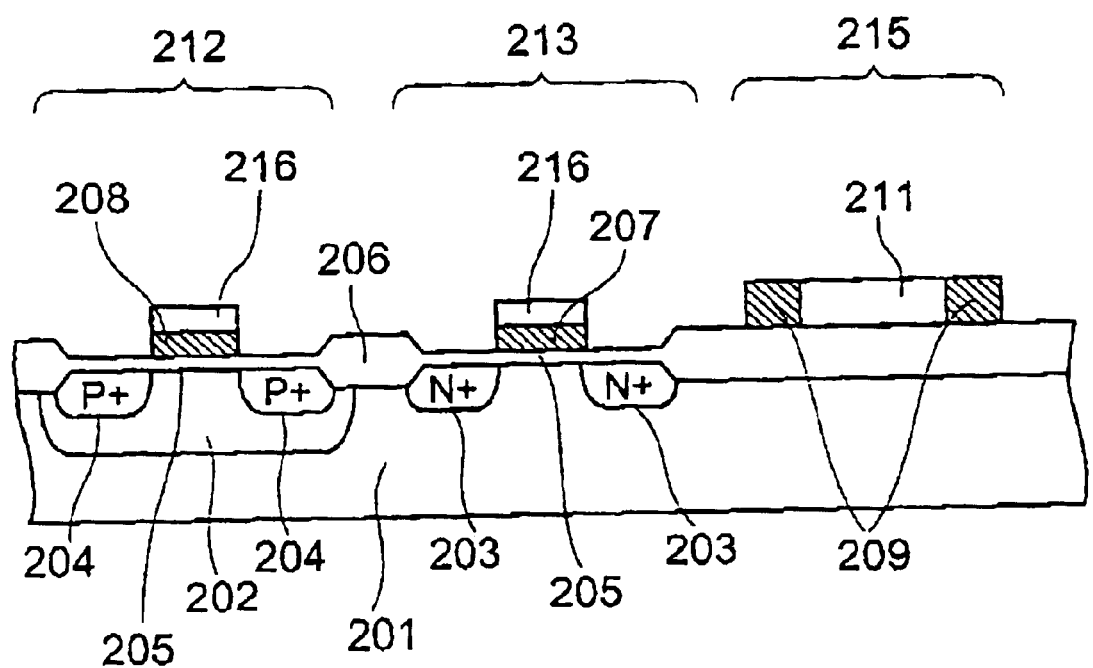
FIG. 91 is a schematic cross sectional view showing a conventional CMOS semiconductor device.

FIG. 88 is a schematic cross sectional view of a CMOS semiconductor device of the fourteenth embodiment of the present invention.

The gate electrode has the CMOS with the single polarity of the P+polycrystalline silicon 107 and a thin film resistor 146 formed of a thin film metal, which are the basis of the present invention.

An Ni—Cr alloy, a Cr—SiO alloy, molybdenum silicide or β-ferrite silicide is used as the material of a thin film metal 147, and the thickness of the thin film metal 147 is in a range of 100 Å to 300 Å.

In the case where the thin film metal is used for the resistor, the voltage dependency of the resistance value is low in comparison with the case of the resistor formed of the polycrystalline silicon. Thus, there is an advantage that the specific precision of the resistance value is improved while there is a disadvantage that the heat treatment or the step is limited in the manufacture of the CMOS semiconductor device in general, the thin film resistor is formed after the formation of the gate, source and drain.

The CMOS semiconductor device of the fourteenth embodiment in FIG. 88 has the effects of the low voltage operation, low power consumption and low cost as in the above-described embodiments.

As described above, in the power management semiconductor device or analog semiconductor device having the CMOS and the resistor, the conductivity type of the gate electrode of the CMOS is P-type as lo both the NMOS and the PMOS, the short channel and the low threshold voltage are possible since the E-type PMOS is the surface channel type, the short channel and the low threshold voltage are possible since the buried channel type NMOS is extremely shallow for the reason that arsenic having a small diffusion coefficient can be used as the impurity for threshold control, and the resistor used in the voltage dividing circuit or CR circuit is formed of the polycrystalline silicon thinner than the polycrystalline silicon of the same layer as the gate electrode or the thin film metal. Thus, according to the present invention, the power management semiconductor device or analog semiconductor device, which is advantageous in terms of cost, manufacturing period and element

What is claimed is:

1. A complementary MOS semiconductor device, comprising: a semiconductor substrate; a CMOS transistor pair comprised of an N-channel MOS transistor formed in the semiconductor substrate and a P-channel enhancement mode MOS transistor having a threshold voltage of approximately −0.5V and a surface channel formed in the semiconductor substrate, the N-channel MOS transistor and the P-channel MOS transistor forming a complementary transistor pair; and a resistor formed on the semiconductor substrate; wherein a conductivity type of a gate electrode of the N-channel MOS transistor is P-type, and a conductivity type of a gate electrode of the P-channel MOS transistor is P-type.

2. A complementary MOS semiconductor device according to claim 1; wherein the P-type gate electrode of the N-channel MOS transistor and the P-type gate electrode of the P-channel MOS transistor each comprise a single layer of polycrystalline silicon having a film thickness in a range of 2000 Å to 6000 Å and including boron or $BF_2$ with an impurity concentration of at least $1 \times 10^{19}$ atoms/cm$^3$.

3. A complementary MOS semiconductor device according to claim 1; wherein the P-type gate electrode of the N-channel MOS transistor and the P-type gate electrode of the P-channel MOS transistor each have a polycide structure comprising a lamination of a polycrystalline silicon layer having a film thickness in a range of 1000 Å to 4000 Å and including boron or $BF_2$ with an impurity concentration of $1 \times 10^{19}$ atoms/cm$^3$ or more and a high melting point metal silicide layer selected from the group consisting of molybdenum silicide, tungsten silicide, titanium silicide, and platinum silicide, with a film thickness in a range of 500 Å to 2500 Å.

4. A complementary MOS semiconductor device according to claim 1; wherein the resistor is a polycrystalline silicon resistor formed in the same layer and having the same film thickness range as polycrystalline silicon constituting the gate electrodes of the N-type transistor and the P-type transistor.

5. A complementary MOS semiconductor device according to claim 1; wherein the resistor is formed of a polycrystalline silicon layer having a film thickness in a range of 500 Å to 2000 Å.

6. A complementary MOS semiconductor device according to claim 1, wherein the resistor is a thin metal transistor formed from a material selected from the group consisting of Ni—Cr alloy, Cr—SiO alloy, molybdenum silicide, and β-ferrite suicide and has a film thickness in a range of 100 Å to 300 Å.

7. A complementary MOS semiconductor device according to claim 1; wherein the resistor comprises a polycrystalline silicon layer containing phosphorous or arsenic with an impurity concentration of $1 \times 10^{14}$ to $9 \times 10^{18}$ atoms/cm$^3$ and includes an N-type transistor of a relatively low concentration having a sheet resistance in the range of several kΩ/square to several tens of KΩ/square.

8. A complementary MOS semiconductor device according to claim 1; wherein the resistor comprises a polycrystalline silicon layer containing phosphorous or arsenic with an impurity concentration of $1 \times 10^{19}$ atoms/cm$^3$ or more and includes an N-type transistor of a relatively high concentration having a sheet resistance in the range of about 100Ω/square to several hundreds of Ω/square and a temperature coefficient in the range of several hundreds of ppm/° C. to about 1000 ppm° C.

9. A complementary MOS semiconductor device according to claim 1; wherein the resistor comprises a polycrystalline silicon layer containing boron or $BF_2$ with an impurity concentration of $1 \times 10^{14}$ to $9 \times 10^{18}$ atoms/cm$^3$ and includes a P-type transistor of a relatively low concentration having a sheet resistance in the range of several kΩ/square to several tens of kΩ/square.

10. A complementary MOS semiconductor device according to claim 1; wherein the resistor comprises a polycrystalline silicon layer containing boron or $BF_2$ with an impurity concentration of $1 \times 10^{19}$ atoms/cm$^3$ or more and includes a P-type transistor of a relatively high concentration having a sheet resistance in the range of several hundreds of Ω/square to about 1 kΩ/square and a temperature coefficient in the range of several hundreds of ppm/° C. to about 1000 ppm/° C.

11. A complementary MOS semiconductor device according to claim 1; wherein the N-channel MOS transistor and the P-channel MOS transistor have a single drain structure comprising a diffusion layer with a high impurity concentration, and a source and a drain of the N-channel MOS transistor and the P-channel MOS transistor overlap the P-type gate electrode in a planar manner.

12. A complementary MOS semiconductor device according to claim 1; wherein the N-channel MOS transistor and the P-channel MOS transistor each have a diffusion layer with a low impurity concentration and with at least one of a source side and a drain side thereof that overlaps the P-type gate electrode in a planar manner and a diffusion layer with a high impurity concentration and having at least one of a source side and a drain side thereof that does not overlap the P-type gate electrode in a planar manner.

13. A complementary MOS semiconductor device according to claim 1; wherein the N-channel MOS transistor and the P-channel MOS transistor each include a diffusion layer with a low impurity concentration and having at least one of a source side and a drain side thereof that overlaps the P-type gate electrode in a planar manner and a diffusion layer with a high impurity concentration and having at least one of a source side and a drain side thereof that does not overlap the P-type gate electrode in a planar manner, and an insulating film between the diffusion layer with a high impurity concentration and the P-type gate electrode and having a larger film thickness than that of a gate insulating film.

14. A complementary MOS semiconductor device according to claim 1; wherein the N-channel MOS transistor and the P-channel MOS transistor each have a diffusion layer with a high impurity concentration and having source and the drain sides that overlap the P-type gate electrode in a planar manner and a diffusion layer with a low impurity concentration with at least a drain side thereof that is diffused further on a channel side to overlap the P-type gate electrode in a planar manner.

15. A complementary MOS semiconductor device according to claim 1; wherein the N-channel MOS transistor has a buried channel and a threshold voltage in an enhancement mode.

16. A complementary MOS semiconductor device according to claim 1; wherein the P-channel MOS transistor has a surface channel and a threshold voltage in an enhancement mode.

17. A complementary MOS semiconductor device according to claim 1; wherein the semiconductor substrate is a P-type semiconductor substrate, and regions of the N-channel MOS transistor and the P-channel MOS transistor are defined by forming an N-type well.

18. A complementary MOS semiconductor device according to claim 1, wherein the semiconductor substrate is a P-type semiconductor substrate, and regions of the N-channel MOS transistor and the P-channel MOS transistor are defined by forming an N-type well and a P-type well, respectively.

19. A complementary MOS semiconductor device according to claim 1, wherein the semiconductor substrate is an N-type semiconductor substrate, and regions of the N-channel MOS transistor and the P-channel MOS transistor are defined by forming a P-type well, respectively.

20. A complementary MOS semiconductor device according to claim 1, wherein the semiconductor substrate is an N-type semiconductor substrate, and regions of the N-channel MOS trnansistor and the P-channel MOS transistor are defined by forming an N-type well and a P-type well, respectively.

21. A complementary MOS semiconductor device according to claim 1; wherein the polycrystalline silicon is formed by chemical vapor deposition.

22. A complementary MOS semiconductor device according to claim 1; wherein the N-channel MOS transistor is used in a reference voltage generating circuit of a voltage regulator and the P-channel MOS transistor is used as an output driving transistor of the voltage regulator.

23. A complementary MOS semiconductor device according to claim 1; wherein the P-type gate electrode of the N-channel MOS transistor and the P-type gate electrode of the P-channel MOS transistor each comprise a single layer of polycrystalline silicon.

24. A complementary MOS semiconductor device according to claim 23; wherein film thickness of the polycrystalline silicon layer is in the range of 2000 angstroms to 6000 angstroms.

25. A complementary MOS semiconductor device according to claim 23; wherein the polycrystalline silicon layer has a concentration of boron or $BF_2$ in a concentration of at least $1\times10^{19}$ atoms/cm$^3$.

26. A complementary MOS semiconductor device according to claim 1; wherein the P-type gate electrode of the N-channel MOS transistor and the P-type gate electrode of the P-channel MOS transistor each comprise a polycide structure comprising a polycrystalline silicon layer and a high melting point metal silicide layer formed thereover.

27. A complementary MOS semiconductor device according to claim 26; wherein the high melting point metal silicide layer is formed of at least one metal suicide selected from the group consisting of molybdenum silicide, tungsten silicide, titanium silicide and platinum silicide.

28. A complementary MOS semiconductor device according to claim 26; wherein the high melting point metal silicide layer has a thickness in the range of 500 angstroms to 2500 angstroms.

29. A complementary MOS semiconductor device according to claim 26; wherein the resistor is a polycrystalline silicon resistor formed from the same polycrystalline silicon layer and having the same thickness as that of the polycrystalline silicon layer of the gate electrodes of the N-channel MOS transistor and the P-channel MOS transistor.

30. A complementary MOS semiconductor device according to claim 26; wherein the resistor is a polycrystalline silicon resistor formed of a polycrystalline silicon film having a thickness in the range of 500 angstroms to 2000 angstroms.

31. A complementary MOS semiconductor device according to claim 26; wherein the resistor is a thin film transistor.

32. A complementary MOS semiconductor device according to claim 1; wherein the N-channel MOS transistor is an enhancement mode transistor having a buried channel.

33. A complementary MOS semiconductor device according to claim 32; wherein a threshold voltage of the N-channel MOS transistor is set using arsenic as a donor impurity so that the buried channel is a shallow buried channel.

34. A complementary MOS semiconductor device for a voltage regulator having a reference voltage generating circuit, an error amplifier, an output driving transistor and a voltage divider, the complementary MOS semiconductor device comprising: a semiconductor substrate; a complementary transistor pair comprised of an N-channel MOS transistor formed in the semiconductor substrate and a P-channel MOS transistor having a threshold voltage of approximately −0.5V formed in the semiconductor substrate, one of the complementary transistors serving as the output driving transistor of the voltage regulator; and a resistor formed in the semiconductor substrate and used in the voltage divider; wherein a conductivity type of a gate electrode of the N-channel MOS transistor is P-type, and a conductivity type of a gate electrode of the P-channel MOS transistor is P-type.

35. A complementary MOS semiconductor device according to claim 34; wherein the P-channel MOS transistor is an enhancement mode transistor having a surface channel.

36. A complementary MOS semiconductor device according to claim 34; wherein the N-channel MOS transistor is an enhancement mode transistor having a buried channel.

37. A complementary MOS semiconductor device according to claim 36; wherein a threshold voltage of the N-channel MOS transistor is set using arsenic as a donor impurity so that the buried channel is a shallow buried channel.

\* \* \* \* \*